(12) United States Patent
Song

(10) Patent No.: US 11,847,451 B2
(45) Date of Patent: Dec. 19, 2023

(54) PROCESSING-IN-MEMORY (PIM) DEVICE FOR IMPLEMENTING A QUANTIZATION SCHEME

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 556 days.

(21) Appl. No.: 17/143,984

(22) Filed: Jan. 7, 2021

(65) Prior Publication Data

US 2021/0208885 A1 Jul. 8, 2021

Related U.S. Application Data

(63) Continuation-in-part of application No. 17/027,276, filed on Sep. 21, 2020, now Pat. No. 11,513,733.

(60) Provisional application No. 62/959,668, filed on Jan. 10, 2020, provisional application No. 62/958,226, filed on Jan. 7, 2020.

(30) Foreign Application Priority Data

Jan. 17, 2020 (KR) .................. 10-2020-0006903

(51) Int. Cl.
*G06F 9/30* (2018.01)
*G06F 3/06* (2006.01)
*G11C 7/06* (2006.01)
*G11C 7/10* (2006.01)

(52) U.S. Cl.
CPC ........ *G06F 9/30014* (2013.01); *G06F 3/0629* (2013.01); *G11C 7/065* (2013.01); *G11C 7/1006* (2013.01); *G06F 2212/254* (2013.01)

(58) Field of Classification Search
CPC .............. G06F 9/30014; G06F 3/0629; G06F 2212/254; G06F 15/7821; G11C 7/065; G11C 7/1006; G11C 7/1048; G11C 8/12; G11C 11/54; G06N 3/063
See application file for complete search history.

(56) References Cited

U.S. PATENT DOCUMENTS

| 4,631,696 | A | * | 12/1986 | Sakamoto | ............... | H03M 7/24 |
| | | | | | | 708/204 |
| 10,042,639 | B2 | | 8/2018 | Gopal et al. | | |
| 10,410,098 | B2 | | 9/2019 | Nealis et al. | | |
| 2002/0196863 | A1 | * | 12/2002 | Kaku | .................. | H04L 27/2624 |
| | | | | | | 375/296 |
| 2019/0294413 | A1 | * | 9/2019 | Vantrease | ............. | G06F 7/5095 |

(Continued)

FOREIGN PATENT DOCUMENTS

KR 1020190014900 A 2/2019

*Primary Examiner* — Farley Abad
(74) *Attorney, Agent, or Firm* — WILLIAM PARK & ASSOCIATES LTD.

(57) ABSTRACT

A processing-in-memory (PIM) device includes a data selection circuit, a multiplying-and-accumulating (MAC) circuit, and an accumulative adding circuit. The data selection circuit generates selection data from input data and zero-point data based on a zero-point selection signal. The MAC circuit performs a MAC arithmetic operation for the selection data to generate MAC result data. The accumulative adding circuit accumulatively adds MAC sign data based on a MAC output latch signal to generate MAC latch data. A sign of the MAC sign data is determined by the zero-point selection signal.

28 Claims, 49 Drawing Sheets

(56) References Cited

U.S. PATENT DOCUMENTS

| | | |
|---|---|---|
| 2020/0089472 A1 | 3/2020 | Pareek et al. |
| 2020/0174749 A1 | 6/2020 | Kang et al. |
| 2021/0072986 A1 | 3/2021 | Yudanov et al. |

* cited by examiner

FIG.32
701
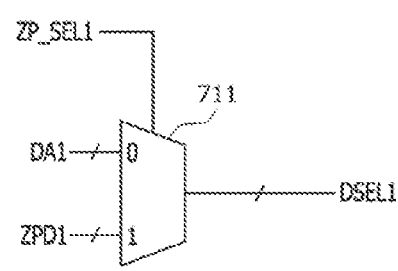
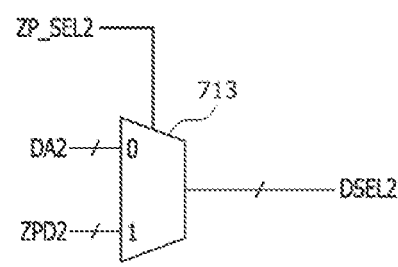

FIG.36

$$RD\_MAC = WD \otimes VD$$
$$= S1\,(DA1 - ZPD1) \otimes S2\,(DA2 - ZPD2)$$
$$= \underbrace{S1 \cdot S2}_{SDA}\,(\underbrace{DA1 \otimes DA2}_{\text{1st MAC ARITHMETIC OPERATION}} - \underbrace{ZPD1 \otimes DA2}_{\text{2nd MAC ARITHMETIC OPERATION}} - \underbrace{ZPD2 \otimes DA1}_{\text{3rd MAC ARITHMETIC OPERATION}} + \underbrace{ZPD1 \otimes ZPD2}_{\text{4th MAC ARITHMETIC OPERATION}})$$

PROCESSING-IN-MEMORY (PIM) DEVICE FOR IMPLEMENTING A QUANTIZATION SCHEME

CROSS-REFERENCE TO RELATED APPLICATIONS

The present application claims priority under 35 U.S.C. 119(a) to provisional application No. 62/959,668, filed on Jan. 10, 2020, and this application is a continuation-in-part of U.S. patent application Ser. No. 17/027,276, filed on Sep. 21, 2020, which claims priority to provisional application No. 62/958,226, filed on Jan. 7, 2020, and Korean Application No. 10-2020-0006903, filed on Jan. 17, 2020, which are incorporated herein by reference in their entirety.

BACKGROUND

1. Technical Field

Various embodiments of the present disclosure relate to processing-in-memory (PIM) systems and, more particularly, to PIM systems including a PIM device and a controller and methods of operating the PIM systems.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

According to an embodiment, a processing-in-memory (PIM) device may include a data selection circuit, a multiplying-and-accumulating (MAC) circuit, and an accumulative adding circuit. The data selection circuit may be configured to generate selection data from input data and zero-point data based on a zero-point selection signal. The MAC circuit may be configured to perform a MAC arithmetic operation for the selection data to generate MAC result data. The accumulative adding circuit may accumulatively add MAC sign data based on a MAC output latch signal to generate MAC latch data. The MAC sign data may be generated from the MAC result data and a sign of the MAC sign data is determined by the zero-point selection signal.

According to another embodiment, there is provided a method of implementing a quantization scheme. The method may include generating selection data from input data and zero-point data based on a zero-point selection signal, performing a multiplying-and-accumulating (MAC) arithmetic operation for the selection data to generate MAC result data, and generating MAC latch data by accumulatively adding MAC sign data based on a MAC output latch signal. The MAC sign data may be generated from the MAC result data and a sign of the MAC sign data is determined by the zero-point selection signal.

According to yet another embodiment, there is provided a method of implementing a quantization scheme. The method may include receiving first input data and second input data as first selection data and second selection data based on a first zero-point selection signal and a second zero-point selection signal, performing a first multiplying-and-accumulating (MAC) arithmetic operation for the first input data received as the first selection data and the second input data received as the second selection data to generate MAC result data, performing a first sign selection operation for generating MAC sign data from the MAC result data based on the first zero-point selection signal and the second zero-point selection signal, and performing a first accumulative adding operation for adding the MAC sign data to MAC latch data based on a MAC output latch signal.

BRIEF DESCRIPTION OF THE DRAWINGS

Certain features of the disclosed technology are illustrated in various embodiments with reference to the attached drawings.

FIG. 32 illustrates a configuration of a data selection circuit included in the PIM device illustrated in FIG. 31.

FIGS. 35 and 36 illustrate a quantization scheme applied to a PIM device according to an embodiment of the present disclosure.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to PIM systems and methods of operating the PIM systems.

Figure 1:
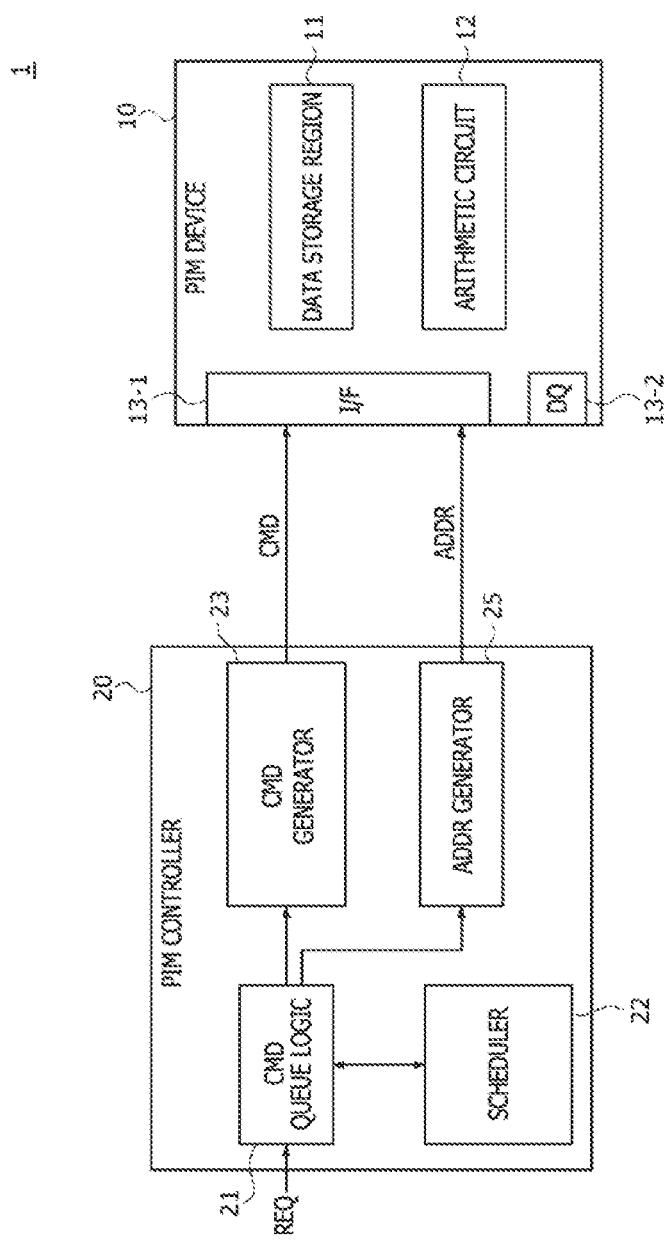
FIG. 1 is a block diagram illustrating a PIM system according to an embodiment of the present disclosure.

FIG. 1 is a block diagram illustrating a PIM system according to an embodiment of the present disclosure. As illustrated in FIG. 1, the PIM system 1 may include a PIM device 10 and a PIM controller 20. The PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device through the data I/O pad 13-2.

The interface 13-1 of the PIM device 10 may receive a command CMD and address ADDR from the PIM controller 20. The interface 13-1 may output the command CMD to the data storage region 11 or the arithmetic circuit 12 in the PIM device 10. The interface 13-1 may output the address ADDR to the data storage region 11 in the PIM device 10. The data I/O pad 13-2 of the PIM device 10 may function as a data communication terminal between a device external to the PIM device 10, for example the PIM controller 20, and the data storage region 11 included in the PIM device 10. The external device to the PIM device 10 may correspond to the PIM controller 20 of the PIM system 1 or a host located outside the PIM system 1. Accordingly, data output from the host or the PIM controller 20 may be input into the PIM device 10 through the data I/O pad 13-2.

The PIM controller 20 may control operations of the PIM device 10. In an embodiment, the PIM controller 20 may control the PIM device 10 such that the PIM device 10 operates in a memory mode or an arithmetic mode. In the event that the PIM controller controls the PIM device 10 such that the PIM device 10 operates in the memory mode, the PIM device 10 may perform a data read operation or a data write operation for the data storage region 11. In the event that the PIM controller 20 controls the PIM device 10 such that the PIM device 10 operates in the arithmetic mode, the arithmetic circuit 12 of the PIM device 10 may receive first data and second data from the data storage region 11 to perform an arithmetic operation. In the event that the PIM controller 20 controls the PIM device 10 such that the PIM device 10 operates in the arithmetic mode, the PIM device 10 may also perform the data read operation and the data write operation for the data storage region 11 to execute the arithmetic operation. The arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The PIM controller 20 may be configured to include command queue logic 21, a scheduler 22, a command (CMD) generator 23, and an address (ADDR) generator 25. The command queue logic 21 may receive a request REQ from an external device (e.g., a host of the PIM system 1) and store the command queue corresponding to the request REQ in the command queue logic 21. The command queue logic 21 may transmit information on a storage status of the command queue to the scheduler 22 whenever the command queue logic 21 stores the command queue. The command queue stored in the command queue logic 21 may be transmitted to the command generator 23 according to a sequence determined by the scheduler 22. The command queue logic 21, and also the command queue logic 210 of FIGS. 2 and 20, may be implemented as hardware, software, or a combination of hardware and software. For example, the command queue logic 21 and/or 210 may be a command queue logic circuit operating in accordance with an algorithm and/or a processor executing command queue logic code.

The scheduler 22 may adjust a sequence of the command queue when the command queue stored in the command queue logic 21 is output from the command queue logic 21. In order to adjust the output sequence of the command queue stored in the command queue logic 21, the scheduler 22 may analyze the information on the storage status of the command queue provided by the command queue logic 21 and may readjust a process sequence of the command queue so that the command queue is processed according to a proper sequence.

The command generator 23 may receive the command queue related to the memory mode of the PIM device 10 and the MAC mode of the PIM device 10 from the command queue logic 21. The command generator 23 may decode the command queue to generate and output the command CMD. The command CMD may include a memory command for the memory mode or an arithmetic command for the arithmetic mode. The command CMD output from the command generator 23 may be transmitted to the PIM device 10.

The command generator 23 may be configured to generate and transmit the memory command to the PIM device 10 in the memory mode. The command generator 23 may be configured to generate and transmit a plurality of arithmetic commands to the PIM device 10 in the arithmetic mode. In one example, the command generator 23 may be configured to generate and output first to fifth arithmetic commands with predetermined time intervals in the arithmetic mode. The first arithmetic command may be a control signal for reading the first data out of the data storage region 11. The second arithmetic command may be a control signal for reading the second data out of the data storage region 11. The third arithmetic command may be a control signal for latching the first data in the arithmetic circuit 12. The fourth arithmetic command may be a control signal for latching the second data in the arithmetic circuit 12. And the fifth MAC command may be a control signal for latching arithmetic result data of the arithmetic circuit 12.

The address generator 25 may receive address information from the command queue logic 21 and generate the address ADDR for accessing a region in the data storage region 11. In an embodiment, the address ADDR may include a bank address, a row address, and a column address. The address ADDR output from the address generator 25 may be input to the data storage region 11 through the interface (I/F) 13-1.

Figure 2:
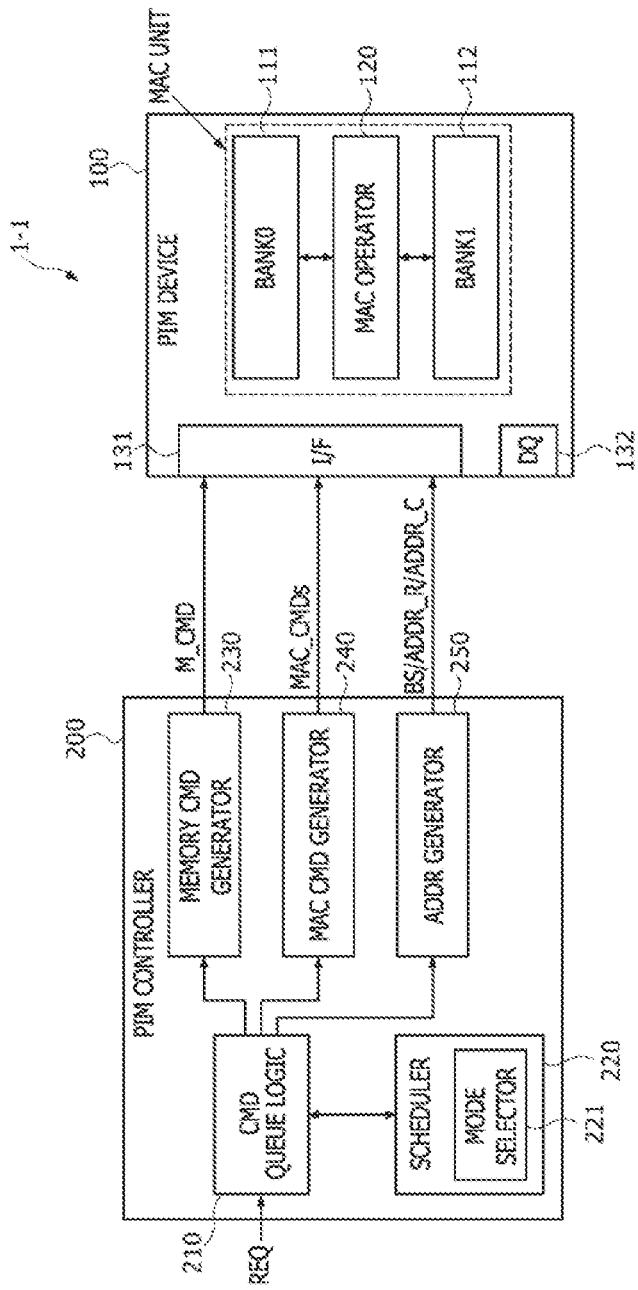
FIG. 2 is a block diagram illustrating a PIM system according to a first embodiment of the present disclosure.

FIG. 2 is a block diagram illustrating a PIM system 1-1 according to a first embodiment of the present disclosure. As illustrated in FIG. 2, the PIM system 1-1 may include a PIM device 100 and a PIM controller 200. The PIM device 100 may include a first memory bank (BANK0) 111, a second memory bank (BANK1) 112, a MAC operator 120, an interface (I/F) 131, and a data input/output (I/O) pad 132. For an embodiment, the MAC operator 120 represents a MAC operator circuit. The first memory bank (BANK0) 111, the second memory bank (BANK1) 112, and the MAC operator 120 included in the PIM device 100 may constitute one MAC unit. In another embodiment, the PIM device 100 may include a plurality of MAC units. The first memory bank (BANK0) 111 and the second memory bank (BANK1) 112 may represent a memory region for storing data, for example, a DRAM device. Each of the first memory bank (BANK0) 111 and the second memory bank (BANK1) 112 may be a component unit which is independently activated and may be configured to have the same data bus width as data I/O lines in the PIM device 100. In an embodiment, the first and second memory banks 111 and 112 may operate through interleaving such that an active operation of the first and second memory banks 111 and 112 is performed in parallel while another memory bank is selected. Each of the first and second memory banks 111 and 112 may include at least one cell array which includes memory unit cells located at cross points of a plurality of rows and a plurality of columns.

Although not shown in the drawings, a core circuit may be disposed adjacent to the first and second memory banks 111 and 112. The core circuit may include X-decoders XDECs and Y-decoders/IO circuits YDEC/IOs. An X-decoder XDEC may also be referred to as a word line decoder or a row decoder. The X-decoder XDEC may receive a row address ADD_R from the PIM controller 200 and may decode the row address ADD_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADDR_C from the PIM controller 200 and may decode the column address ADDR_C to select and enable at least one of the columns (i.e., bit lines) coupled to the selected memory bank. Each of the I/O circuits may include an I/O sense amplifier for sensing and amplifying a level of a read datum output from the corresponding memory bank during a read operation for the first and second memory banks 111 and 112. In addition, the I/O circuit may include a write driver for driving a write datum during a write operation for the first and second memory banks 111 and 112.

The interface 131 of the PIM device 100 may receive a memory command M_CMD, MAC commands MAC_CMDs, a bank selection signal BS, and the row/column addresses ADDR_R/ADDR_C from the PIM controller 200. The interface 131 may output the memory command M_CMD, together with the bank selection signal BS and the row/column addresses ADDR_R/ADDR_C, to the first memory bank 111 or the second memory bank 112. The interface 131 may output the MAC commands MAC_CMDs to the first memory bank 111, the second memory bank 112, and the MAC operator 120. In such a case, the interface 131 may output the bank selection signal BS and the row/column addresses ADDR_R/ADDR_C to both of the first memory bank 111 and the second memory bank 112. The data I/O pad 132 of the PIM device 100 may function as a data communication terminal between a device external to the PIM device 100 and the MAC unit (which includes the first and second memory banks 111 and 112 and the MAC operator 120) included in the PIM device 100. The external device to the PIM device 100 may correspond to the PIM controller 200 of the PIM system 1-1 or a host located outside the PIM system 1-1. Accordingly, data output from the host or the PIM controller 200 may be input into the PIM device 100 through the data I/O pad 132.

The PIM controller 200 may control operations of the PIM device 100. In an embodiment, the PIM controller 200 may control the PIM device 100 such that the PIM device 100 operates in a memory mode or a MAC mode. In the event that the PIM controller 200 controls the PIM device 100 such that the PIM device 100 operates in the memory mode, the PIM device 100 may perform a data read operation or a data write operation for the first memory bank 111 and the second memory bank 112. In the event that the PIM controller 200 controls the PIM device 100 such that the PIM device 100 operates in the MAC mode, the PIM device 100 may perform a MAC arithmetic operation for the MAC operator 120. In the event that the PIM controller 200 controls the PIM device 100 such that the PIM device 100 operates in the MAC mode, the PIM device 100 may also perform the data read operation and the data write operation for the first and second memory banks 111 and 112 to execute the MAC arithmetic operation.

The PIM controller 200 may be configured to include command queue logic 210, a scheduler 220, a memory command generator 230, a MAC command generator 240, and an address generator 250. The command queue logic 210 may receive a request REQ from an external device (e.g., a host of the PIM system 1-1) and store a command queue corresponding to the request REQ in the command queue logic 210. The command queue logic 210 may transmit information on a storage status of the command queue to the scheduler 220 whenever the command queue logic 210 stores the command queue. The command queue stored in the command queue logic 210 may be transmitted to the memory command generator 230 or the MAC command generator 240 according to a sequence determined by the scheduler 220. When the command queue output from the command queue logic 210 includes command information requesting an operation in the memory mode of the PIM device 100, the command queue logic 210 may transmit the command queue to the memory command generator 230. On the other hand, when the command queue output from the command queue logic 210 is command information requesting an operation in the MAC mode of the PIM device 100, the command queue logic 210 may transmit the command queue to the MAC command generator 240. Information on whether the command queue relates to the memory mode or the MAC mode may be provided by the scheduler 220.

The scheduler 220 may adjust a timing of the command queue when the command queue stored in the command queue logic 210 is output from the command queue logic 210. In order to adjust the output timing of the command queue stored in the command queue logic 210, the scheduler 220 may analyze the information on the storage status of the command queue provided by the command queue logic 210 and may readjust a process sequence of the command queue such that the command queue is processed according to a proper sequence. The scheduler 220 may output and transmit to the command queue logic 210 information on whether the command queue output from the command queue logic 210 relates to the memory mode of the PIM device 100 or relates to the MAC mode of the PIM device 100. In order to obtain the information on whether the command queue output from the command queue logic 210 relates to the memory mode or the MAC mode, the scheduler 220 may include a mode selector 221. The mode selector 221 may generate a mode selection signal including information on whether the command queue stored in the command queue logic 210 relates to the memory mode or the MAC mode, and the scheduler 220 may transmit the mode selection signal to the command queue logic 210.

The memory command generator 230 may receive the command queue related to the memory mode of the PIM device 100 from the command queue logic 210. The memory command generator 230 may decode the command queue to generate and output the memory command M_CMD. The memory command M_CMD output from the memory command generator 230 may be transmitted to the PIM device 100. In an embodiment, the memory command M_CMD may include a memory read command and a memory write command. When the memory read command is output from the memory command generator 230, the PIM device 100 may perform the data read operation for the first memory bank 111 or the second memory bank 112. Data which are read out of the PIM device 100 may be transmitted to an external device through the data I/O pad 132. The read data output from the PIM device 100 may be transmitted to a host through the PIM controller 200. When the memory write command is output from the memory command generator 230, the PIM device 100 may perform the data write operation for the first memory bank 111 or the second memory bank 112. In such a case, data to be written into the PIM device 100 may be transmitted from the host to the PIM device 100 through the PIM controller 200. The write data input to the PIM device 100 may be transmitted to the first memory bank 111 or the second memory bank 112 through the data I/O pad 132.

The MAC command generator 240 may receive the command queue related to the MAC mode of the PIM device 100 from the command queue logic 210. The MAC command generator 240 may decode the command queue to generate and output the MAC commands MAC_CMDs. The MAC commands MAC_CMDs output from the MAC command generator 240 may be transmitted to the PIM device 100. The data read operation for the first memory bank 111 and the second memory bank 112 of the PIM device 100 may be performed by the MAC commands MAC_CMDs output from the MAC command generator 240, and the MAC arithmetic operation of the MAC operator 120 may also be performed by the MAC commands MAC_CMDs output from the MAC command generator 240. The MAC commands MAC_CMDs and the MAC arithmetic operation of the PIM device 100 according to the MAC commands MAC_CMDs will be described in detail with reference to FIG. 3.

The address generator 250 may receive address information from the command queue logic 210. The address generator 250 may generate the bank selection signal BS for selecting one of the first and second memory banks 111 and 112 and may transmit the bank selection signal BS to the PIM device 100. In addition, the address generator 250 may generate the row address ADDR_R and the column address ADDR_C for accessing a region (e.g., memory cells) in the first or second memory bank 111 or 112 and may transmit the row address ADDR_R and the column address ADDR_C to the PIM device 100.

Figure 3:
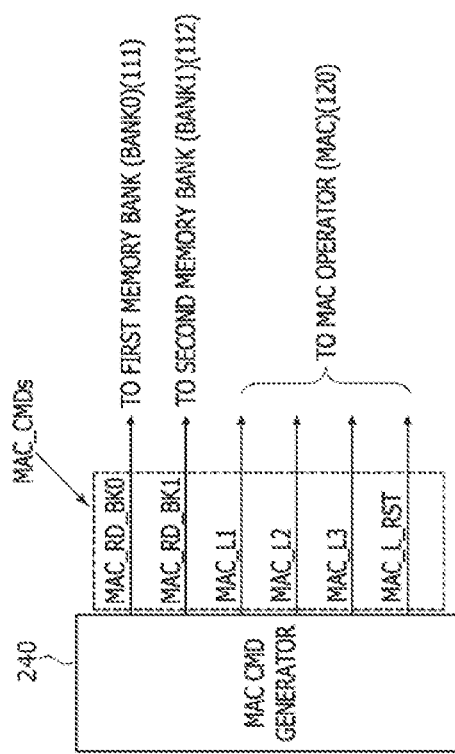
FIG. 3 illustrates MAC commands output from a MAC command generator of a PIM controller included in a PIM system according to a first embodiment of the present disclosure.

FIG. 3 illustrates the MAC commands MAC_CMDs output from the MAC command generator 240 included in the PIM system 1-1 according to the first embodiment of the present disclosure. As illustrated in FIG. 3, the MAC commands MAC_CMDs may include first to sixth MAC command signals. In an embodiment, the first MAC command signal may be a first MAC read signal MAC_RD_BK0, the second MAC command signal may be a second MAC read signal MAC_RD_BK1, the third MAC command signal may be a first MAC input latch signal MAC_L1, the fourth MAC command signal may be a second MAC input latch signal MAC_L2, the fifth MAC command signal may be a MAC output latch signal MAC_L3, and the sixth MAC command signal may be a MAC latch reset signal MAC_L_RST.

The first MAC read signal MAC_RD_BK0 may control an operation for reading first data (e.g., weight data) out of the first memory bank 111 to transmit the first data to the MAC operator 120. The second MAC read signal MAC_RD_BK1 may control an operation for reading second data (e.g., vector data) out of the second memory bank 112 to transmit the second data to the MAC operator 120. The first MAC input latch signal MAC_1 may control an input latch operation of the weight data transmitted from the first memory bank 111 to the MAC operator 120. The second MAC input latch signal MAC_L2 may control an input latch operation of the vector data transmitted from the second memory bank 112 to the MAC operator 120. If the input latch operations of the weight data and the vector data are performed, the MAC operator 120 may perform the MAC arithmetic operation to generate MAC result data corresponding to the result of the MAC arithmetic operation. The MAC output latch signal MAC_L3 may control an output latch operation of the MAC result data generated by the MAC operator 120. And, the MAC latch reset signal MAC_L_RST may control an output operation of the MAC result data generated by the MAC operator 120 and a reset operation of an output latch included in the MAC operator 120.

The PIM system 1-1 according to the present embodiment may be configured to perform a deterministic MAC arithmetic operation. The term "deterministic MAC arithmetic operation" used in the present disclosure may be defined as the MAC arithmetic operation performed in the PIM system 1-1 during a predetermined fixed time. Thus, the MAC commands MAC_CMDs transmitted from the PIM controller 200 to the PIM device 100 may be sequentially generated with fixed time intervals. Accordingly, the PIM controller 200 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially output from the PIM controller 200 with fixed time intervals corresponding to the fixed latencies.

For example, the MAC command generator 240 is configured to output the first MAC command at a first point in time. The MAC command generator 240 is configured to output the second MAC command at a second point in time when a first latency elapses from the first point in time. The first latency is set as the time it takes to read the first data out of the first storage region based on the first MAC command and to output the first data to the MAC operator. The MAC command generator 240 is configured to output the third MAC command at a third point in time when a second latency elapses from the second point in time. The second latency is set as the time it takes to read the second data out of the second storage region based on the second MAC command and to output the second data to the MAC operator. The MAC command generator 240 is configured to output the fourth MAC command at a fourth point in time when a third latency elapses from the third point in time. The third latency is set as the time it takes to latch the first data in the MAC operator based on the third MAC command. The MAC command generator 240 is configured to output the fifth MAC command at a fifth point in time when a fourth latency elapses from the fourth point in time. The fourth latency is set as the time it takes to latch the second data in the MAC operator based on the fourth MAC command and to perform the MAC arithmetic operation of the first and second data which are latched in the MAC operator. The MAC command generator 240 is configured to output the sixth MAC command at a sixth point in time when a fifth latency elapses from the fifth point in time. The fifth latency is set as the time it takes to perform an output latch operation of MAC result data generated by the MAC arithmetic operation.

Figure 4:
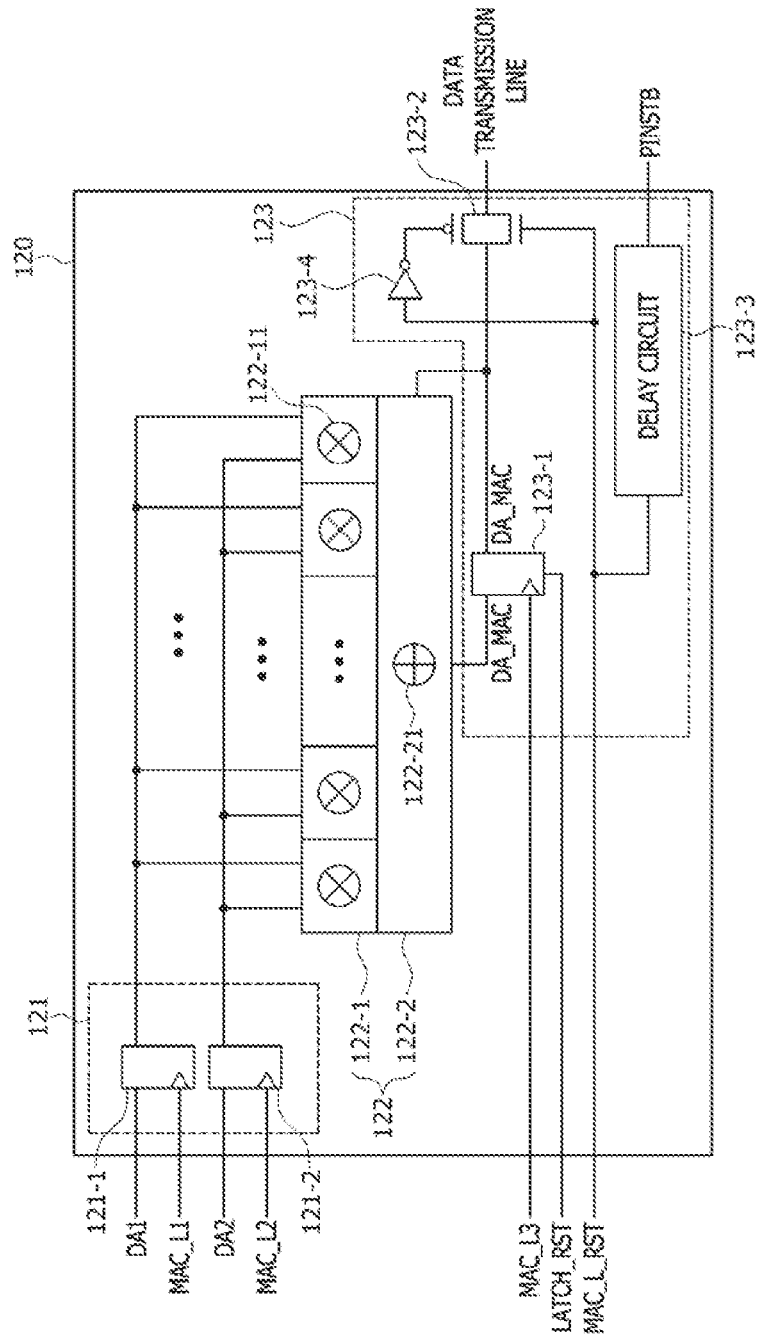
FIG. 4 is a block diagram illustrating an example of a configuration of a MAC operator of a PIM device included in a PIM system according to a first embodiment of the present disclosure.

FIG. 4 illustrates an example of the MAC operator 120 of the PIM device 100 included in the PIM system 1-1 according to the first embodiment of the present disclosure. Referring to FIG. 4, MAC operator 120 may be configured to include a data input circuit 121, a MAC circuit 122, and a data output circuit 123. The data input circuit 121 may include a first input latch 121-1 and a second input latch 121-2. The MAC circuit 122 may include a multiplication logic circuit 122-1 and an addition logic circuit 122-2. The data output circuit 123 may include an output latch 123-1, a transfer gate 123-2, a delay circuit 123-3, and an inverter 123-4. In an embodiment, the first input latch 121-1, the second input latch 121-2, and the output latch 123-1 may be realized using flip-flops.

The data input circuit 121 of the MAC operator 120 may be synchronized with the first MAC input latch signal MAC_L1 to latch first data DA1 transferred from the first memory bank 111 to the MAC circuit 122 through an internal data transmission line. In addition, the data input circuit 121 of the MAC operator 120 may be synchronized with the second MAC input latch signal MAC_L2 to latch second data DA2 transferred from the second memory bank 112 to the MAC circuit 122 through another internal data transmission line. Because the first MAC input latch signal MAC_L1 and the second MAC input latch signal MAC_L2 are sequentially transmitted from the MAC command generator 240 of the PIM controller 200 to the MAC operator 120 of the PIM device 100 with a predetermined time interval, the second data DA2 may be input to the MAC circuit 122 of the MAC operator 120 after the first data DA1 is input to the MAC circuit 122 of the MAC operator 120.

The MAC circuit 122 may perform the MAC arithmetic operation of the first data DA1 and the second data DA2 input through the data input circuit 121. The multiplication logic circuit 122-1 of the MAC circuit 122 may include a plurality of multipliers 122-11. Each of the multipliers 122-11 may perform a multiplying calculation of the first data DA1 output from the first input latch 121-1 and the second data DA2 output from the second input latch 121-2 and may output the result of the multiplying calculation. Bit values constituting the first data DA1 may be separately input to the multipliers 122-11. Similarly, bit values constituting the second data DA2 may also be separately input to the multipliers 122-11. For example, if the first data DA1 is represented by an 'N'-bit binary stream, the second data DA2 is represented by an 'N'-bit binary stream, and the number of the multipliers 122-11 is 'M', then 'N/M'-bit portions of the first data DA1 and 'N/M'-bit portions of the second data DA2 may be input to each of the multipliers 122-11.

The addition logic circuit 122-2 of the MAC circuit 122 may include a plurality of adders 122-21. Although not shown in the drawings, the plurality of adders 122-21 may be disposed to provide a tree structure including a plurality of stages. Each of the adders 122-21 disposed at a first stage may receive two sets of multiplication result data from two of the multipliers 122-11 included in the multiplication logic circuit 122-1 and may perform an adding calculation of the two sets of multiplication result data to output the addition result data. Each of the adders 122-21 disposed at a second stage may receive two sets of addition result data from two of the adders 122-21 disposed at the first stage and may perform an adding calculation of the two sets of addition result data to output the addition result data. The adder 122-21 disposed at a last stage may receive two sets of addition result data from two adders 122-21 disposed at the previous stage and may perform an adding calculation of the two sets of addition result data to output the addition result data. Although not shown in the drawings, the addition logic circuit 122-2 may further include an additional adder for performing an accumulative adding calculation of MAC result data DA_MAC output from the adder 122-21 disposed at the last stage and previous MAC result data DA_MAC stored in the output latch 123-1 of the data output circuit 123.

The data output circuit 123 may output the MAC result data DA_MAC output from the MAC circuit 122 to a data transmission line. Specifically, the output latch 123-1 of the data output circuit 123 may be synchronized with the MAC output latch signal MAC_L3 to latch the MAC result data DA_MAC output from the MAC circuit 122 and to output the latched data of the MAC result data DA_MAC. The MAC result data DA_MAC output from the output latch 123-1 may be fed back to the MAC circuit 122 for the accumulative adding calculation. In addition, the MAC result data DA_MAC may be input to the transfer gate 123-2. The output latch 123-1 may be initialized if a latch reset signal LATCH_RST is input to the output latch 123-1. In such a case, all of data latched by the output latch 123-1 may be removed. In an embodiment, the latch reset signal LATCH_RST may be activated by generation of the MAC latch reset signal MAC_L_RST and may be input to the output latch 123-1.

The MAC latch reset signal MAC_L_RST output from the MAC command generator 240 may be input to the transfer gate 123-2, the delay circuit 123-3, and the inverter 123-4. The inverter 123-4 may inversely buffer the MAC latch reset signal MAC_L_RST to output the inversely buffered signal of the MAC latch reset signal MAC_L_RST to the transfer gate 123-2. The transfer gate 123-2 may transfer the MAC result data DA_MAC from the output latch 123-1 to the data transmission line in response to the MAC latch reset signal MAC_L_RST. The delay circuit 123-3 may delay the MAC latch reset signal MAC_L_RST by a certain time to generate and output a latch control signal PINSTB.

Figure 5:
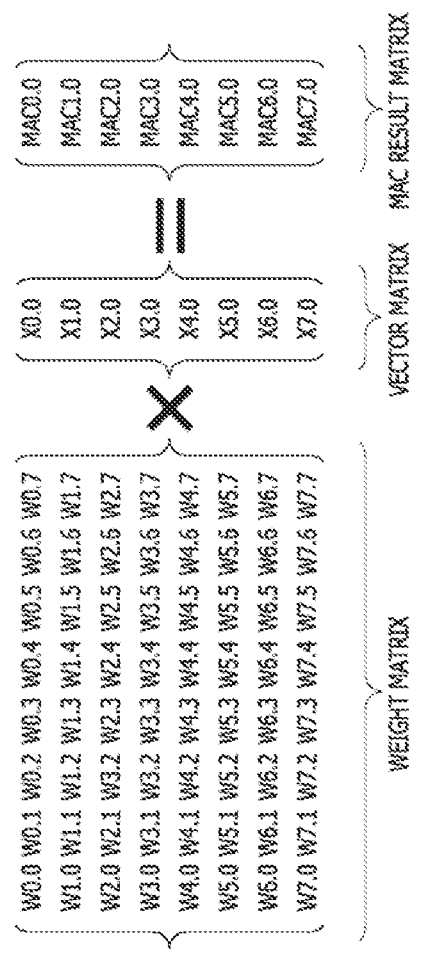
FIG. 5 illustrates an example of a MAC arithmetic operation performed in a PIM system according to a first embodiment of the present disclosure.

FIG. 5 illustrates an example of the MAC arithmetic operation performed in the PIM system 1-1 according to the first embodiment of the present disclosure. As illustrated in FIG. 5, the MAC arithmetic operation performed by the PIM system 1-1 may be executed though a matrix calculation. Specifically, the PIM device 100 may execute a matrix multiplying calculation of an 'M×N' weight matrix (e.g., '8×8' weight matrix) and a 'N×1' vector matrix (e.g., '8×1' vector matrix) according to control of the PIM controller 200 (where, 'M' and 'N' are natural numbers). Elements W0.0, ..., and W7.7 constituting the weight matrix may correspond to the first data DA1 input to the MAC operator 120 from the first memory bank 111. Elements X0.0, ..., and X7.0 constituting the vector matrix may correspond to the second data DA2 input to the MAC operator 120 from the second memory bank 112. Each of the elements W0.0, ..., and W7.7 constituting the weight matrix may be represented by a binary stream having a plurality of bit values. In addition, each of the elements X0.0, ..., and X7.0 constituting the vector matrix may also be represented by a binary stream having a plurality of bit values. The number of bits included in each of the elements W0.0, ..., and W7.7 constituting the weight matrix may be equal to the number of bits included in each of the elements X0.0, ..., and X7.0 constituting the vector matrix.

The matrix multiplying calculation of the weight matrix and the vector matrix may be appropriate for a multilayer perceptron-type neural network structure (hereinafter, referred to as an 'MLP-type neural network'). In general, the MLP-type neural network for executing deep learning may include an input layer, a plurality of hidden layers (e.g., at least three hidden layers), and an output layer. The matrix multiplying calculation (i.e., the MAC arithmetic operation) of the weight matrix and the vector matrix illustrated in FIG. 5 may be performed in one of the hidden layers. In a first hidden layer of the plurality of hidden layers, the MAC arithmetic operation may be performed using vector data input to the first hidden layer. However, in each of second to last hidden layers among the plurality of hidden layers, the MAC arithmetic operation may be performed using a calculation result of the previous hidden layer as the vector data.

Figure 6:
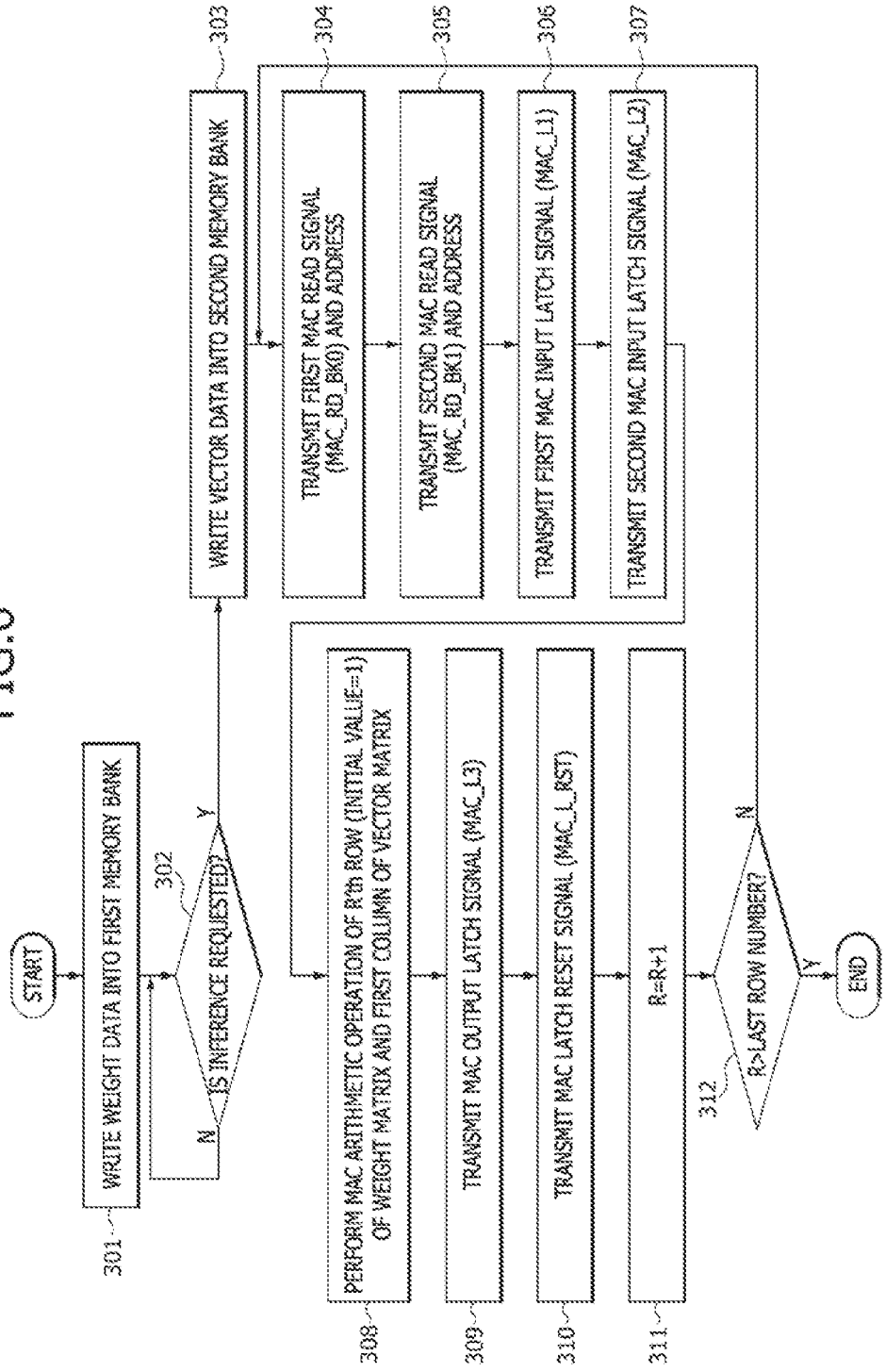
FIG. 6 is a flowchart illustrating processes of the MAC arithmetic operation illustrated in FIG. 5 in a PIM system according to a first embodiment of the present disclosure.

FIG. 6 is a flowchart illustrating processes of the MAC arithmetic operation described with reference to FIG. 5, which are performed in the PIM system 1-1 according to the first embodiment of the present disclosure. In addition, FIGS. 7 to 13 are block diagrams illustrating the processes of the MAC arithmetic operation illustrated in FIG. 5, which are performed in the PIM system 1-1 according to the first embodiment of the present disclosure. Referring to FIGS. 6 to 13, before the MAC arithmetic operation is performed, the first data (i.e., the weight data) may be written into the first memory bank 111 at a step 301. Thus, the weight data may be stored in the first memory bank 111 of the PIM device 100. In the present embodiment, it may be assumed that the weight data are the elements W0.0, ..., and W7.7 constituting the weight matrix of FIG. 5. The integer before the decimal point is one less than a row number, and the integer after the decimal point is one less than a column number. Thus, for example, the weight W0.0 represents the element of the first row and the first column of the weight matrix.

At a step 302, whether an inference is requested may be determined. An inference request signal may be transmitted from an external device located outside of the PIM system 1-1 to the PIM controller 200 of the PIM system 1-1. An inference request, in some instances, may be based on user input. An inference request may initiate a calculation performed by the PIM system 1-1 to reach a determination based on input data. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 5. If the inference request signal is transmitted to the PIM controller 200 at the step 302, then the PIM controller 200 may write the vector data transmitted with the inference request signal into the second memory bank 112 at a step 303. Accordingly, the vector data may be stored in the second memory bank 112 of the PIM device 100.

Figure 7:
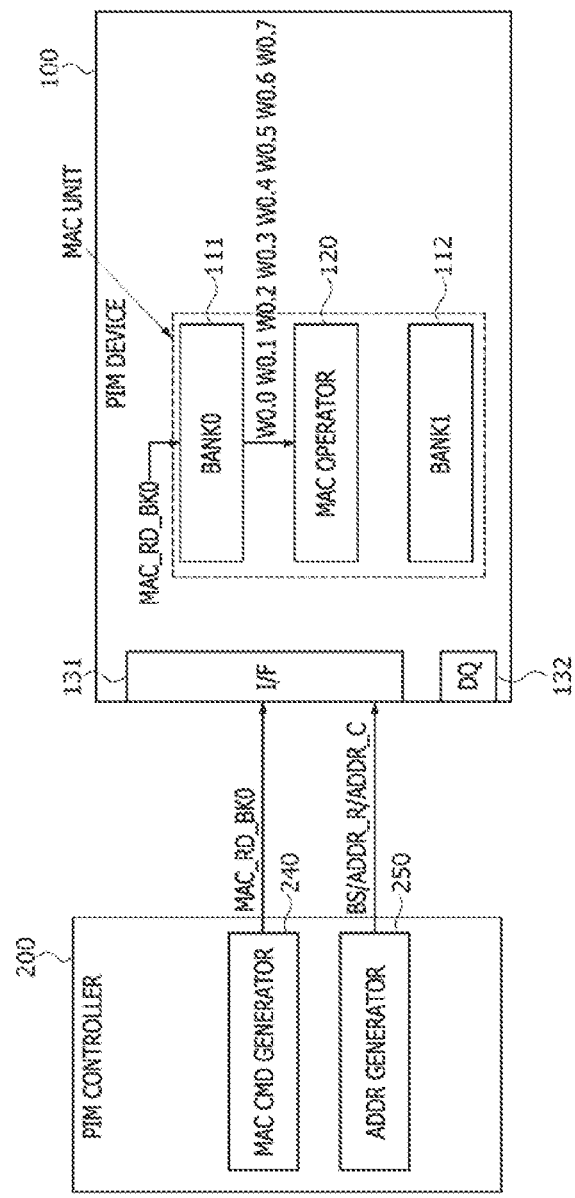
FIGS. 7 to 13 are block diagrams illustrating processes of the MAC arithmetic operation illustrated in FIG. 5 in a PIM system according to a first embodiment of the present disclosure.

At a step 304, the MAC command generator 240 of the PIM controller 200 may generate and transmit the first MAC read signal MAC_RD_BK0 to the PIM device 100, as illustrated in FIG. 7. In such a case, the address generator 250 of the PIM controller 200 may generate and transmit the bank selection signal BS and the row/column address ADDR_R/ADDR_C to the PIM device 100. The bank selection signal BS may be generated to select the first memory bank 111 of the first and second memory banks 111 and 112. Thus, the first MAC read signal MAC_RD_BK0 may control the data read operation for the first memory bank 111 of the PIM device 100. The first memory bank 111 may output and transmit the elements W0.0, . . . , and W0.7 in the first row of the weight matrix of the weight data stored in a region of the first memory bank 111, which is selected by the row/column address ADDR_R/ADDR_C, to the MAC operator 120 in response to the first MAC read signal MAC_RD_BK0. In an embodiment, the data transmission from the first memory bank 111 to the MAC operator 120 may be executed through a global input/output (hereinafter, referred to as 'GIO') line which is provided as a data transmission path in the PIM device 100. Alternatively, the data transmission from the first memory bank 111 to the MAC operator 120 may be executed through a first bank input/output (hereinafter, referred to as 'BIO') line which is provided specifically for data transmission between the first memory bank 111 and the MAC operator 120.

Figure 8:
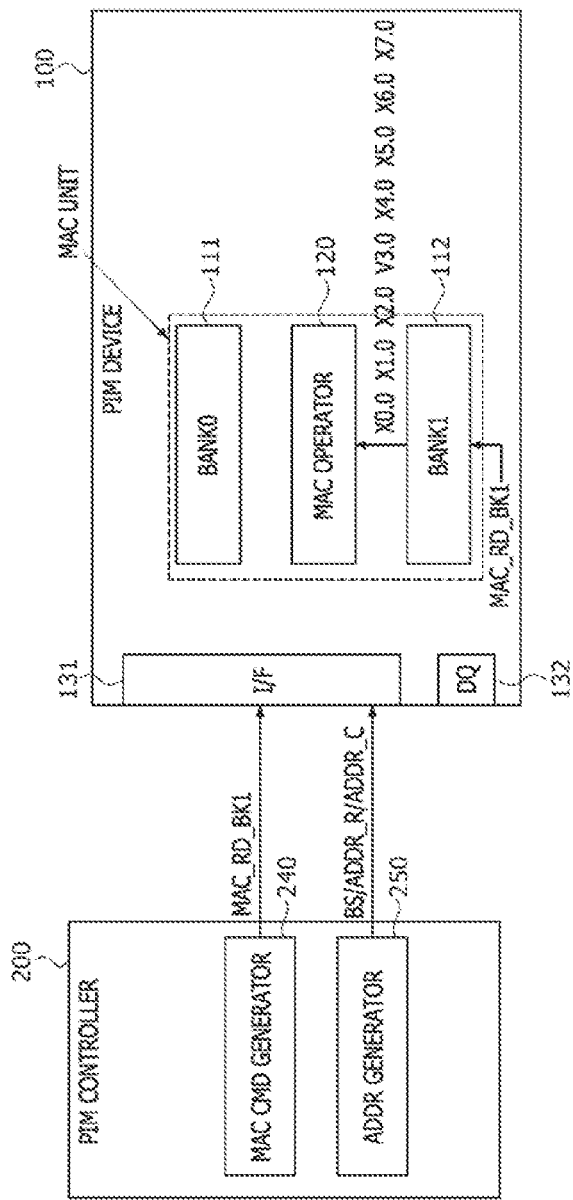

At a step 305, the MAC command generator 240 of the PIM controller 200 may generate and transmit the second MAC read signal MAC_RD_BK1 to the PIM device 100, as illustrated in FIG. 8. In such a case, the address generator 250 of the PIM controller 200 may generate and transmit the bank selection signal BS for selecting the second memory bank 112 and the row/column address ADDR_R/ADDR_C to the PIM device 100. The second MAC read signal MAC_RD_BK1 may control the data read operation for the second memory bank 112 of the PIM device 100. The second memory bank 112 may output and transmit the elements X0.0, . . . , and X7.0 in the first column of the vector matrix corresponding to the vector data stored in a region of the second memory bank 112, which is selected by the row/column address ADDR_R/ADDR_C, to the MAC operator 120 in response to the second MAC read signal MAC_RD_BK1. In an embodiment, the data transmission from the second memory bank 112 to the MAC operator 120 may be executed through the GIO line in the PIM device 100. Alternatively, the data transmission from the second memory bank 112 to the MAC operator 120 may be executed through a second BIO line which is provided specifically for data transmission between the second memory bank 112 and the MAC operator 120.

Figure 9:
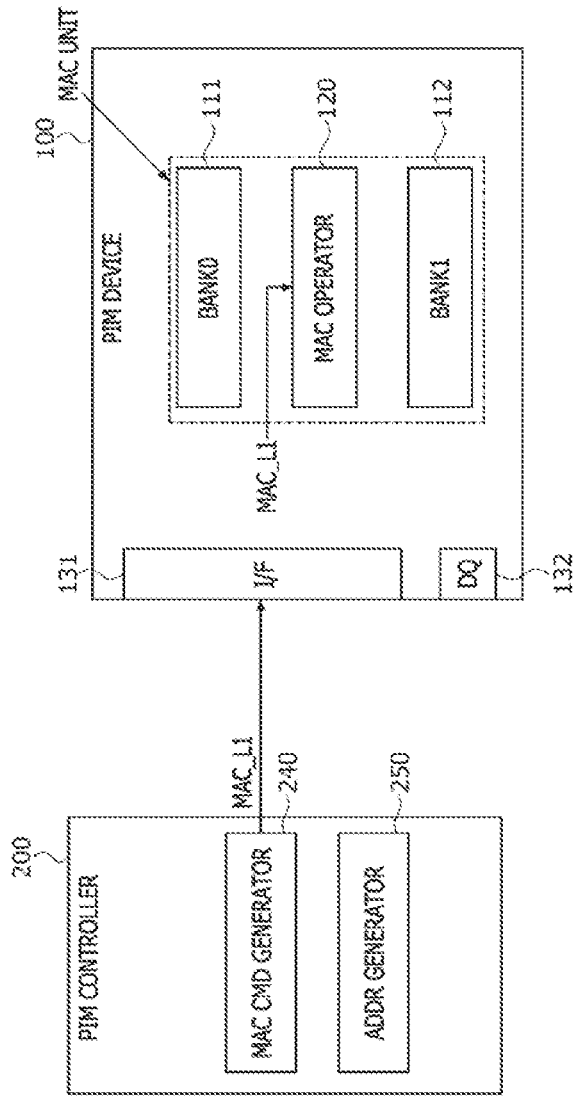
Figure 11:
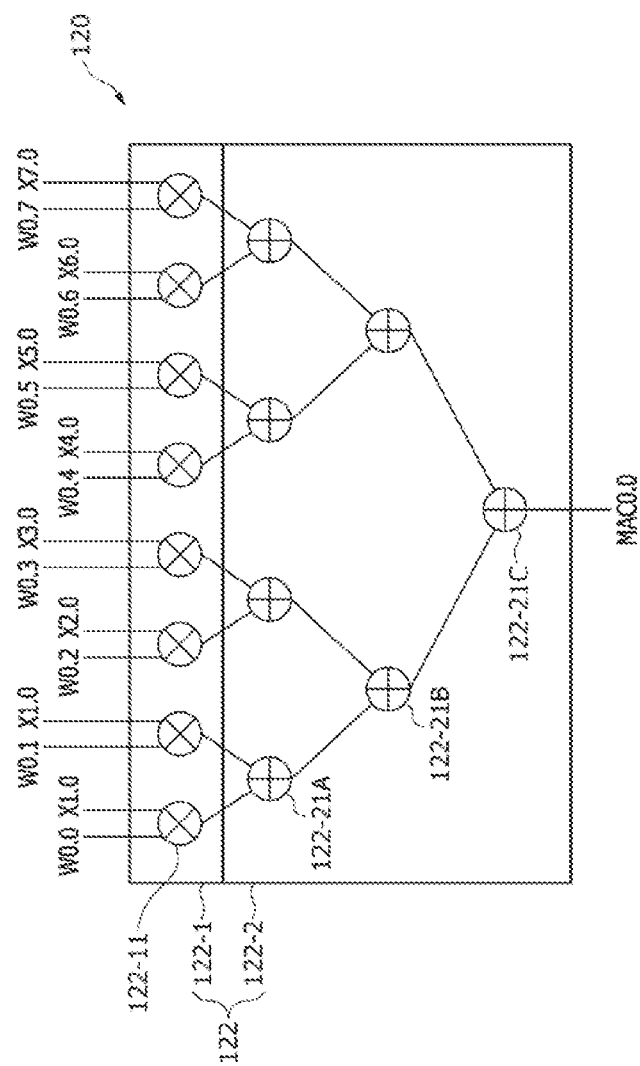

At a step 306, the MAC command generator 240 of the PIM controller 200 may generate and transmit the first MAC input latch signal MAC_L1 to the PIM device 100, as illustrated in FIG. 9. The first MAC input latch signal MAC_1 may control the input latch operation of the first data for the MAC operator 120 of the PIM device 100. The elements W0.0, . . . , and W0.7 in the first row of the weight matrix may be input to the MAC circuit 122 of the MAC operator 120 by the input latch operation, as illustrated in FIG. 11. The MAC circuit 122 may include the plurality of multipliers 122-11 (e.g., eight multipliers 122-11), the number of which is equal to the number of columns of the weight matrix. In such a case, the elements W0.0, . . . , and W0.7 in the first row of the weight matrix may be input to the eight multipliers 122-11, respectively.

Figure 10:
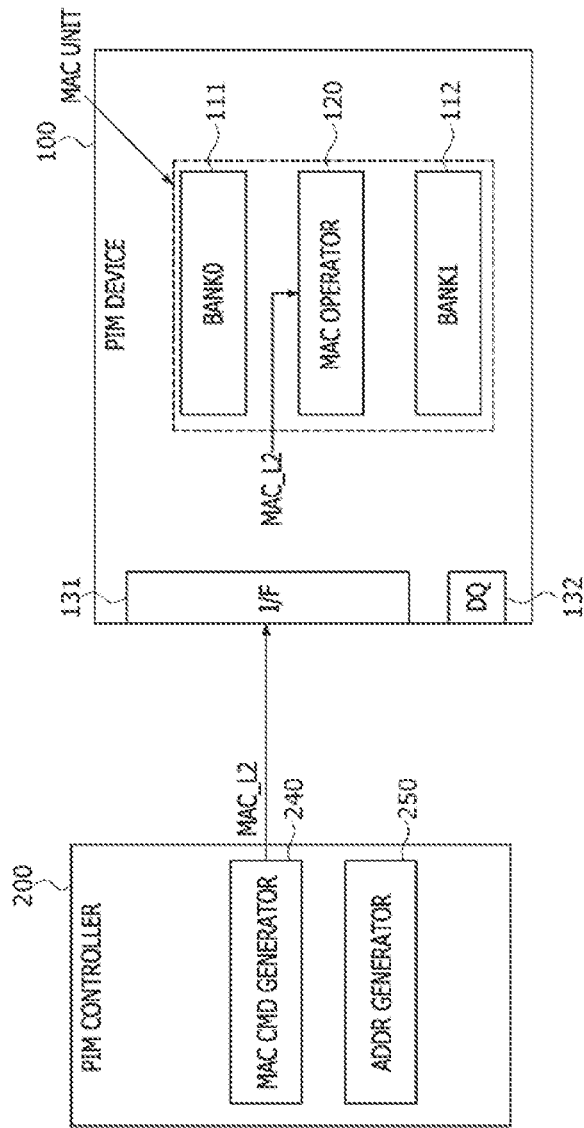

At a step 307, the MAC command generator 240 of the PIM controller 200 may generate and transmit the second MAC input latch signal MAC_L2 to the PIM device 100, as illustrated in FIG. 10. The second MAC input latch signal MAC_L2 may control the input latch operation of the second data for the MAC operator 120 of the PIM device 100. The elements X0.0, . . . , and X7.0 in the first column of the vector matrix may be input to the MAC circuit 122 of the MAC operator 120 by the input latch operation, as illustrated in FIG. 11. In such a case, the elements X0.0, . . . , and X7.0 in the first column of the vector matrix may be input to the eight multipliers 122-11, respectively.

At a step 308, the MAC circuit 122 of the MAC operator 120 may perform the MAC arithmetic operation of an R row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. For example, the scalar product is calculated of the Rth '1×N' row vector of the 'M×N' weight matrix and the 'N×1' vector matrix as an 'R×1' element of the 'M×1' MAC result matrix. For R=1, the scalar product of the first row of the weight matrix and the first column of the vector matrix shown in FIG. 5 is W0.0*X0.0+W0.1*X1.0+W0.2*X2.0+ W0.3*X3.0+W0.4*X4.0+W0.5*X5.0+W0.6*X6.0+ W0.7*X7.0. Specifically, each of the multipliers 122-11 of the multiplication logic circuit 122-1 may perform a multiplying calculation of the input data, and the result data of the multiplying calculation may be input to the addition logic circuit 122-2. The addition logic circuit 122-2, as illustrated in FIG. 11, may include four adders 122-21A disposed at a first stage, two adders 122-21B disposed at a second stage, and an adder 122-21C disposed at a third stage.

Each of the adders 122-21A disposed at the first stage may receive output data of two of the multipliers 122-11 and may perform an adding calculation of the output data of the two multipliers 122-11 to output the result of the adding calculation. Each of the adders 122-21B disposed at the second stage may receive output data of two of the adders 122-21A disposed at the first stage and may perform an adding calculation of the output data of the two adders 122-21A to output the result of the adding calculation. The adder 122-21C disposed at the third stage may receive output data of two of the adders 122-21B disposed at the second stage and may perform an adding calculation of the output data of the two adders 122-21B to output the result of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to an element MAC0.0 located at a first row of an '8×1' MAC result matrix having eight elements of MAC0.0, . . . , and MAC7.0, as illustrated in FIG. 5. The output data MAC0.0 of the addition logic circuit 122-2 may be input to the output latch 123-1 disposed in the data output circuit 123 of the MAC operator 120, as described with reference to FIG. 4.

Figure 12:
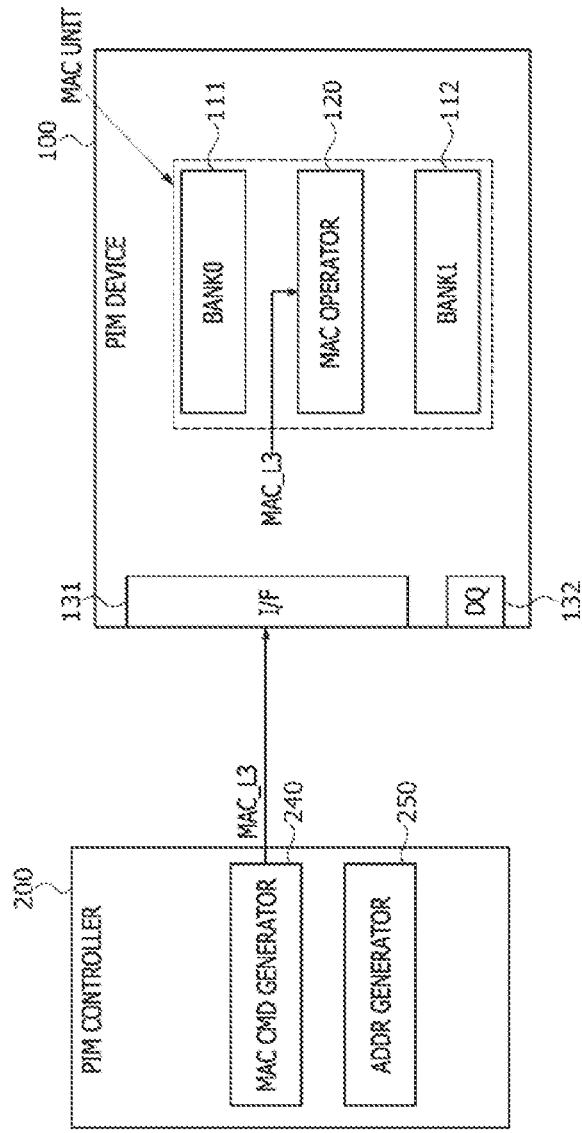

At a step 309, the MAC command generator 240 of the PIM controller 200 may generate and transmit the MAC output latch signal MAC_L3 to the PIM device 100, as illustrated in FIG. 12. The MAC output latch signal MAC_L3 may control the output latch operation of the MAC result data MAC0.0 performed by the MAC operator 120 of the PIM device 100. The MAC result data MAC0.0 input from the MAC circuit 122 of the MAC operator 120 may be output from the output latch 123-1 in synchronization with the MAC output latch signal MAC_L3, as described with reference to FIG. 4. The MAC result data MAC0.0 output from the output latch 123-1 may be input to the transfer gate 123-2 of the data output circuit 123.

Figure 13:
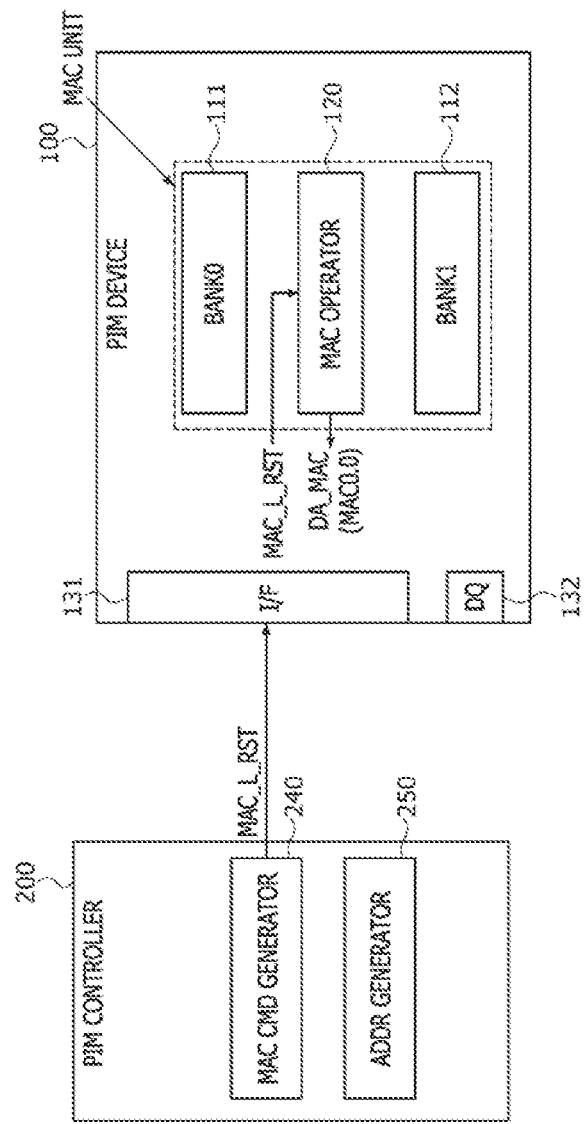

At a step 310, the MAC command generator 240 of the PIM controller 200 may generate and transmit the MAC latch reset signal MAC_L_RST to the PIM device 100, as illustrated in FIG. 13. The MAC latch reset signal MAC_L_RST may control an output operation of the MAC result data MAC0.0 generated by the MAC operator 120 and a reset operation of the output latch included in the MAC operator 120. As described with reference to FIG. 4, the transfer gate 123-2 receiving the MAC result data MAC0.0 from the output latch 123-1 of the MAC operator 120 may be synchronized with the MAC latch reset signal MAC_L_RST to output the MAC result data MAC0.0. In an embodiment, the MAC result data MAC0.0 output from the MAC operator 120 may be stored into the first memory bank 111 or the second memory bank 112 through the first BIO line or the second BIO line in the PIM device 100.

At a step 311, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 311. At a step 312, whether the row number changed at the step 311 is greater than the row number of the last row (i.e., the eighth row of the current example) of the weight matrix may be determined. Because the row number of the weight matrix is changed to '2' at the step 311, a process of the MAC arithmetic operation may be fed back to the step 304.

If the process of the MAC arithmetic operation is fed back to the step 304 from the step 312, then the same processes as described with reference to the steps 304 to 310 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 304 at the step 312, then the processes from the step 304 to the step 311 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 311, the MAC arithmetic operation may terminate because the row number of '9' is greater than the last row number of '8' at the step 312.

Figure 14:
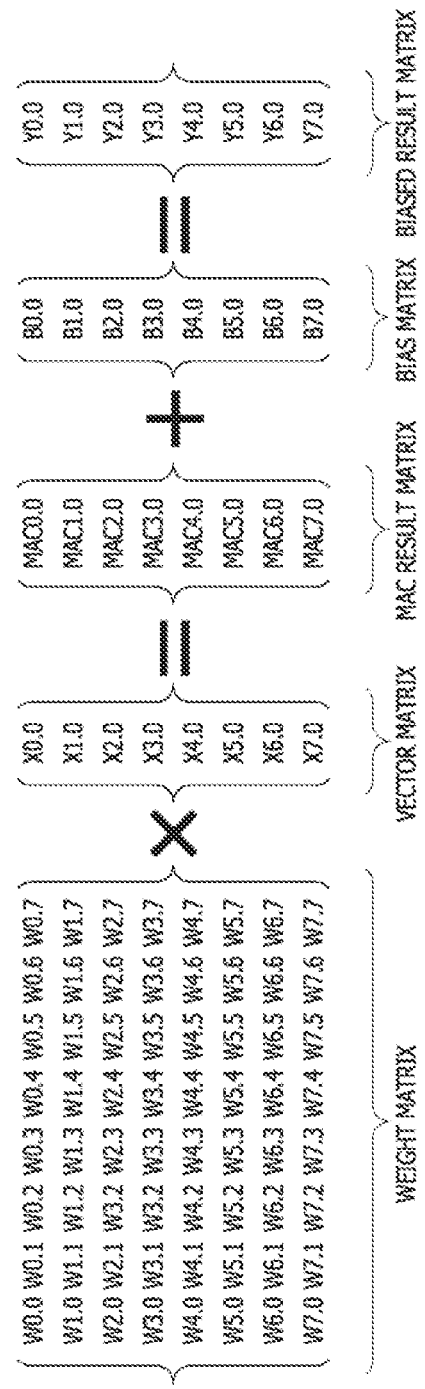
FIG. 14 illustrates another example of a MAC arithmetic operation performed in a PIM system according to a first embodiment of the present disclosure.

FIG. 14 illustrates another example of a MAC arithmetic operation performed in the PIM system 1-1 according to the first embodiment of the present disclosure. As illustrated in FIG. 14, the MAC arithmetic operation performed by the PIM system 1-1 may further include an adding calculation of the MAC result matrix and a bias matrix. Specifically, as described with reference to FIG. 5, the PIM device 100 may execute the matrix multiplying calculation of the '8×8' weight matrix and the '8×1' vector matrix according to control of the PIM controller 200. As a result of the matrix multiplying calculation of the '8×8' weight matrix and the '8×1' vector matrix, the '8×1' MAC result matrix having the eight elements MAC0.0, . . . , and MAC7.0 may be generated. The '8×1' MAC result matrix may be added to a '8×1' bias matrix. The '8×1' bias matrix may have elements B0.0, . . . , and B7.0 corresponding to bias data. The bias data may be set to reduce an error of the MAC result matrix. As a result of the adding calculation of the MAC result matrix and the bias matrix, a '8×1' biased result matrix having eight elements Y0.0, . . . , and Y7.0 may be generated.

Figure 15:
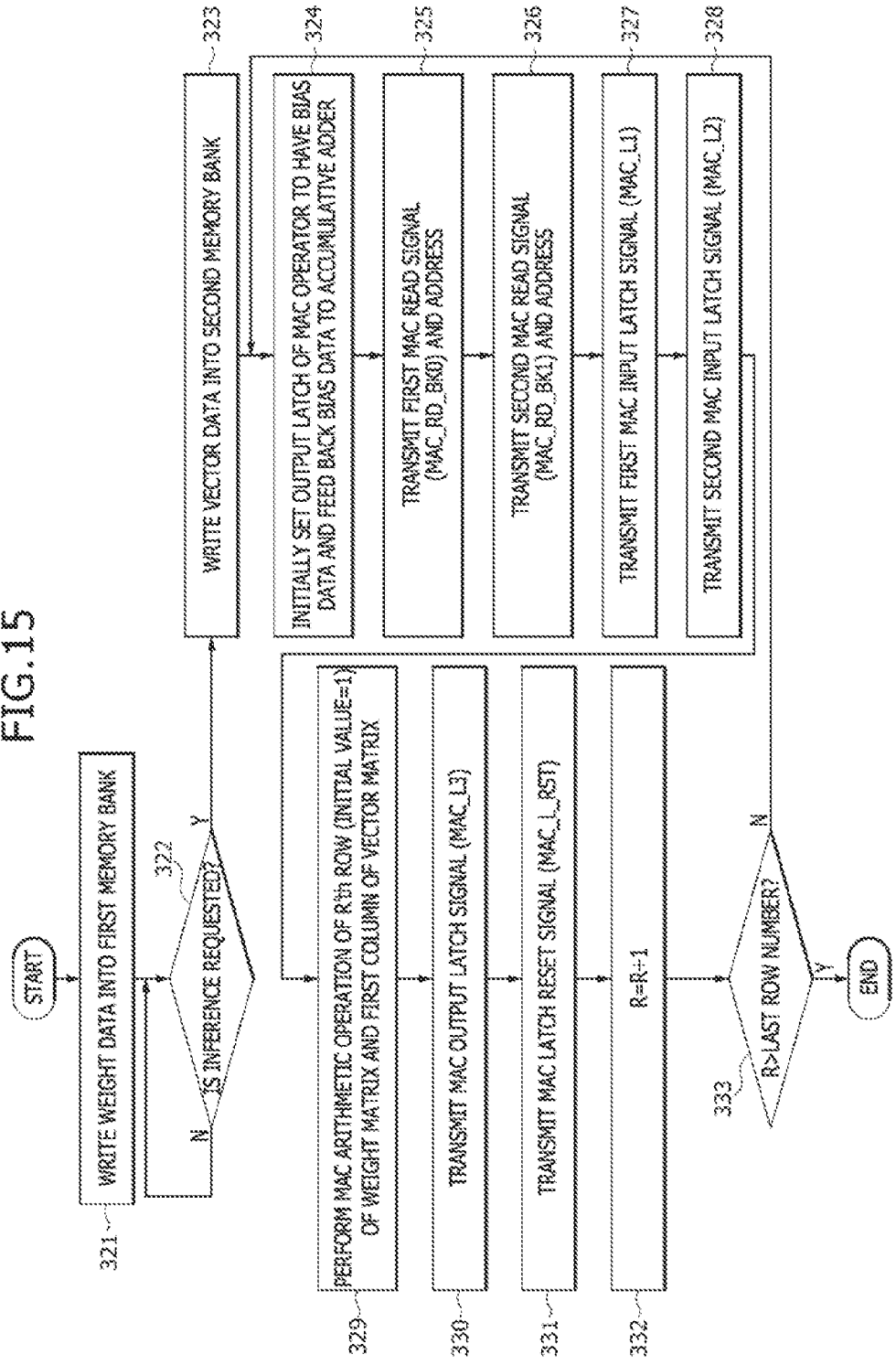
FIG. 15 is a flowchart illustrating processes of the MAC arithmetic operation illustrated in FIG. 14 in a PIM system according to a first embodiment of the present disclosure.
Figure 16:
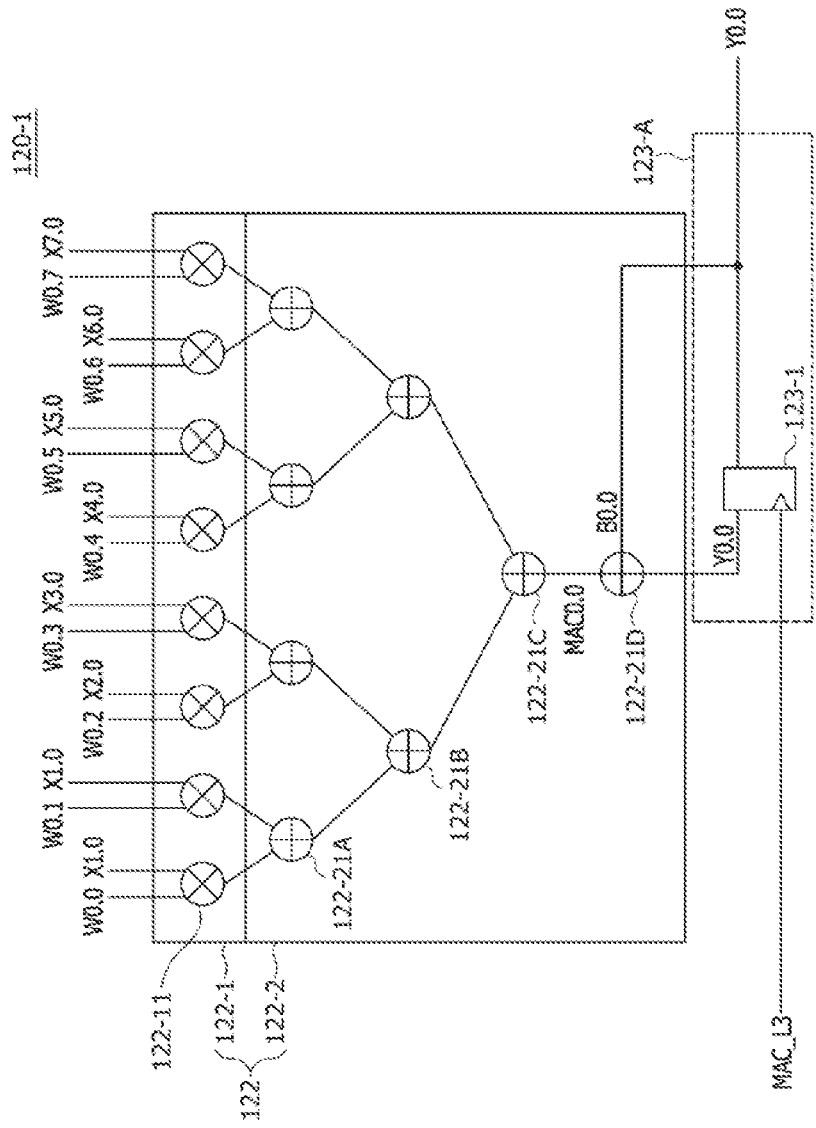
FIG. 16 illustrates an example of a configuration of a MAC operator for performing the MAC arithmetic operation of FIG. 14 in a PIM system according to a first embodiment of the present disclosure.

FIG. 15 is a flowchart illustrating processes of the MAC arithmetic operation described with reference to FIG. 14 in the PIM system 1-1 according to the first embodiment of the present disclosure. Moreover, FIG. 16 illustrates an example of a configuration of a MAC operator 120-1 for performing the MAC arithmetic operation of FIG. 14 in the PIM system 1-1 according to the first embodiment of the present disclosure. In FIG. 16, the same reference numerals or the same reference symbols as used in FIG. 4 denote the same elements, and the detailed descriptions of the same elements as indicated in the previous embodiment will be omitted hereinafter. Referring to FIG. 15, the first data (i.e., the weight data) may be written into the first memory bank 111 at a step 321 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 14.

At a step 322, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., data read/ write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted to the PIM controller 200 at the step 322, the PIM controller 200 may write the vector data transmitted with the inference request signal into the second memory bank 112 at a step 323. Accordingly, the vector data may be stored in the second memory bank 112 of the PIM device 100.

At a step 324, the output latch of the MAC operator may be initially set to have the bias data and the initially set bias data may be fed back to an accumulative adder of the MAC operator. This process is executed to perform the matrix adding calculation of the MAC result matrix and the bias matrix, which is described with reference to FIG. 14. In other words, the output latch 123-1 in the data output circuit 123-A of the MAC operator (120-1) is set to have the bias data. Because the matrix multiplying calculation is executed for the first row of the weight matrix, the output latch 123-1 may be initially set to have the element B0.0 located at a cross point of the first row and the first column of the bias matrix as the bias data. The output latch 123-1 may output the bias data B0.0, and the bias data B0.0 output from the output latch 123-1 may be input to the accumulative adder 122-21D of the addition logic circuit 122-2, as illustrated in FIG. 16.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-1 of the PIM device 100. When a subsequent MAC arithmetic operation is performed, the accumulative adder 122-21D of the MAC operator 120-1 may add the MAC result data MAC0.0 output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

In a step 325, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 325 may be executed in the same way as described with reference to FIG. 7. In a step 326, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 326 may be executed in the same way as described with reference to FIG. 8.

At a step 327, the MAC command generator 240 of the PIM controller 200 may generate and transmit the first MAC input latch signal MAC_L1 to the PIM device 100. The step 327 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 328, the MAC command generator 240 of the PIM controller 200 may generate and transmit the second MAC input latch signal MAC_L2 to the PIM device 100. The step 328 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 329, the MAC circuit 122 of the MAC operator 120 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the input data, and the result data of the multiplying calculation may be input to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 16. The accumulative adder 122-21D may add output data of the adder 122-21C to feedback data fed back from the output latch 123-1 to output the result of the adding calculation. The output data of the adder 122-21C may be the matrix multiplying result MAC0.0, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be input to the output latch 123 disposed in a data output circuit 123-A of the MAC operator 120-1.

At a step 330, the MAC command generator 240 of the PIM controller 200 may generate and transmit the MAC output latch signal MAC_L3 to the PIM device 100. The step 330 may be executed in the same way as described with reference to FIG. 12. The MAC output latch signal MAC_L3 may control the output latch operation of the MAC result data MAC0.0, which is performed by the MAC operator 120-1 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 output from the output latch 123 may be input to the transfer gate 123-2.

At a step 331, the MAC command generator 240 of the PIM controller 200 may generate and transmit the MAC latch reset signal MAC_L_RST to the PIM device 100. The step 331 may be executed in the same way as described with reference to FIG. 13. The MAC latch reset signal MAC_L_RST may control an output operation of the biased result data Y0.0 generated by the MAC operator 120 and a reset operation of the output latch 123-1 included in the MAC operator 120. The transfer gate 123-2 receiving the biased result data Y0.0 from the output latch 123-1 of the data output circuit 123-A included in the MAC operator 120 may be synchronized with the MAC latch reset signal MAC_L_RST to output the biased result data Y0.0. In an embodiment, the biased result data Y0.0 output from the MAC operator 120 may be stored into the first memory bank 111 or the second memory bank 112 through the first BIO line or the second BIO line in the PIM device 100.

At a step 332, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 332. At a step 333, whether the row number changed at the step 332 is greater than the row number of the last row (i.e., the eighth row of the current example) of the weight matrix may be determined. Because the row number of the weight matrix is changed to '2' at the step 332, a process of the MAC arithmetic operation may be fed back to the step 324.

If the process of the MAC arithmetic operation is fed back to the step 324 from the step 333, then the same processes as described with reference to the steps 324 to 331 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix and the bias data B0.0 in the output latch 123-1 initially set at the step 324 may be changed into the bias data B1.0. If the process of the MAC arithmetic operation is fed back to the step 324 at the step 333, the processes from the step 324 to the step 332 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 332, the MAC arithmetic operation may terminate because the row number of '9' is greater than the last row number of '8' at the step 333.

Figure 17:
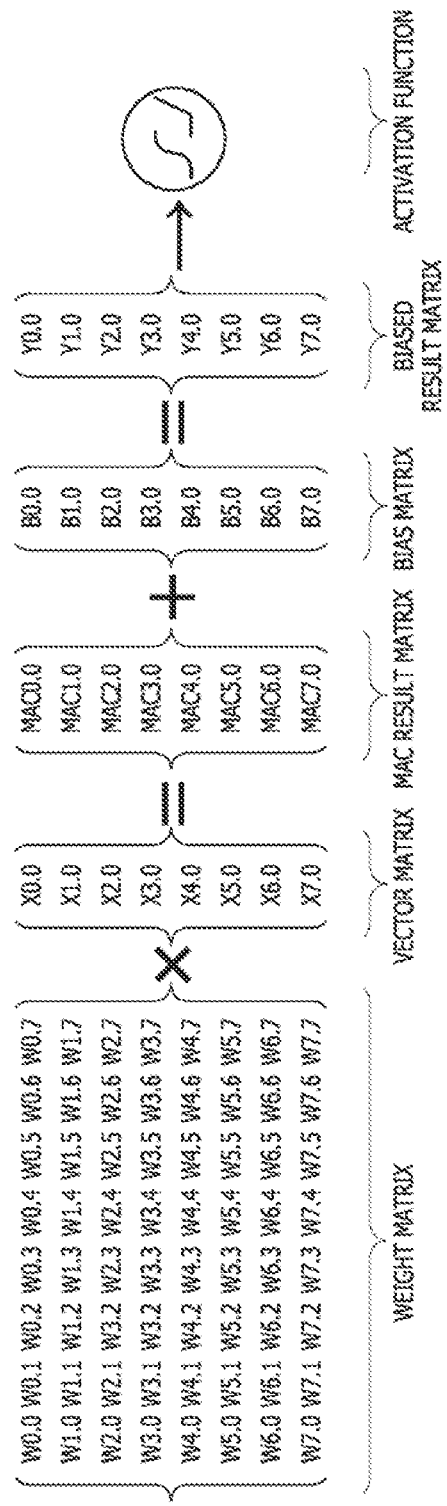
FIG. 17 illustrates yet another example of a MAC arithmetic operation performed in a PIM system according to a first embodiment of the present disclosure.

FIG. 17 illustrates yet another example of a MAC arithmetic operation performed in the PIM system 1-1 according to the first embodiment of the present disclosure. As illustrated in FIG. 17, the MAC arithmetic operation performed by the PIM system 1-1 may further include a process for applying the biased result matrix to an activation function. Specifically, as described with reference to FIG. 14, the PIM device 100 may execute the matrix multiplying calculation of the '8×8' weight matrix and the '8×1' vector matrix according to control of the PIM controller 200 to generate the MAC result matrix. In addition, the MAC result matrix may be added to the bias matrix to generate biased result matrix.

The biased result matrix may be applied to the activation function. The activation function means a function which is used to calculate a unique output value by comparing a MAC calculation value with a critical value in an MLP-type neural network. In an embodiment, the activation function may be a unipolar activation function which generates only positive output values or a bipolar activation function which generates negative output values as well as positive output values. In different embodiments, the activation function may include a sigmoid function, a hyperbolic tangent (Tanh) function, a rectified linear unit (ReLU) function, a leaky ReLU function, an identity function, and a maxout function.

Figure 18:
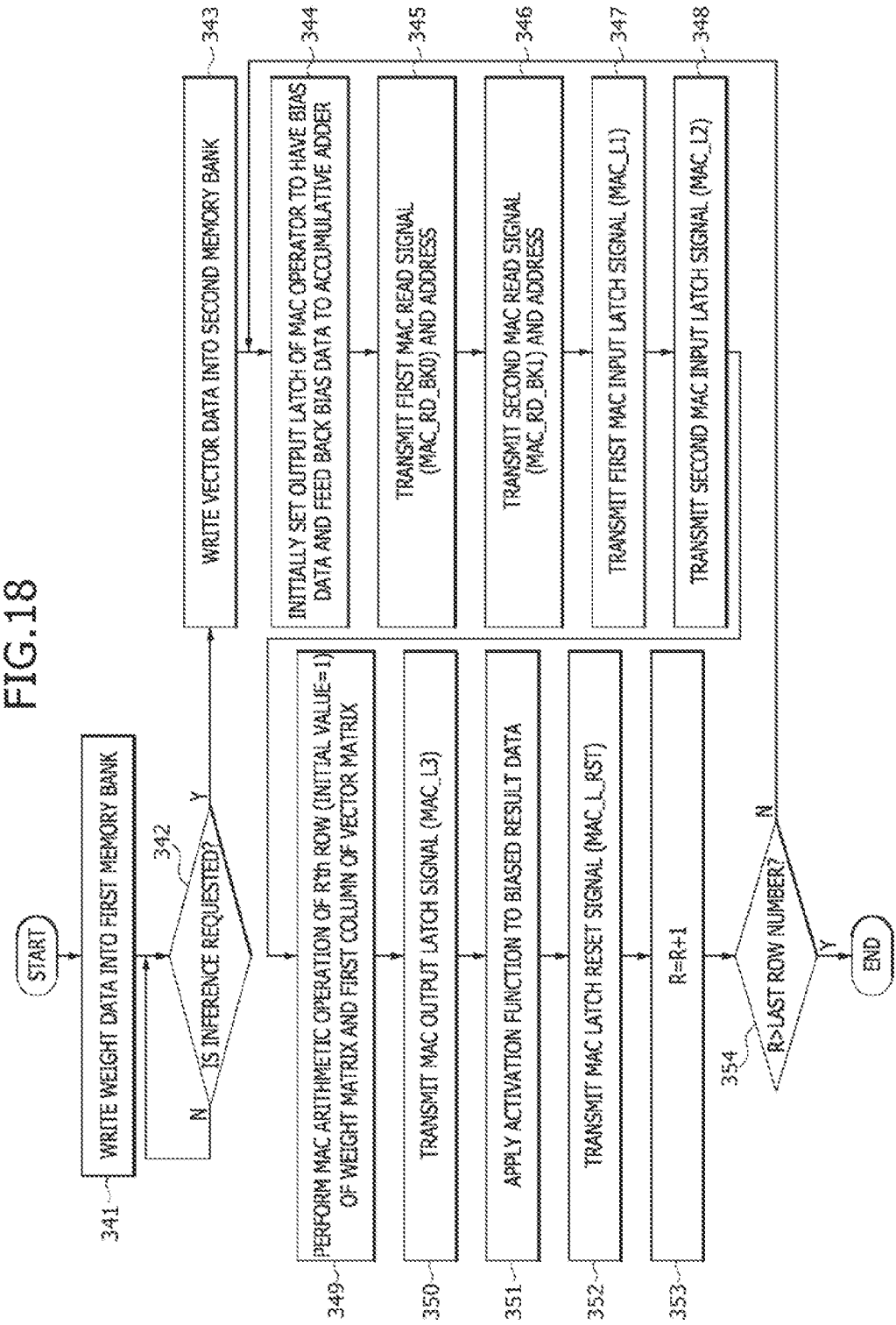
FIG. 18 is a flowchart illustrating processes of the MAC arithmetic operation illustrated in FIG. 17 in a PIM system according to a first embodiment of the present disclosure.
Figure 19:
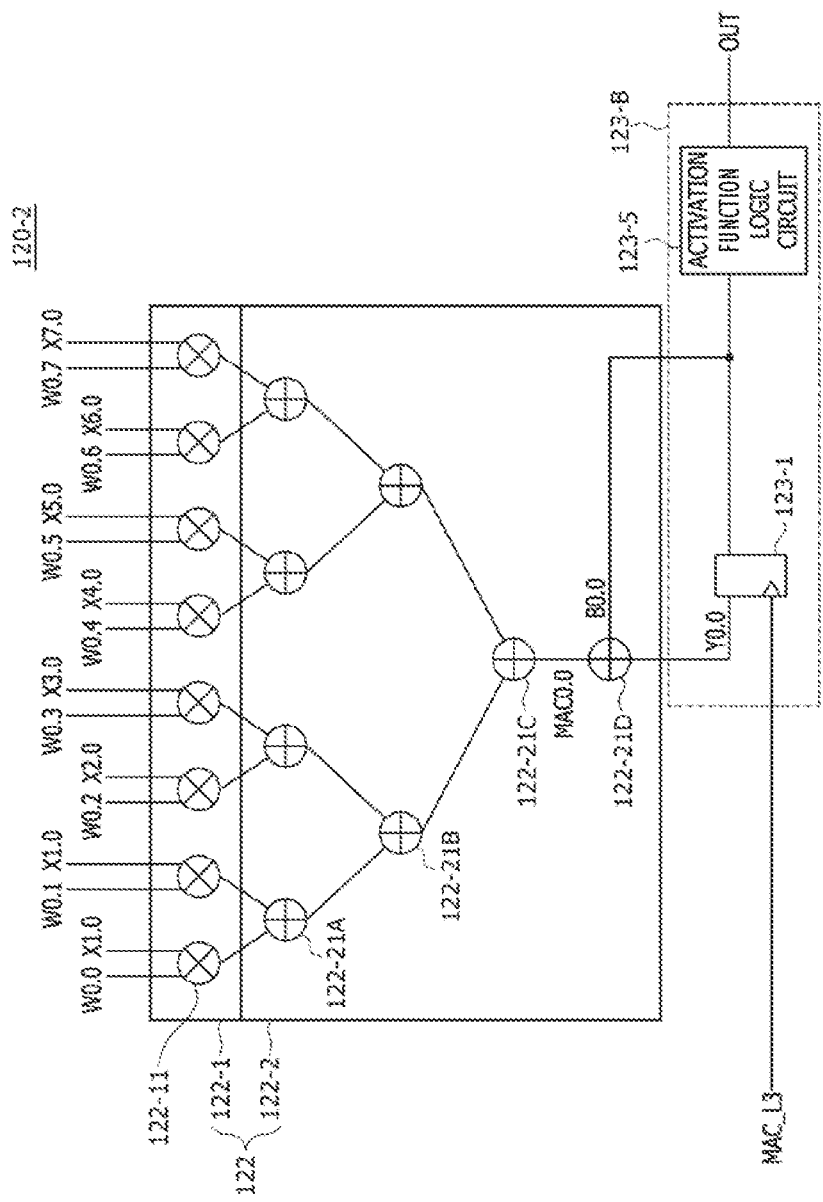
FIG. 19 illustrates an example of a configuration of a MAC operator for performing the MAC arithmetic operation of FIG. 17 in a PIM system according to a first embodiment of the present disclosure.

FIG. 18 is a flowchart illustrating processes of the MAC arithmetic operation described with reference to FIG. 17 in the PIM system 1-1 according to the first embodiment of the present disclosure. Moreover, FIG. 19 illustrates an example of a configuration of a MAC operator 120-2 for performing the MAC arithmetic operation of FIG. 17 in the PIM system 1-1 according to the first embodiment of the present disclosure. In FIG. 19, the same reference numerals or the same reference symbols as used in FIG. 4 denote the same elements, and the detailed descriptions of the same elements as mentioned in the previous embodiment will be omitted hereinafter. Referring to FIG. 18, the first data (i.e., the weight data) may be written into the first memory bank 111 at a step 341 to perform the MAC arithmetic operation in the PIM device 100. Thus, the weight data may be stored in the first memory bank 111 of the PIM device 100. In the present embodiment, it may be assumed that the weight data are the elements W0.0, . . . , and W7.7 constituting the weight matrix of FIG. 17.

At a step 342, whether an inference is requested may be determined. An inference request signal may be transmitted from an external device located outside of the PIM system 1-1 to the PIM controller 200 of the PIM system 1-1. In an embodiment, if no inference request signal is transmitted to the PIM controller 200, the PIM system 1-1 may be in a standby mode until the inference request signal is transmitted to the PIM controller 200. Alternatively, if no inference request signal is transmitted to the PIM controller 200, the PIM system 1-1 may perform operations (e.g., the data read/write operations) other than the MAC arithmetic operation in the memory mode until the inference request signal is transmitted to the PIM controller 200. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 200 at the step 342, then the PIM controller 200 may write the vector data transmitted with the inference request signal into the second memory bank 112 at a step 343. Accordingly, the vector data may be stored in the second memory bank 112 of the PIM device 100.

At a step 344, an output latch of a MAC operator may be initially set to have bias data and the initially set bias data may be fed back to an accumulative adder of the MAC operator. This process is executed to perform the matrix adding calculation of the MAC result matrix and the bias matrix, which is described with reference to FIG. 17. That is, as illustrated in FIG. 19, the output latch 123-1 of the MAC operator (120-2 of FIG. 19) may be initially set to have the bias data of the bias matrix. Because the matrix multiplying calculation is executed for the first row of the weight matrix, the element B0.0 located at first row and the first column of the bias matrix may be initially set as the bias data in the output latch 123-1. The output latch 123-1 may output the bias data B0.0, and the bias data B0.0 output from the output latch 123-1 may be input to the accumulative adder 122-21D of the MAC operator 120-2.

In an embodiment, in order to output the bias data B0.0 out of the output latch 123-1 and to feed back the bias data B0.0 to the accumulative adder 122-21D, the MAC command generator 240 of the PIM controller 200 may transmit the MAC output latch signal MAC_L3 to the MAC operator 120-2 of the PIM device 100. When a subsequent MAC arithmetic operation is performed, the accumulative adder 122-21D of the MAC operator 120-2 may add the MAC result data MAC0.0 output from the adder 122-21C disposed at the last stage to the bias data B0.0 which is fed back from the output latch 123-1 to generate the biased result data Y0.0 and may output the biased result data Y0.0 to the output latch 123-1. As illustrated in FIG. 19, the biased result data Y0.0 may be transmitted from the output latch 123-1 to an activation function logic circuit 123-5 disposed in a data output circuit 123-B of the MAC operator 120-2 in synchronization with the MAC output latch signal MAC_L3 transmitted in a subsequent process.

In a step 345, the MAC command generator 240 of the PIM controller 200 may generate and transmit the first MAC read signal MAC_RD_BK0 to the PIM device 100. In addition, the address generator 250 of the PIM controller 200 may generate and transmit the bank selection signal BS and the row/column address ADDR_R/ADDR_C to the PIM device 100. The step 345 may be executed in the same way as described with reference to FIG. 7. In a step 346, the MAC command generator 240 of the PIM controller 200 may generate and transmit the second MAC read signal MAC_RD_BK1 to the PIM device 100. In addition, the address generator 250 of the PIM controller 200 may generate and transmit the bank selection signal BS for selecting the second memory bank 112 and the row/column address ADDR_R/ADDR_C to the PIM device 100. The step 346 may be executed in the same way as described with reference to FIG. 8.

At a step 347, the MAC command generator 240 of the PIM controller 200 may generate and transmit the first MAC input latch signal MAC_L1 to the PIM device 100. The step 347 may be executed in the same way as described with reference to FIG. 9. The first MAC input latch signal MAC_L1 may control the input latch operation of the first data for the MAC operator 120 of the PIM device 100. The input latch operation of the first data may be performed in the same way as described with reference to FIG. 11. At a step 348, the MAC command generator 240 of the PIM controller 200 may generate and transmit the second MAC input latch signal MAC_L2 to the PIM device 100. The step 348 may be executed in the same way as described with reference to FIG. 10. The second MAC input latch signal MAC_L2 may control the input latch operation of the second data for the MAC operator 120 of the PIM device 100. The input latch operation of the second data may be performed in the same way as described with reference to FIG. 11.

At a step 349, the MAC circuit 122 of the MAC operator 120 may perform the MAC arithmetic operation of an R row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the input data, and the result data of the multiplying calculation may be input to the addition logic circuit 122-2. The addition logic circuit 122-2 may include the four adders 122-21A disposed at the first stage, the two adders 122-21B disposed at the second stage, the adder 122-21C disposed at the third stage, and the accumulative adder 122-21D, as illustrated in FIG. 19. The accumulative adder 122-21D may add output data of the adder 122-21C to feedback data fed back from the output latch 123-1 to output the result of the adding calculation. The output data of the adder 122-21C may be the element MAC0.0 of the '8×1' MAC result matrix, which corresponds to the result of the matrix multiplying calculation of the first row of the weight matrix and the first column of the vector matrix. The accumulative adder 122-21D may add the output data MAC0.0 of the adder 122-21C to the bias data B0.0 fed back from the output latch 123-1 to output the result of the adding calculation. The output data Y0.0 of the accumulative adder 122-21D may be input to the output latch 123-1 disposed in the data output circuit 123-A of the MAC operator 120.

At a step 350, the MAC command generator 240 of the PIM controller 200 may generate and transmit the MAC output latch signal MAC_L3 to the PIM device 100. The step 350 may be executed in the same way as described with reference to FIG. 12. The MAC output latch signal MAC_L3 may control the output latch operation of the output latch 123-1 included in the MAC operator 120 of the PIM device 100. The biased result data Y0.0 transmitted from the MAC circuit 122 of the MAC operator 120 to the output latch 123-1 may be output from the output latch 123-1 in synchronization with the MAC output latch signal MAC_L3. The biased result data Y0.0 output from the output latch 123-1 may be input to the activation function logic circuit 123-5. At a step 351, the activation function logic circuit 123-5 may apply an activation function to the biased result data Y0.0 to generate a final output value, and the final output value may be input to the transfer gate (123-2 of FIG. 4). This, for example, is the final output value for the current of R which is incremented in step 354.

At a step 352, the MAC command generator 240 of the PIM controller 200 may generate and transmit the MAC latch reset signal MAC_L_RST to the PIM device 100. The step 352 may be executed in the same way as described with reference to FIG. 13. The MAC latch reset signal MAC_L_RST may control an output operation of the final output value generated by the MAC operator 120 and a reset operation of the output latch 123-1 included in the MAC operator 120. The transfer gate 123-2 receiving the final output value from the activation function logic circuit 123-5 of the data output circuit 123-B included in the MAC operator 120 may be synchronized with the MAC latch reset signal MAC_L_RST to output the final output value. In an embodiment, the final output value output from the MAC operator 120 may be stored into the first memory bank 111 or the second memory bank 112 through the first BIO line or the second BIO line in the PIM device 100.

At a step 353, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 353. At a step 354, whether the row number changed at the step 353 is greater than the row number of the last row (i.e., the eighth row) of the weight matrix may be determined. Because the row number of the weight matrix is changed to '2' at the step 353, a process of the MAC arithmetic operation may be fed back to the step 344.

If the process of the MAC arithmetic operation is fed back to the step 344 from the step 354, the same processes as described with reference to the steps 344 to 354 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix, and the bias data B0.0 in the output latch 123-1 initially set at the step 344 may be changed to the bias data B1.0. If the process of the MAC arithmetic operation is fed back to the step 344 from the step 354, the processes from the step 344 to the step 354 may be iteratively performed until the MAC arithmetic operation is performed for all of the rows of the weight matrix with the vector matrix. For an embodiment, a plurality of final output values, namely, one final output value for each incremented value of R, represents an 'N×1' final result matrix. If the MAC arithmetic operation for the eighth row of the weight matrix terminates and the row number of the weight matrix changes from '8' to '9' at the step 354, the MAC arithmetic operation may terminate because the row number of '9' is greater than the last row number of '8' at the step 354.

Figure 20:
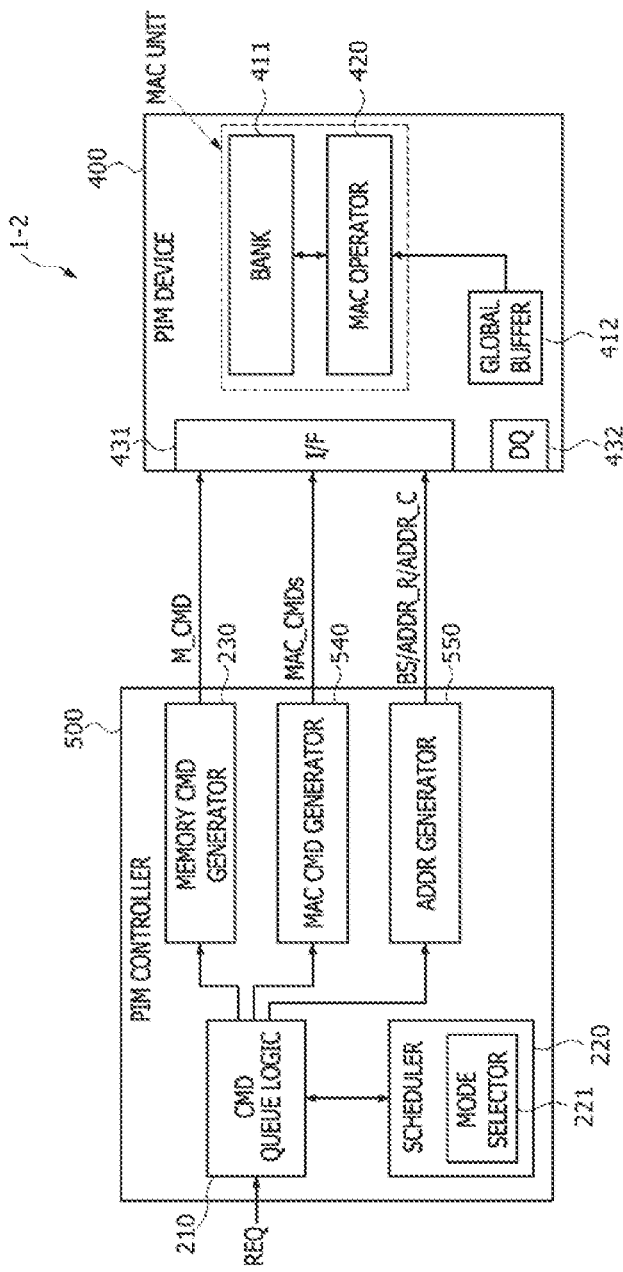
FIG. 20 is a block diagram illustrating a PIM system according to a second embodiment of the present disclosure.

FIG. 20 is a block diagram illustrating a PIM system 1-2 according to a second embodiment of the present disclosure. In FIG. 20, the same reference numerals or the same reference symbols as used in FIG. 2 denote the same elements. As illustrated in FIG. 20, the PIM system 1-2 may be configured to include a PIM device 400 and a PIM controller 500. The PIM device 400 may be configured to include a memory bank (BANK) 411 corresponding to a storage region, a global buffer 412, a MAC operator 420, an interface (I/F) 431, and a data input/output (I/O) pad 432. For an embodiment, the MAC operator 420 represents a MAC operator circuit. The memory bank (BANK) 411 and the MAC operator 420 included in the PIM device 400 may constitute one MAC unit. In another embodiment, the PIM device 400 may include a plurality of MAC units. The memory bank (BANK) 411 may represent a memory region for storing data, for example, a DRAM device. The global buffer 412 may also represent a memory region for storing data, for example, a DRAM device or an SRAM device. The memory bank (BANK) 411 may be a component unit which is independently activated and may be configured to have the same data bus width as data I/O lines in the PIM device 400. In an embodiment, the memory bank 411 may operate through interleaving such that an active operation of the memory bank 411 is performed in parallel while another memory bank is selected. The memory bank 411 may include at least one cell array which includes memory unit cells located at cross points of a plurality of rows and a plurality of columns.

Although not shown in the drawings, a core circuit may be disposed adjacent to the memory bank 411. The core circuit may include X-decoders XDECs and Y-decoders/IO circuits YDEC/IOs. An X-decoder XDEC may also be referred to as a word line decoder or a row decoder. The X-decoder XDEC may receive a row address ADDR_R from the PIM controller 500 and may decode the row address ADDR_R to select and enable one of the rows (i.e., word lines) coupled to the selected memory bank. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address ADD_C from the PIM controller 500 and may decode the column address ADD_C to select and enable at least one of the columns (i.e., bit lines) coupled to the selected memory bank. Each of the I/O circuits may include an I/O sense amplifier for sensing and amplifying a level of a read datum output from the corresponding memory bank during a read operation for the memory bank 411. In addition, the I/O circuit may include a write driver for driving a write datum during a write operation for the memory bank 411.

The MAC operator 420 of the PIM device 400 may have mostly the same configuration as the MAC operator 120 described with reference to FIG. 4. That is, the MAC operator 420 may be configured to include the data input circuit 121, the MAC circuit 122, and the data output circuit 123, as described with reference to FIG. 4. The data input circuit 121 may be configured to include the first input latch 121-1 and the second input latch 121-2. The MAC circuit 122 may be configured to include the multiplication logic circuit 122-1 and the addition logic circuit 122-2. The data output circuit 123 may be configured to include the output latch 123-1, the transfer gate 123-2, the delay circuit 123-3, and the inverter 123-4. In an embodiment, the first input latch 121-1, the second input latch 121-2, and the output latch 123-1 may be realized using flip-flops.

The MAC operator 420 may be different from the MAC operator 120 in that a MAC input latch signal MAC_L1 is simultaneously input to both of clock terminals of the first and second input latches 121-1 and 121-2. As indicated in the following descriptions, the weight data and the vector data may be simultaneously transmitted to the MAC operator 420 of the PIM device 400 included in the PIM system 1-2 according to the present embodiment. That is, the first data DA1 (i.e., the weight data) and the second data DA2 (i.e., the vector data) may be simultaneously input to both of the first input latch 121-1 and the second input latch 121-2 constituting the data input circuit 121, respectively. Accordingly, it may be unnecessary to apply an extra control signal to the clock terminals of the first and second input latches 121-1 and 121-2, and thus the MAC input latch signal MAC_L1 may be simultaneously input to both of the clock terminals of the first and second input latches 121-1 and 121-2 included in the MAC operator 420.

In another embodiment, the MAC operator 420 may be realized to have the same configuration as the MAC operator 120-1 described with reference to FIG. 16 to perform the operation illustrated in FIG. 14. Even in such a case, the MAC operator 420 may have the same configuration as described with reference to FIG. 16 except that the MAC input latch signal MAC_L1 is simultaneously input to both of the clock terminals of the first and second input latches 121-1 and 121-2 constituting the data input circuit 121. In yet another embodiment, the MAC operator 420 may be realized to have the same configuration as the MAC operator 120-2 described with reference to FIG. 19 to perform the operation illustrated in FIG. 17. Even in such a case, the MAC operator 420 may have the same configuration as described with reference to FIG. 19 except that the MAC input latch signal MAC_L1 is simultaneously input to both of the clock terminals of the first and second input latches 121-1 and 121-2 constituting the data input circuit 121.

The interface 431 of the PIM device 400 may receive the memory command M_CMD, the MAC commands MAC_CMDs, the bank selection signal BS, and the row/column addresses ADDR_R/ADDR_C from the PIM controller 500. The interface 431 may output the memory command M_CMD, together with the bank selection signal BS and the row/column addresses ADDR_R/ADDR_C, to the memory bank 411. The interface 431 may output the MAC commands MAC_CMDs to the memory bank 411 and the MAC operator 420. In such a case, the interface 431 may output the bank selection signal BS and the row/column addresses ADDR_R/ADDR_C to the memory bank 411. The data I/O pad 432 of the PIM device 400 may function as a data communication terminal between a device external to the PIM device 400, the global buffer 412, and the MAC unit (which includes the memory bank 411 and the MAC operator 420) included in the PIM device 400. The external device to the PIM device 400 may correspond to the PIM controller 500 of the PIM system 1-2 or a host located outside the PIM system 1-2. Accordingly, data output from the host or the PIM controller 500 may be input into the PIM device 400 through the data I/O pad 432. In addition, data generated by the PIM device 400 may be transmitted to the external device to the PIM device 400 through the data I/O pad 432.

The PIM controller 500 may control operations of the PIM device 400. In an embodiment, the PIM controller 500 may control the PIM device 400 such that the PIM device 400 operates in the memory mode or the MAC mode. In the event that the PIM controller 500 controls the PIM device 500 such that the PIM device 400 operates in the memory mode, the PIM device 400 may perform a data read operation or a data write operation for the memory bank 411. In the event that the PIM controller 500 controls the PIM device 400 such that the PIM device 400 operates in the MAC mode, the PIM device 400 may perform the MAC arithmetic operation for the MAC operator 420. In the event that the PIM controller 500 controls the PIM device 400 such that the PIM device 400 operates in the MAC mode, the PIM device 400 may also perform the data read operation and the data write operation for the memory bank 411 and the global buffer 412 to execute the MAC arithmetic operation.

The PIM controller 500 may be configured to include the command queue logic 210, the scheduler 220, the memory command generator 230, a MAC command generator 540, and an address generator 550. The scheduler 220 may include the mode selector 221. The command queue logic 210 may receive the request REQ from an external device (e.g., a host of the PIM system 1-2) and store a command queue corresponding the request REQ in the command queue logic 210. The command queue stored in the command queue logic 210 may be transmitted to the memory command generator 230 or the MAC command generator 540 according to a sequence determined by the scheduler 220. The scheduler 220 may adjust a timing of the command queue when the command queue stored in the command queue logic 210 is output from the command queue logic 210. The scheduler 210 may include the mode selector 221 that generates a mode selection signal including information on whether command queue stored in the command queue logic 210 relates to the memory mode or the MAC mode. The memory command generator 230 may receive the command queue related to the memory mode of the PIM device 400 from the command queue logic 210 to generate and output the memory command M_CMD. The command queue logic 210, the scheduler 220, the mode selector 221, and the memory command generator 230 may have the same function as described with reference to FIG. 2.

The MAC command generator 540 may receive the command queue related to the MAC mode of the PIM device 400 from the command queue logic 210. The MAC command generator 540 may decode the command queue to generate and output the MAC commands MAC_CMDs. The MAC commands MAC_CMDs output from the MAC command generator 540 may be transmitted to the PIM device 400. The data read operation for the memory bank 411 of the PIM device 400 may be performed by the MAC commands MAC_CMDs output from the MAC command generator 540, and the MAC arithmetic operation of the MAC operator 420 may also be performed by the MAC commands MAC_CMDs output from the MAC command generator 540. The MAC commands MAC_CMDs and the MAC arithmetic operation of the PIM device 400 according to the MAC commands MAC_CMDs will be described in detail with reference to FIG. 21.

The address generator 550 may receive address information from the command queue logic 210. The address generator 550 may generate the bank selection signal BS for selecting a memory bank where, for example, the memory bank 411 represents multiple memory banks. The address generator 550 may transmit the bank selection signal BS to the PIM device 400. In addition, the address generator 550 may generate the row address ADDR_R and the column address ADDR_C for accessing a region (e.g., memory cells) in the memory bank 411 and may transmit the row address ADDR_R and the column address ADDR_C to the PIM device 400.

Figure 21:
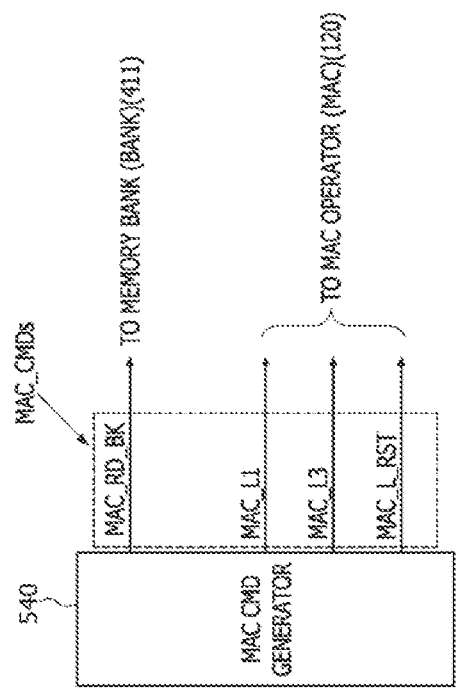
FIG. 21 illustrates MAC commands output from a MAC command generator of a PIM controller included in a PIM system according to a second embodiment of the present disclosure.

FIG. 21 illustrates the MAC commands MAC_CMDs output from the MAC command generator 540 included in the PIM system 1-2 according to the second embodiment of the present disclosure. As illustrated in FIG. 21, the MAC commands MAC_CMDs may include first to fourth MAC command signals. In an embodiment, the first MAC command signal may be a MAC read signal MAC_RD_BK, the second MAC command signal may be a MAC input latch signal MAC_L1, the third MAC command signal may be a MAC output latch signal MAC_L3, and the fourth MAC command signal may be a MAC latch reset signal MAC_L_RST.

The MAC read signal MAC_RD_BK may control an operation for reading the first data (e.g., the weight data) out of the memory bank 411 to transmit the first data to the MAC operator 420. The MAC input latch signal MAC_L1 may control an input latch operation of the weight data transmitted from the first memory bank 411 to the MAC operator 420. The MAC output latch signal MAC_L3 may control an output latch operation of the MAC result data generated by the MAC operator 420. And, the MAC latch reset signal MAC_L_RST may control an output operation of the MAC result data generated by the MAC operator 420 and a reset operation of an output latch included in the MAC operator 420.

The PIM system 1-2 according to the present embodiment may also be configured to perform the deterministic MAC arithmetic operation. Thus, the MAC commands MAC_CMDs transmitted from the PIM controller 500 to the PIM device 400 may be sequentially generated with fixed time intervals. Accordingly, the PIM controller 500 does not require any extra end signals of various operations executed for the MAC arithmetic operation to generate the MAC commands MAC_CMDs for controlling the MAC arithmetic operation. In an embodiment, latencies of the various operations executed by MAC commands MAC_CMDs for controlling the MAC arithmetic operation may be set to have fixed values in order to perform the deterministic MAC arithmetic operation. In such a case, the MAC commands MAC_CMDs may be sequentially output from the PIM controller 500 with fixed time intervals corresponding to the fixed latencies.

Figure 22:
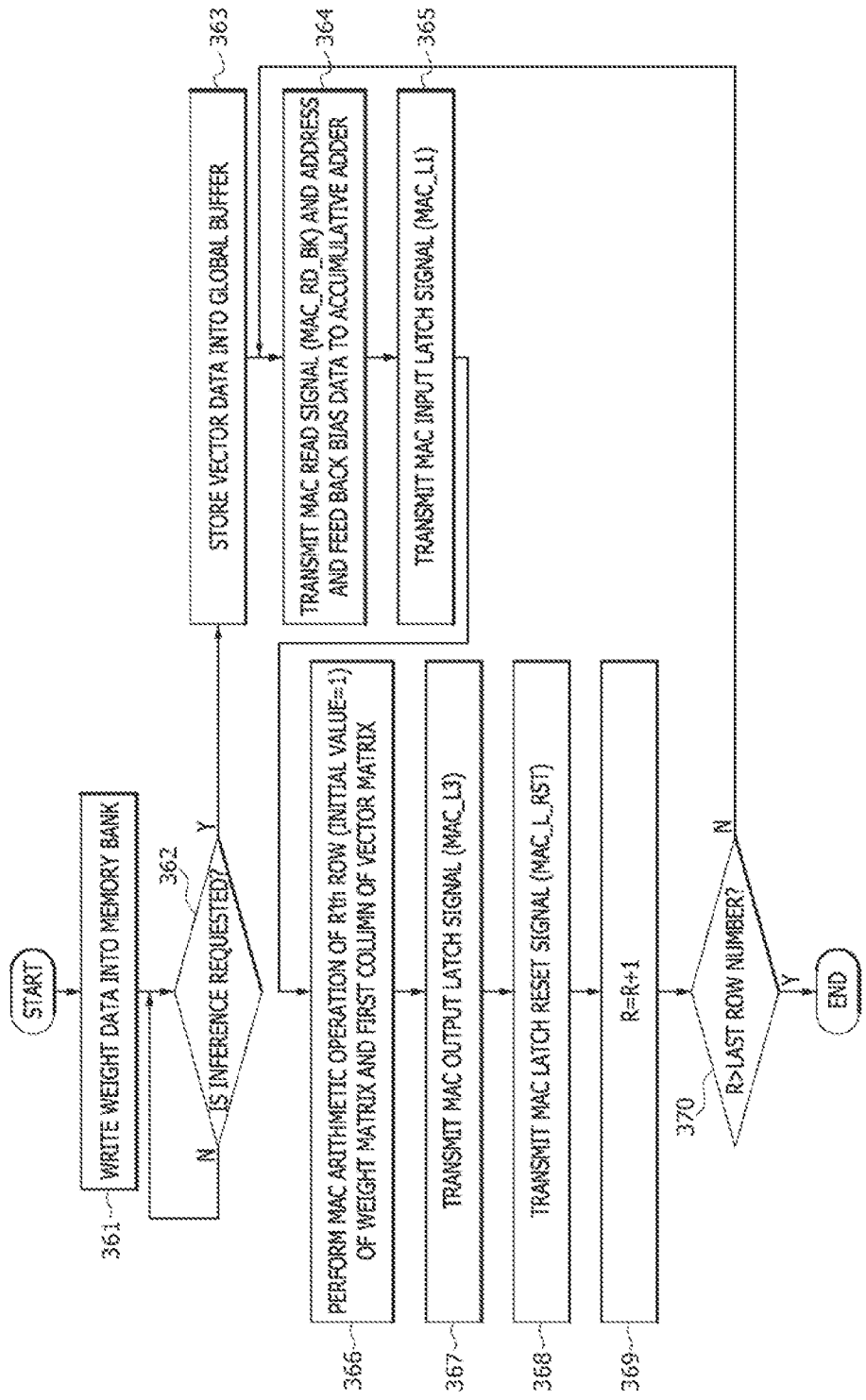
FIG. 22 is a flowchart illustrating processes of the MAC arithmetic operation illustrated in FIG. 5 in a PIM system according to a second embodiment of the present disclosure.

FIG. 22 is a flowchart illustrating processes of the MAC arithmetic operation described with reference to FIG. 5, which are performed in the PIM system 1-2 according to the second embodiment of the present disclosure. In addition, FIGS. 23 to 26 are block diagrams illustrating the processes of the MAC arithmetic operation illustrated in FIG. 5, which are performed in the PIM system 1-2 according to the second embodiment of the present disclosure. Referring to FIGS. 22 to 26, the first data (i.e., the weight data) may be written into the memory bank 411 at a step 361 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 5.

At a step 362, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, ..., and X7.0 constituting the vector matrix of FIG. 5. If the inference request signal is transmitted to the PIM controller 500 at the step 362, then the PIM controller 500 may write the vector data transmitted with the inference request signal into the global buffer 412 at a step 363. Accordingly, the vector data may be stored in the global buffer 412 of the PIM device 400.

Figure 23:
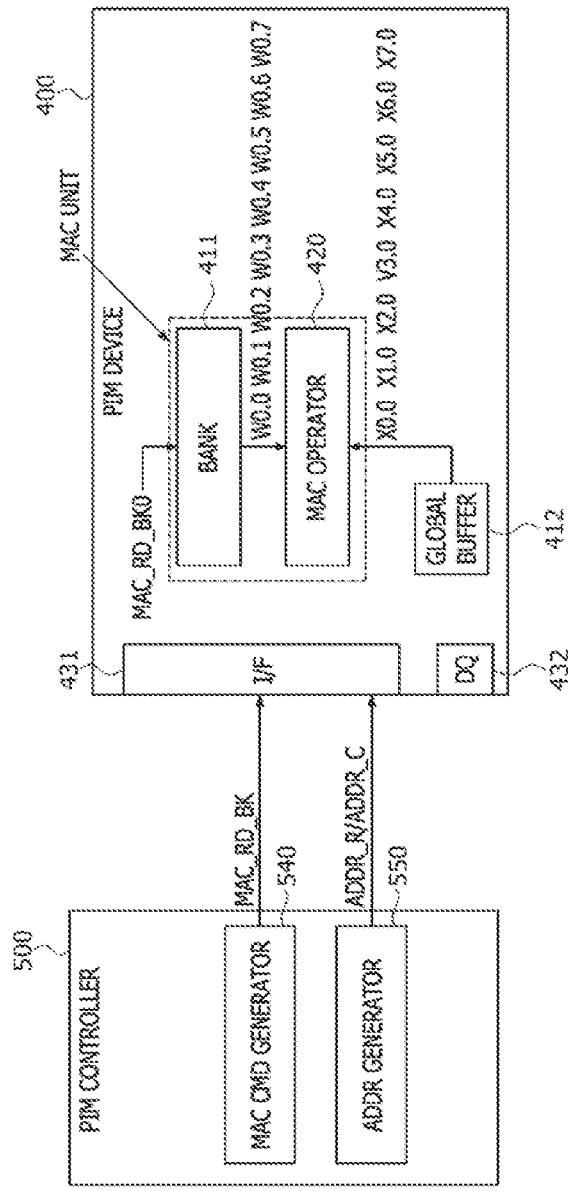
FIGS. 23 to 26 are block diagrams illustrating processes of the MAC arithmetic operation illustrated in FIG. 5 in a PIM system according to a second embodiment of the present disclosure.

At a step 364, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. Although not shown in the drawings, if a plurality of memory banks are disposed in the PIM device 400, the address generator 550 may transmit a bank selection signal for selecting the memory bank 411 among the plurality of memory banks as well as the row/column address ADDR_R/ADDR_C to the PIM device 400. The MAC read signal MAC_RD_BK input to the PIM device 400 may control the data read operation for the memory bank 411 of the PIM device 400. The memory bank 411 may output and transmit the elements W0.0, ..., and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, ..., and X7.0 stored in the global buffer 412 may also be transmitted to the MAC operator 420 in synchronization with a point in time when the weight data are transmitted from the memory bank 411 to the MAC operator 420. In order to transmit the vector data X0.0, ..., and X7.0 from the global buffer 412 to the MAC operator 420, a control signal for controlling the read operation for the global buffer 412 may be generated in synchronization with the MAC read signal MAC_RD_BK output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

Figure 24:
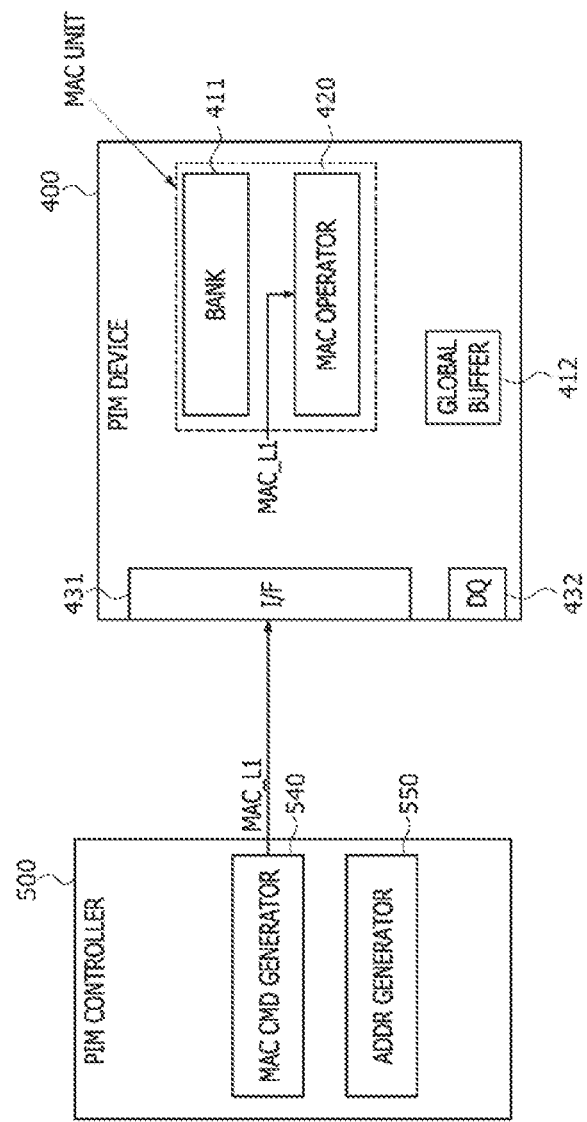

At a step 365, the MAC command generator 540 of the PIM controller 500 may generate and transmit the MAC input latch signal MAC_L1 to the PIM device 400, as illustrated in FIG. 24. The MAC input latch signal MAC_1 may control the input latch operation of the weight data and the vector data for the MAC operator 420 of the PIM device 400. The elements W0.0, ..., and W0.7 in the first row of the weight matrix and the elements X0.0, ..., and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, ..., and W0.7 in the first row of the weight matrix may be input to the first to eighth multipliers 122-11, respectively, and the elements X0.0, ..., and X7.0 in the first column of the vector matrix may also be input to the first to eighth multipliers 122-11, respectively.

At a step 366, the MAC circuit 122 of the MAC operator 420 may perform the MAC arithmetic operation of an $R^{th}$ row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, as described with reference to FIG. 4, each of the multipliers 122-11 of the multiplication logic circuit 122-1 may perform a multiplying calculation of the input data, and the result data of the multiplying calculation may be input to the addition logic circuit 122-2. The addition logic circuit 122-2 may receive output data from the multipliers 122-11 and may perform the adding calculation of the output data of the multipliers 122-11 to output the result data of the adding calculation. The output data of the addition logic circuit 122-2 may correspond to result data (i.e., MAC result data) of the MAC arithmetic operation of the first row included in the weight matrix and the column included in the vector matrix. Thus, the output data of the addition logic circuit 122-2 may correspond to the element MAC0.0 located at the first row of the '8×1' MAC result matrix having the eight elements of MAC0.0, ..., and MAC7.0 illustrated in FIG. 5. The output data MAC0.0 of the addition logic circuit 122-2 may be input to the output latch 123-1 disposed in the data output circuit 123 of the MAC operator 420, as described with reference to FIG. 4.

Figure 25:
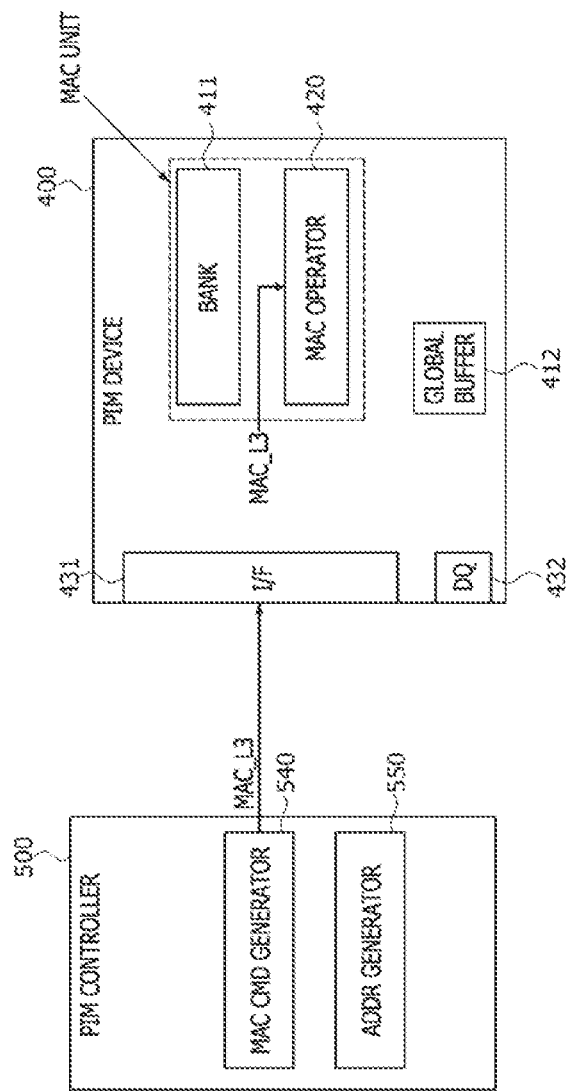

At a step 367, the MAC command generator 540 of the PIM controller 500 may generate and transmit the MAC output latch signal MAC_L3 to the PIM device 400, as illustrated in FIG. 25. The MAC output latch signal MAC_L3 may control the output latch operation of the MAC result data MAC0.0 performed by the MAC operator 420 of the PIM device 400. The MAC result data MAC0.0 transmitted from the MAC circuit 122 of the MAC operator 420 to the output latch 123-1 may be output from the output latch 123-1 by the output latch operation performed in synchronization with the MAC output latch signal MAC_L3, as described with reference to FIG. 4. The MAC result data MAC0.0 output from the output latch 123-1 may be input to the transfer gate 123-2 of the data output circuit 123.

Figure 26:
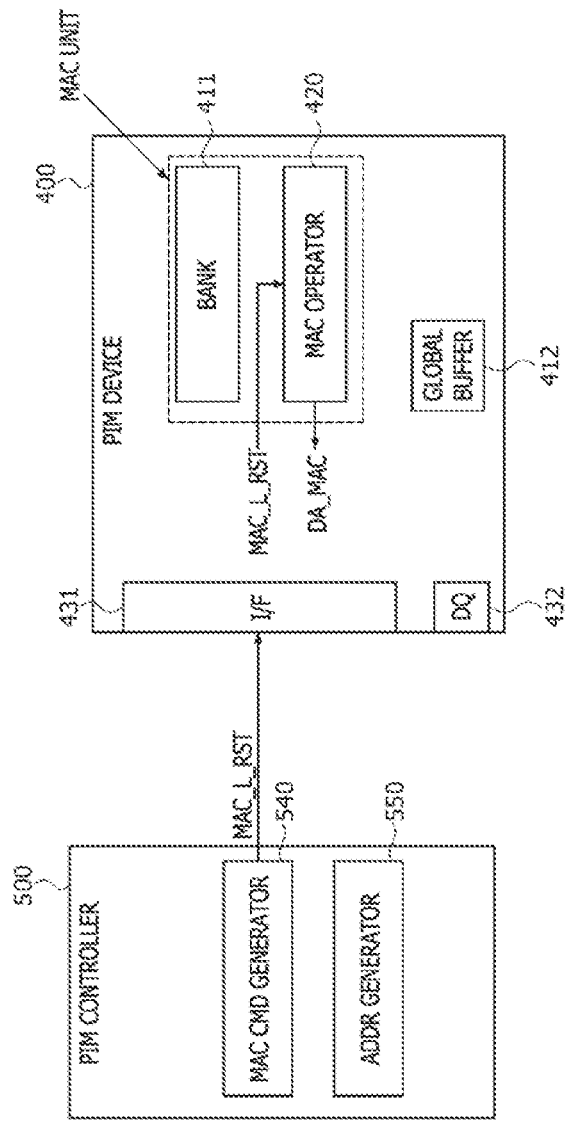

At a step 368, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the MAC result data MAC0.0 generated by the MAC operator 420 and a reset operation of the output latch 123-1 included in the MAC operator 420. As described with reference to FIG. 4, the transfer gate 123-2 receiving the MAC result data MAC0.0 from the output latch 123-1 of the MAC operator 420 may be synchronized with the MAC latch reset signal MAC_L_RST to output the MAC result data MAC0.0. In an embodiment, the MAC result data MAC0.0 output from the MAC operator 420 may be stored into the memory bank 411 through the BIO line in the PIM device 400.

At a step 369, the row number 'R' of the weight matrix for which the MAC arithmetic operation is performed may be increased by '1'. Because the MAC arithmetic operation for the first row among the first to eight rows of the weight matrix has been performed during the previous steps, the row number of the weight matrix may change from '1' to '2' at the step 369. At a step 370, whether the row number changed at the step 369 is greater than the row number of the last row (i.e., the eighth row) of the weight matrix may be determined. Because the row number of the weight matrix is changed to '2' at the step 370, a process of the MAC arithmetic operation may be fed back to the step 364.

If the process of the MAC arithmetic operation is fed back to the step 364 from the step 370, the same processes as described with reference to the steps 364 to 370 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 364 from the step 370, the processes from the step 364 to the step 370 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 369, the MAC arithmetic operation may terminate because the row number of '9' is greater than the last row number of '8' at the step 370.

Figure 27:
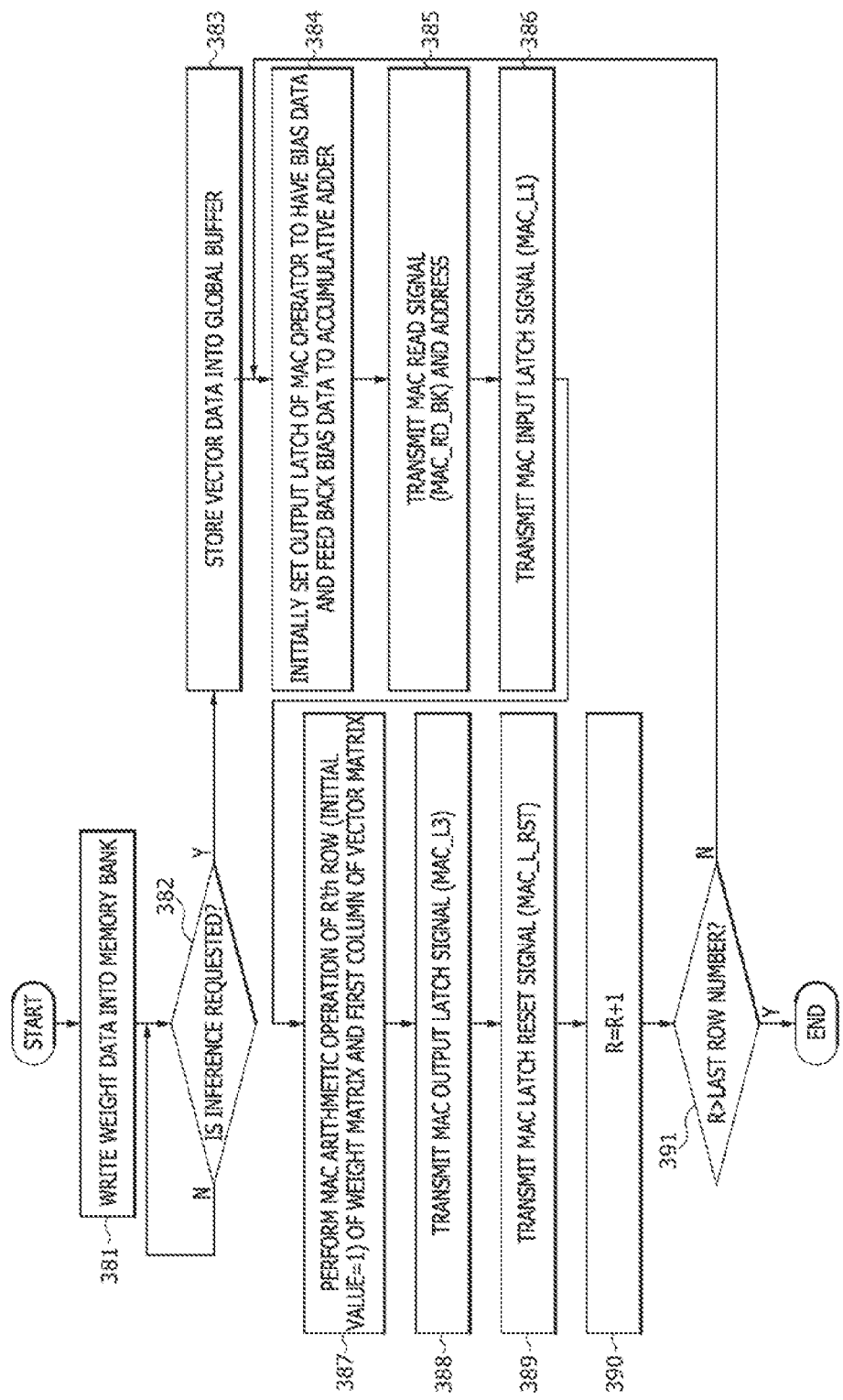
FIG. 27 is a flowchart illustrating processes of the MAC arithmetic operation illustrated in FIG. 14 in a PIM system according to a second embodiment of the present disclosure.

FIG. 27 is a flowchart illustrating processes of the MAC arithmetic operation described with reference to FIG. 14, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-1 illustrated in FIG. 16. Referring to FIGS. 20 and 27, the first data (i.e., the weight data) may be written into the memory bank 411 at a step 381 to perform the MAC arithmetic operation. Thus, the weight data may be stored in the memory bank 411 of the PIM device 400. In the present embodiment, it may be assumed that the weight data are the elements W0.0, . . . , and W7.7 constituting the weight matrix of FIG. 14.

At a step 382, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 14. If the inference request signal is transmitted from the PIM controller 500 at the step 382, then the PIM controller 500 may write the vector data transmitted with the inference request signal into the global buffer 412 at a step 383. Accordingly, the vector data may be stored in the global buffer 412 of the PIM device 400.

At a step 384, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 14. That is, as illustrated in FIG. 16, the output latch 123-1 of the data output circuit 123-A included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 output from the output latch 123-1 may be input to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 output from the adder 122-21C disposed at the last stage to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 385, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK input to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 386, the MAC command generator 540 of the PIM controller 500 may generate and transmit the MAC input latch signal MAC_L1 to the PIM device 400, as illustrated in FIG. 24. The MAC input latch signal MAC_1 may control the input latch operation of the weight data and the vector data for the MAC operator 420 of the PIM device 400. The elements W0.0, ..., and W0.7 in the first row of the weight matrix and the elements X0.0, ..., and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, ..., and W0.7 in the first row of the weight matrix may be input to the first to eighth multipliers 122-11, respectively, and the elements X0.0, ..., and X7.0 in the first column of the vector matrix may also be input to the first to eighth multipliers 122-11, respectively.

At a step 387, the MAC circuit 122 of the MAC operator 420 may perform the MAC arithmetic operation of an R row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the input data, and the result data of the multiplying calculation may be input to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., MAC result data) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be input to the output latch 123-1 disposed in the data output circuit 123-A of the MAC operator 420.

At a step 388, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 output from the output latch 123-1 may be input to the transfer gate 123-2 of the data output circuit 123-A.

At a step 389, the MAC command generator 540 of the PIM controller 500 may generate and transmit the MAC latch reset signal MAC_L_RST to the PIM device 400, as illustrated in FIG. 26. The MAC latch reset signal MAC_L_RST may control an output operation of the biased result data Y0.0 generated by the MAC operator 420 and a reset operation of the output latch 123-1 included in the MAC operator 420. The transfer gate 123-2 receiving the biased result data Y0.0 from the output latch 123-1 of the MAC operator 420 may be synchronized with the MAC latch reset signal MAC_L_RST to output the biased result data Y0.0. In an embodiment, the biased result data Y0.0 output from the MAC operator 120 may be stored into the memory bank 411 through the BIO line in the PIM device 400.

At a step 390, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 390. At a step 391, whether the row number changed at the step 390 is greater than the row number of the last row (i.e., the eighth row) of the weight matrix may be determined. Because the row number of the weight matrix is changed to '2' at the step 390, a process of the MAC arithmetic operation may be fed back to the step 384.

If the process of the MAC arithmetic operation is fed back to the step 384 at the step 391, the same processes as described with reference to the steps 384 to 391 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix. If the process of the MAC arithmetic operation is fed back to the step 384 at the step 391, then the processes from the step 384 to the step 390 may be iteratively performed until the MAC arithmetic operation is performed for all of the rows of the weight matrix with the vector matrix. If the MAC arithmetic operation for the eighth row of the weight matrix terminates and the row number of the weight matrix changes from '8' to '9' at the step 390, then the MAC arithmetic operation may terminate because the row number of '9' is greater than the last row number of '8' at the step 391.

Figure 28:
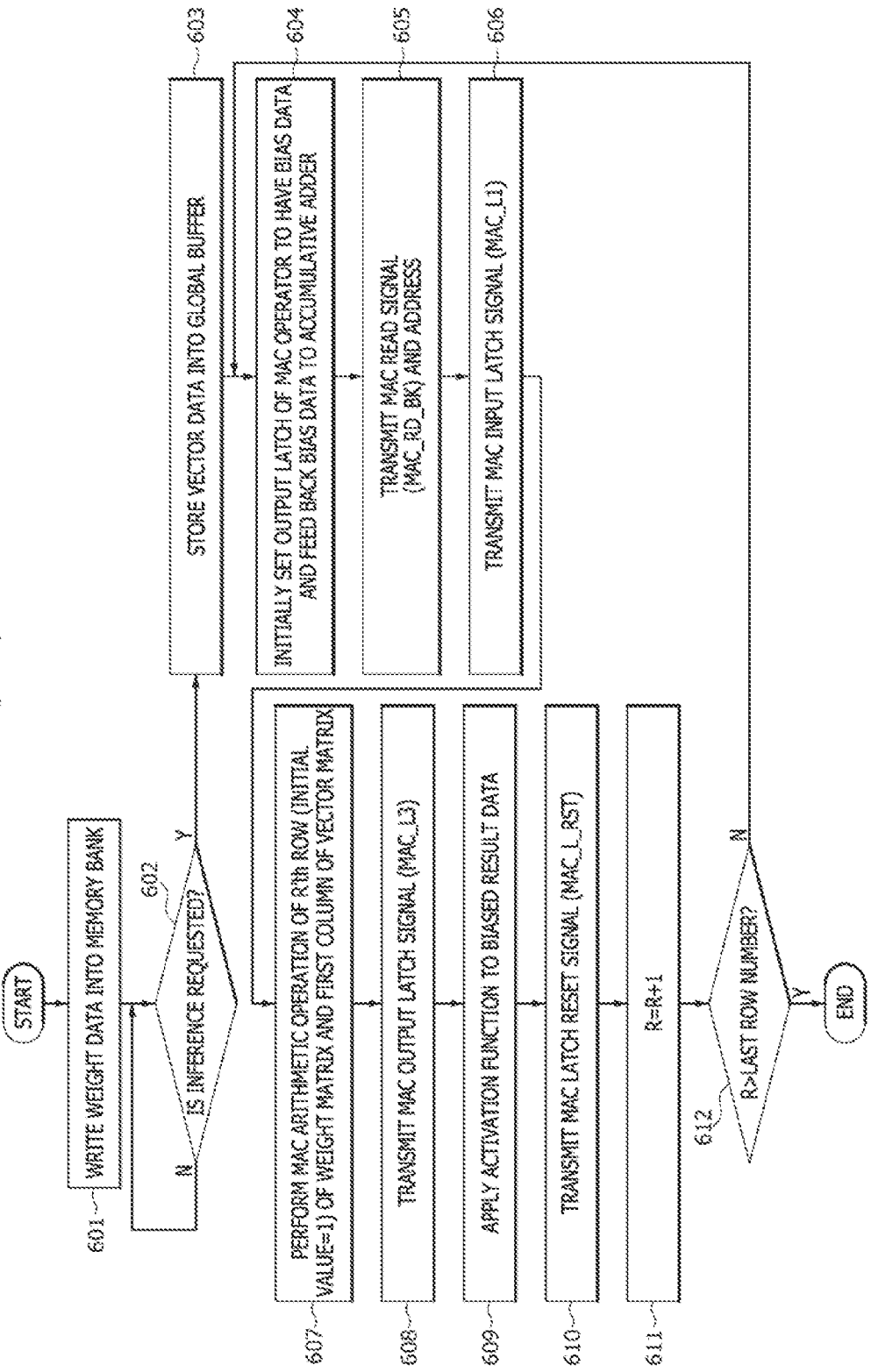
FIG. 28 is a flowchart illustrating processes of the MAC arithmetic operation illustrated in FIG. 17 in a PIM system according to a second embodiment of the present disclosure.

FIG. 28 is a flowchart illustrating processes of the MAC arithmetic operation described with reference to FIG. 17, which are performed in the PIM system 1-2 according to the second embodiment of the present disclosure. In order to perform the MAC arithmetic operation according to the present embodiment, the MAC operator 420 of the PIM device 400 may have the same configuration as the MAC operator 120-2 illustrated in FIG. 19. Referring to FIGS. 19 and 28, the first data (i.e., the weight data) may be written into the memory bank 411 at a step 601 to perform the MAC arithmetic operation. Thus, the weight data may be stored in the memory bank 411 of the PIM device 400. In the present embodiment, it may be assumed that the weight data are the elements W0.0, ..., and W7.7 constituting the weight matrix of FIG. 17.

At a step 602, whether an inference is requested may be determined. An inference request signal may be transmitted from an external device located outside of the PIM system 1-2 to the PIM controller 500 of the PIM system 1-2. In an embodiment, if no inference request signal is transmitted to the PIM controller 500, the PIM system 1-2 may be in a standby mode until the inference request signal is transmitted to the PIM controller 500. Alternatively, if no inference request signal is transmitted to the PIM controller 500, the PIM system 1-2 may perform operations (e.g., data read/write operations) other than the MAC arithmetic operation in the memory mode until the inference request signal is transmitted to the PIM controller 500. In the present embodiment, it may be assumed that the second data (i.e., the vector data) are transmitted together with the inference request signal. In addition, it may be assumed that the vector data are the elements X0.0, . . . , and X7.0 constituting the vector matrix of FIG. 17. If the inference request signal is transmitted to the PIM controller 500 at the step 602, then the PIM controller 500 may write the vector data transmitted with the inference request signal into the global buffer 412 at a step 603. Accordingly, the vector data may be stored in the global buffer 412 of the PIM device 400.

At a step 604, an output latch of a MAC operator 420 may be initially set to have bias data and the initially set bias data may be fed back to an accumulative adder of the MAC operator 420. This process is executed to perform the matrix adding calculation of the MAC result matrix and the bias matrix, which is described with reference to FIG. 17. That is, as described with reference to FIG. 19, the output latch 123-1 of the data output circuit 123-B included in the MAC operator 420 may be initially set to have the bias data of the bias matrix. Because the matrix multiplying calculation is executed for the first row of the weight matrix, the element B0.0 located at first row of the bias matrix may be initially set as the bias data in the output latch 123-1. The output latch 123-1 may output the bias data B0.0, and the bias data B0.0 output from the output latch 123-1 may be input to the accumulative adder 122-21D of the addition logic circuit 122-2 included in the MAC operator 420.

In an embodiment, in order to output the bias data B0.0 out of the output latch 123-1 and to feed back the bias data B0.0 to the accumulative adder 122-21D, the MAC command generator 540 of the PIM controller 500 may transmit the MAC output latch signal MAC_L3 to the MAC operator 420 of the PIM device 400. When a subsequent MAC arithmetic operation is performed, the accumulative adder 122-21D of the MAC operator 420 may add the MAC result data MAC0.0 output from the adder 122-21C disposed at the last stage of the addition logic circuit 122-2 to the bias data B0.0 which is fed back from the output latch 123-1 to generate the biased result data Y0.0 and may output the biased result data Y0.0 to the output latch 123-1. The biased result data Y0.0 may be output from the output latch 123-1 in synchronization with the MAC output latch signal MAC_L3 transmitted in a subsequent process.

At a step 605, the MAC command generator 540 of the PIM controller 500 may generate and transmit the MAC read signal MAC_RD_BK to the PIM device 400, as illustrated in FIG. 23. In such a case, the address generator 550 of the PIM controller 500 may generate and transmit the row/column address ADDR_R/ADDR_C to the PIM device 400. The MAC read signal MAC_RD_BK input to the PIM device 400 may control the data read operation for the memory bank 411 of the PIM device 400. The memory bank 411 may output and transmit the elements W0.0, . . . , and W0.7 in the first row of the weight matrix of the weight data stored in a region of the memory bank 411, which is designated by the row/column address ADDR_R/ADDR_C, to the MAC operator 420 in response to the MAC read signal MAC_RD_BK. In an embodiment, the data transmission from the memory bank 411 to the MAC operator 420 may be executed through a BIO line which is provided specifically for data transmission between the memory bank 411 and the MAC operator 420.

Meanwhile, the vector data X0.0, . . . , and X7.0 stored in the global buffer 412 may also be transmitted to the MAC operator 420 in synchronization with a point in time when the weight data are transmitted from the memory bank 411 to the MAC operator 420. In order to transmit the vector data X0.0, . . . , and X7.0 from the global buffer 412 to the MAC operator 420, a control signal for controlling the read operation for the global buffer 412 may be generated in synchronization with the MAC read signal MAC_RD_BK output from the MAC command generator 540 of the PIM controller 500. The data transmission between the global buffer 412 and the MAC operator 420 may be executed through a GIO line. Thus, the weight data and the vector data may be independently transmitted to the MAC operator 420 through two separate transmission lines, respectively. In an embodiment, the weight data and the vector data may be simultaneously transmitted to the MAC operator 420 through the BIO line and the GIO line, respectively.

At a step 606, the MAC command generator 540 of the PIM controller 500 may generate and transmit the MAC input latch signal MAC_L1 to the PIM device 400, as described with reference to FIG. 24. The MAC input latch signal MAC_1 may control the input latch operation of the weight data and the vector data for the MAC operator 420 of the PIM device 400. The elements W0.0, . . . , and W0.7 in the first row of the weight matrix and the elements X0.0, . . . , and X7.0 in the first column of the vector matrix may be input to the MAC circuit 122 of the MAC operator 420 by the input latch operation. The MAC circuit 122 may include the plurality of multipliers (e.g., the eight multipliers 122-11), the number of which is equal to the number of columns of the weight matrix and the number of rows of the vector matrix. The elements W0.0, . . . , and W0.7 in the first row of the weight matrix may be input to the first to eighth multipliers 122-11, respectively, and the elements X0.0, . . . , and X7.0 in the first column of the vector matrix may also be input to the first to eighth multipliers 122-11, respectively.

At a step 607, the MAC circuit 122 of the MAC operator 420 may perform the MAC arithmetic operation of an R row of the weight matrix and the first column of the vector matrix, which are input to the MAC circuit 122. An initial value of 'R' may be set as '1'. Thus, the MAC arithmetic operation of the first row of the weight matrix and the first column of the vector matrix may be performed a first time. Specifically, each of the multipliers 122-11 of the multiplication logic circuit 122-1 may perform a multiplying calculation of the input data, and the result data of the multiplying calculation may be input to the addition logic circuit 122-2. The addition logic circuit 122-2 may receive output data of the multipliers 122-11 and may perform the adding calculation of the output data of the multipliers 122-11 to output the result data of the adding calculation to the accumulative adder 122-21D. The output data of the adder 122-21C included in the addition logic circuit 122-2 may correspond to result data (i.e., the MAC result data MAC0.0) of the MAC arithmetic operation of the first row included in the weight matrix and the column included in the vector matrix. The accumulative adder 122-21D may add the output data MAC0.0 of the adder 122-21C to the bias data B0.0 fed back from the output latch 123-1 and may output the result data of the adding calculation. The output data (i.e., the biased result data Y0.0) of the accumulative adder 122-21D may be input to the output latch 123-1 disposed in the data output circuit 123-A of the MAC operator 420.

At a step 608, the MAC command generator 540 of the PIM controller 500 may generate and transmit the MAC output latch signal MAC_L3 to the PIM device 400, as described with reference to FIG. 25. The MAC output latch signal MAC_L3 may control the output latch operation for the output latch 123-1 of the MAC operator 420 included in the PIM device 400. The output latch 123-1 of the MAC operator 420 may output the biased result data Y0.0 according to the output latch operation performed in synchronization with the MAC output latch signal MAC_L3. The biased result data Y0.0 output from the output latch 123-1 may be input to the activation function logic circuit 123-5, which is illustrated in FIG. 19. At a step 610, the activation function logic circuit 123-5 may apply an activation function to the biased result data Y0.0 to generate a final output value, and the final output value may be input to the transfer gate (123-2 of FIG. 4).

At a step 610, the MAC command generator 540 of the PIM controller 500 may generate and transmit the MAC latch reset signal MAC_L_RST to the PIM device 400, as described with reference to FIG. 26. The MAC latch reset signal MAC_L_RST may control an output operation of the final output value generated by the MAC operator 420 and a reset operation of the output latch 123-1 included in the MAC operator 420. The transfer gate 123-2 receiving the final output value from the activation function logic circuit 123-5 of the data output circuit 123-B included in the MAC operator 420 may be synchronized with the MAC latch reset signal MAC_L_RST to output the final output value. In an embodiment, the final output value output from the MAC operator 420 may be stored into the memory bank 411 through the BIO line in the PIM device 400.

At a step 611, the row number 'R' of the weight matrix for which the MAC arithmetic operation is performed may be increased by '1'. Because the MAC arithmetic operation for the first row among the first to eight rows of the weight matrix has been performed at the previous steps, the row number of the weight matrix may change from '1' to '2' at the step 611. At a step 612, whether the row number changed at the step 611 is greater than the row number of the last row (i.e., the eighth row) of the weight matrix may be determined. Because the row number of the weight matrix is changed to '2' at the step 611, a process of the MAC arithmetic operation may be fed back to the step 604.

If the process of the MAC arithmetic operation is fed back to the step 604 from the step 612, the same processes as described with reference to the steps 604 to 612 may be executed again for the increased row number of the weight matrix. That is, as the row number of the weight matrix changes from '1' to '2', the MAC arithmetic operation may be performed for the second row of the weight matrix instead of the first row of the weight matrix with the vector matrix to generate the MAC result data (corresponding to the element MAC1.0 located in the second row of the MAC result matrix) and the bias data (corresponding to the element B1.0 located in the second row of the bias matrix). If the process of the MAC arithmetic operation is fed back to the step 604 from the step 612, the processes from the step 604 to the step 612 may be iteratively performed until the MAC arithmetic operation is performed for all of the rows (i.e., first to eighth rows) of the weight matrix with the vector matrix. If the MAC arithmetic operation for the eighth row of the weight matrix terminates and the row number of the weight matrix changes from '8' to '9' at the step 611, the MAC arithmetic operation may terminate because the row number of '9' is greater than the last row number of '8' at the step 612.

Figure 29:
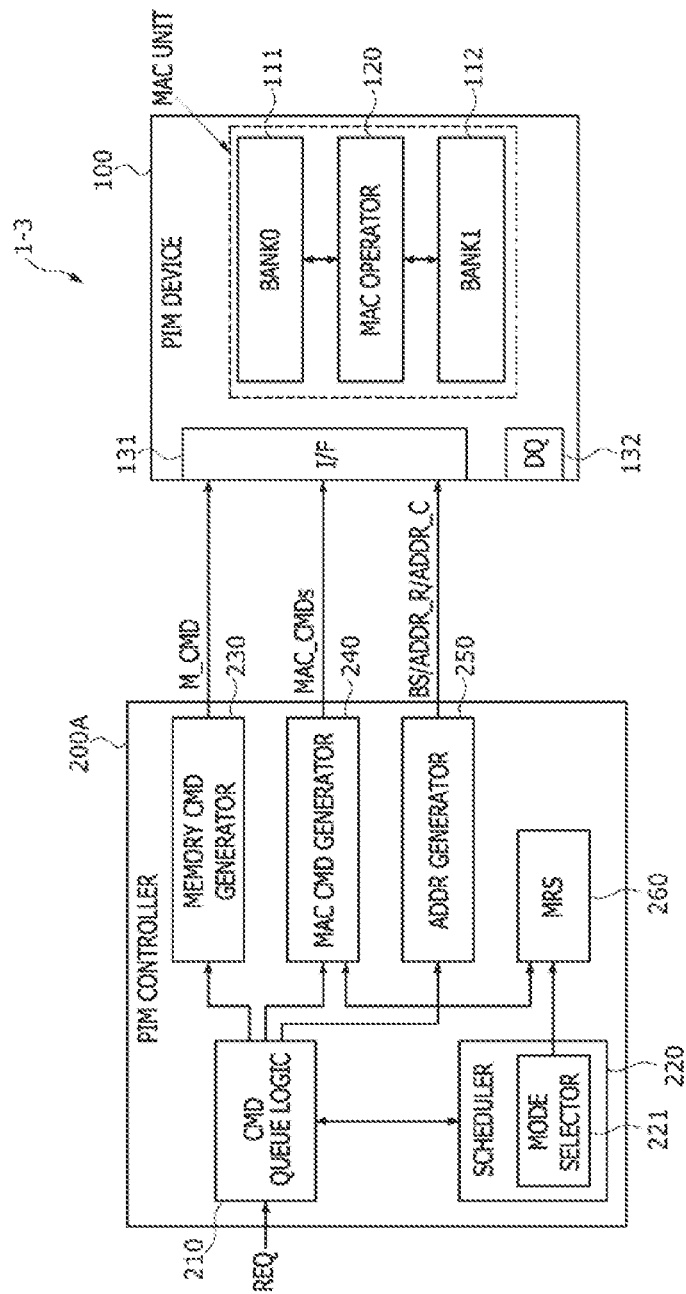
FIG. 29 is a block diagram illustrating a PIM system according to yet another embodiment of the present disclosure.

FIG. 29 is a block diagram illustrating a PIM system 1-3 according to a third embodiment of the present disclosure. As illustrated in FIG. 29, the PIM system 1-3 may have substantially the same configuration as the PIM system 1-1 illustrated in FIG. 2 except that a PIM controller 200A of the PIM system 1-3 further includes a mode register set (MRS) 260 as compared with the PIM controller 200 of the PIM system 1-1. Thus, the same explanation as described with reference to FIG. 2 will be omitted hereinafter. The mode register set 260 in the PIM controller 200A may receive an MRS signal instructing arrangement of various signals necessary for the MAC arithmetic operation of the PIM system 1-3. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 240. For an embodiment, the MRS 260 represents a MRS circuit.

In an embodiment, the MRS signal may include timing information on when the MAC commands MAC_CMDs are generated. In such a case, the deterministic operation of the PIM system 1-3 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the second memory bank 112 of the PIM device 100 by the inference request signal transmitted from an external device to the PIM controller 200A. Alternatively, the generation of the MRS signal in the MRS 260 may be executed after the vector data are stored in the second memory bank 112 of the PIM device 100 by the inference request signal transmitted from an external device to the PIM controller 200A.

Figure 30:
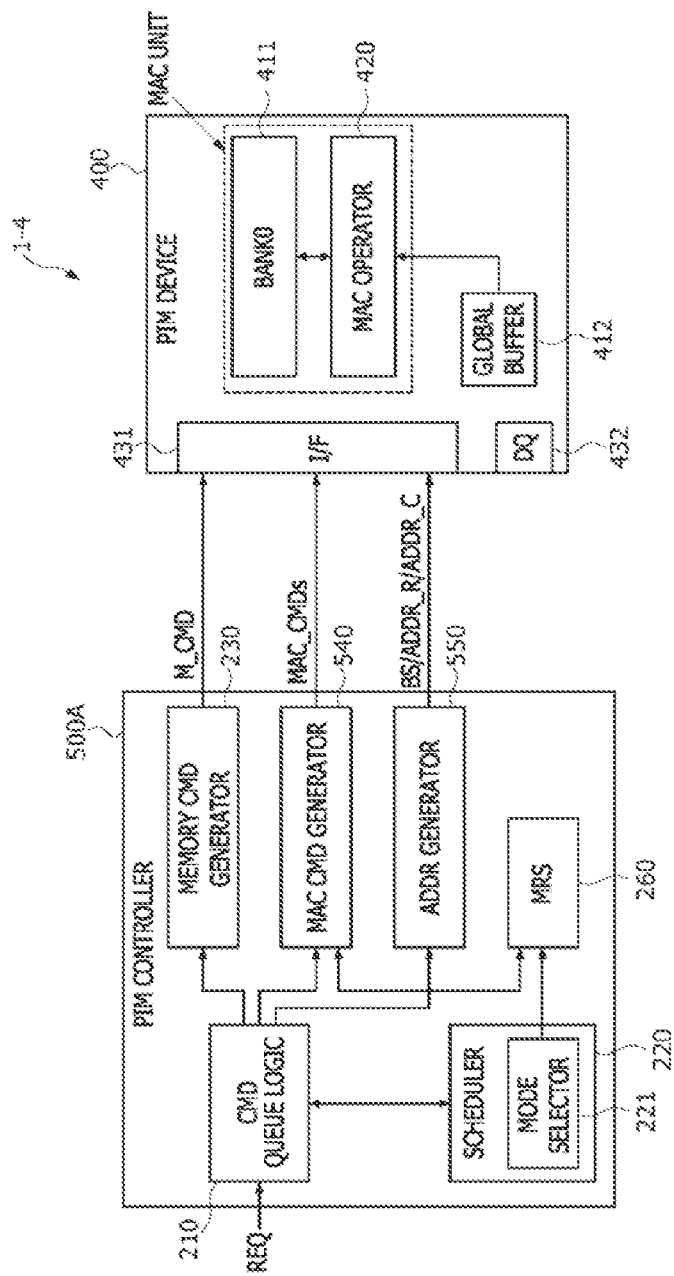
FIG. 30 is a block diagram illustrating a PIM system according to still another embodiment of the present disclosure.

FIG. 30 is a block diagram illustrating a PIM system 1-4 according to a fourth embodiment of the present disclosure. As illustrated in FIG. 30, the PIM system 1-4 may have substantially the same configuration as the PIM system 1-2 illustrated in FIG. 20 except that a PIM controller 500A of the PIM system 1-4 further includes the mode register set (MRS) 260 as compared with the PIM controller 500 of the PIM system 1-2. Thus, the same explanation as described with reference to FIG. 20 will be omitted hereinafter. The mode register set 260 in the PIM controller 500A may receive an MRS signal instructing arrangement of various signals necessary for the MAC arithmetic operation of the PIM system 1-4. In an embodiment, the mode register set 260 may receive the MRS signal from the mode selector 221 included in the scheduler 220. However, in another embodiment, the MRS signal may be provided by an extra logic circuit other than the mode selector 221. The mode register set 260 receiving the MRS signal may transmit the MRS signal to the MAC command generator 540.

In an embodiment, the MRS signal may include timing information on when the MAC commands MAC_CMDs are generated. In such a case, the deterministic operation of the PIM system 1-4 may be performed by the MRS signal provided by the MRS 260. In another embodiment, the MRS signal may include information on the timing related to an interval between the MAC modes or information on a mode change between the MAC mode and the memory mode. In an embodiment, generation of the MRS signal in the MRS 260 may be executed before the vector data are stored in the global buffer 412 of the PIM device 400 by the inference request signal transmitted from an external device to the PIM controller 500A. Alternatively, the generation of the MRS signal in the MRS 260 may be executed after the vector data are stored in the global buffer 412 of the PIM device 400 by the inference request signal transmitted from an external device to the PIM controller 500A.

Figure 31:
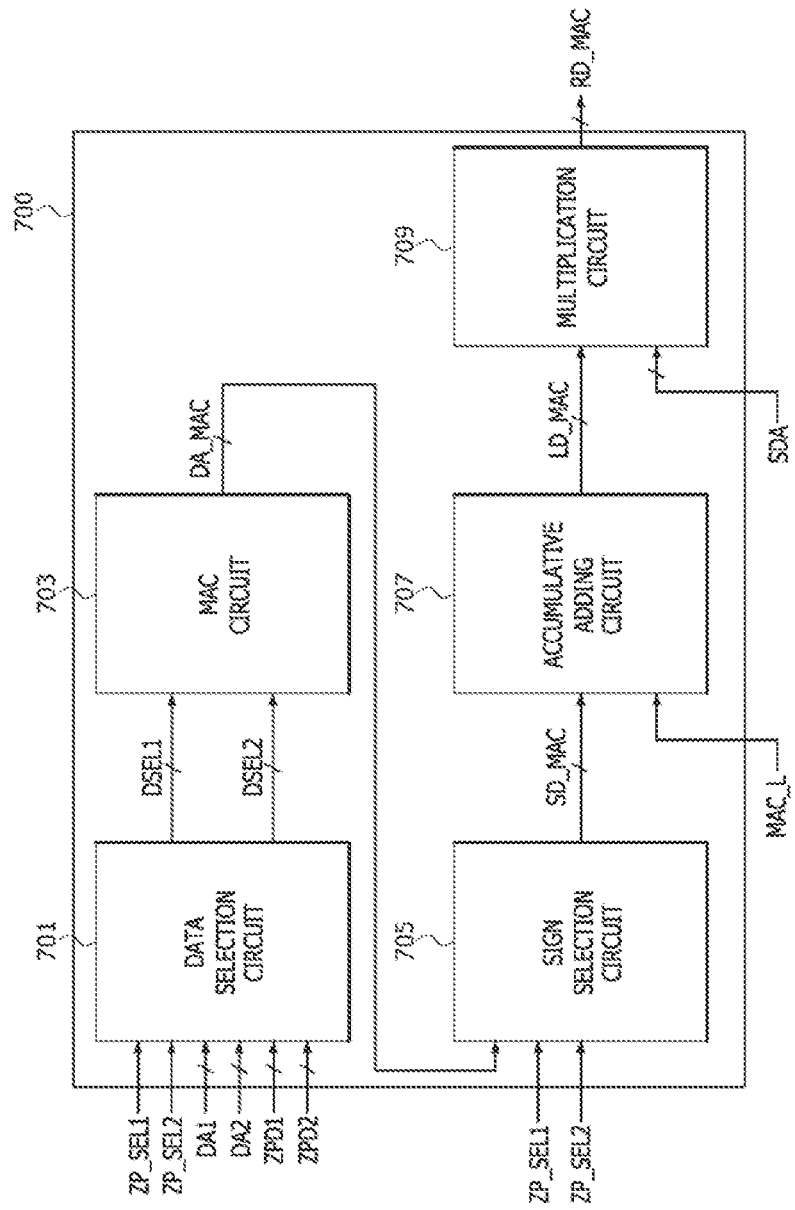
FIG. 31 is a block diagram illustrating a configuration of a PIM device according to an embodiment of the present disclosure.

As illustrated in FIG. 31, a PIM device 700 according to an embodiment of the present disclosure may include a data selection circuit 701, a MAC circuit 703, a sign selection circuit 705, an accumulative adding circuit 707, and a multiplication circuit 709.

The data selection circuit 701 may generate first selection data DSEL1 and second selection data DSEL2 from first data DA1 (also, referred to as first input data), second data DA2 (also, referred to as second input data), first zero-point data ZPD1, and second zero-point data ZPD2 based on a first zero-point selection signal ZP_SEL1 and a second zero-point selection signal ZP_SEL2. The first zero-point selection signal ZP_SEL1 may be activated to input the first zero-point data ZPD1 applied to the first data DA1 to the data selection circuit 701 in a quantization scheme. The second zero-point selection signal ZP_SEL2 may be activated to input the second zero-point data ZPD2 applied to the second data DA2 to the data selection circuit 701 in the quantization scheme. The quantization scheme may be implemented to convert the first data DA1 and the second data DA2, which are set as quantized integers, into real numbers. The first data DA1 may be set to have a quantized integer of weight data. The second data DA2 may be set to have a quantized integer of vector data. Each of the first zero-point data ZPD1 and the second zero-point data ZPD2 may be set to have a zero-point value corresponding to a real number of zero in the quantization scheme. The zero-point value may be set as a quantized integer. The first zero-point data ZPD1 may be subtracted from the first data DA1 in the quantization scheme. The second zero-point data ZPD2 may be subtracted from the second data DA2 in the quantization scheme. In some embodiments, the first zero-point selection signal ZP_SEL1 and the second zero-point selection signal ZP_SEL2 may be generated by decoding a command in the PIM device 700. Alternatively, the first zero-point selection signal ZP_SEL1 and the second zero-point selection signal ZP_SEL2 may be directly provided by an external device coupled to the PIM device 700. In some embodiments, the first zero-point data ZPD1 and second zero-point data ZPD2 may be directly provided by an external device coupled to the PIM device 700. Alternatively, the first zero-point data ZPD1 and second zero-point data ZPD2 may be provided by a storage region in the PIM device 700.

The data selection circuit 701 may select and output the first zero-point data ZPD1 as the first selection data DSEL1 when the first zero-point selection signal ZP_SEL1 is activated. The data selection circuit 701 may select and output the second zero-point data ZPD2 as the second selection data DSEL2 when the second zero-point selection signal ZP_SEL2 is activated. The data selection circuit 701 may select and output the first data DA1 as the first selection data DSEL1 when the first zero-point selection signal ZP_SEL1 is inactivated. The data selection circuit 701 may select and output the second data DA2 as the second selection data DSEL2 when the second zero-point selection signal ZP_SEL2 is inactivated.

The MAC circuit 703 may receive the first selection data DSEL1 and the second selection data DSEL2 from the data selection circuit 701. The MAC circuit 703 may perform a MAC arithmetic operation for the first selection data DSEL1 and the second selection data DSEL2 to generate MAC result data DA_MAC. The MAC arithmetic operation of the MAC circuit 703 may be performed in the same way as the MAC arithmetic operation of the MAC circuit 122 illustrated in FIG. 4. Thus, detailed descriptions of the MAC arithmetic operation performed by the MAC circuit 703 will be omitted hereinafter.

The sign selection circuit 705 may generate MAC sign data SD_MAC from the MAC result data DA_MAC based on the first zero-point selection signal ZP_SEL1 and the second zero-point selection signal ZP_SEL2. The sign selection circuit 705 may convert a sign of the MAC result data DA_MAC to output the MAC result data DA_MAC having the converted signal as the MAC sign data SD_MAC when one of the first zero-point selection signal ZP_SEL1 and the second zero-point selection signal ZP_SEL2 is activated in the quantization scheme. The sign selection circuit 705 may output the MAC result data DA_MAC as the MAC sign data SD_MAC when both of the first zero-point selection signal ZP_SEL1 and the second zero-point selection signal ZP_SEL2 are inactivated. The sign selection circuit 705 may output the MAC result data DA_MAC as the MAC sign data SD_MAC when both of the first zero-point selection signal ZP_SEL1 and the second zero-point selection signal ZP_SEL2 are activated.

The accumulative adding circuit 707 may receive the MAC sign data SD_MAC from the sign selection circuit 705. The accumulative adding circuit 707 may generate MAC latch data LD_MAC from the MAC sign data SD_MAC based on a MAC output latch signal MAC_L. The accumulative adding circuit 707 may add the MAC sign data SD_MAC to the MAC latch data LD_MAC to generate MAC addition data (AD_MAC of FIG. 34). The accumulative adding circuit 707 may output the MAC addition data AD_MAC as the MAC latch data LD_MAC when the MAC output latch signal MAC_L is activated. The accumulative adding circuit 707 may accumulatively add the MAC sign data SD_MAC to generate the MAC latch data LD_MAC whenever the MAC output latch signal MAC_L is activated. The MAC output latch signal MAC_L may be generated in the same way as the MAC output latch signal MAC_L3 included in the MAC commands MAC_CMDs described with reference to FIG. 3.

The multiplication circuit 709 may receive the MAC latch data LD_MAC from the accumulative adding circuit 707. The multiplication circuit 709 may multiply the MAC latch data LD_MAC by a scale value, which is set based on scale data SDA, to generate MAC real data RD_MAC. The scale value may be set as a ratio of a range of real numbers to a range of quantized integers in the quantization scheme. For example, in the quantization scheme converting the quantized integers within a range of 1 to 128 Into the real numbers within a range of −1 to +1, the scale value may be set as "(2/128)=(1/64)" because the scale value is calculated by a formula of "a range of real numbers/a range of quantized integers". In the quantization scheme, the MAC real data RD_MAC may be set to have a real number. Each of various logic level combinations of bits included in the MAC real data RD_MAC may correspond to a real number. The scale value may be directly provided by an external device coupled to the PIM device 700 or may be provided by a storage region in the PIM device 700.

As illustrated in FIG. 32, the data selection circuit 701 may include a first selector 711 and a second selector 713.

The first selector 711 may generate the first selection data DSEL1 from the first data DA1 and the first zero-point data ZPD1 based on the first zero-point selection signal ZP_SEL1. The first selector 711 may select and output the first zero-point data ZPD1 as the first selection data DSEL1 when the first zero-point selection signal ZP_SEL1 is activated in the quantization scheme. The first selector 711 may select and output the first data DA1 as the first selection data DSEL1 when the first zero-point selection signal ZP_SEL1 is inactivated in the quantization scheme.

The second selector 713 may generate the second selection data DSEL2 from the second data DA2 and the second zero-point data ZPD2 based on the second zero-point selection signal ZP_SEL2. The second selector 713 may select and output the second zero-point data ZPD2 as the second selection data DSEL2 when the second zero-point selection signal ZP_SEL2 is activated in the quantization scheme. The second selector 713 may select and output the second data DA2 as the second selection data DSEL2 when the second zero-point selection signal ZP_SEL2 is inactivated in the quantization scheme.

Figure 33:
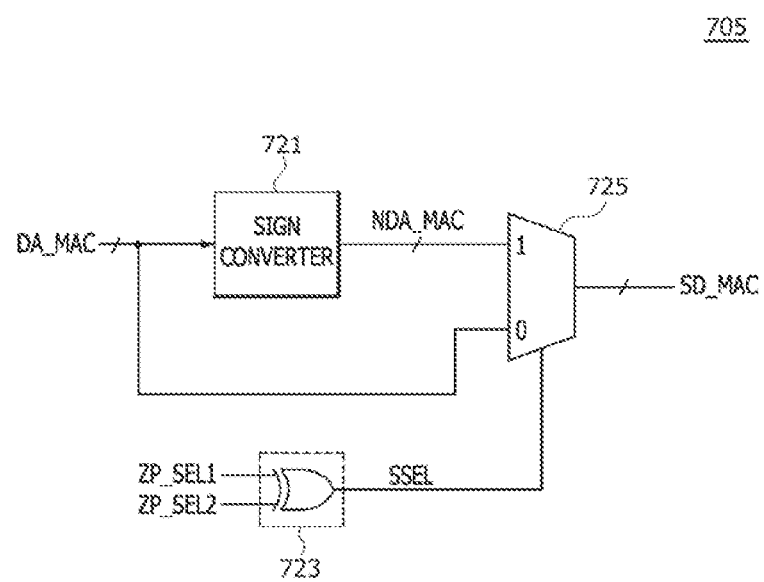
FIG. 33 illustrates a configuration of a sign selection circuit included in the PIM device illustrated in FIG. 31.

As illustrated in FIG. 33, the sign selection circuit 705 may include a sign converter 721, a synthesis selection signal generation circuit 723, and a sign data selector 725.

The sign converter 721 may generate sign conversion data NDA_MAC based on the MAC result data DA_MAC. The sign converter 721 may convert a sign of a value set by the MAC result data DA_MAC and may output the sign conversion data NDA_MAC having a converted sign. For example, when a value set by the MAC result data DA_MAC is 'X', the sign converter 721 may generate the sign conversion data NDA_MAC having a value of '−X'.

The synthesis selection signal generation circuit 723 may generate a synthesis selection signal SSEL based on the first zero-point selection signal ZP_SEL1 and the second zero-point selection signal ZP_SEL2. The synthesis selection signal generation circuit 723 may generate the synthesis selection signal SSEL which is activated to have a logic "high" level when one of the first zero-point selection signal ZP_SEL1 and the second zero-point selection signal ZP_SEL2 is activated to have a logic "high" level. The synthesis selection signal generation circuit 723 may generate the synthesis selection signal SSEL which is inactivated to have a logic "low" level when both of the first zero-point selection signal ZP_SEL1 and the second zero-point selection signal ZP_SEL2 are inactivated to have a logic "low" level. The synthesis selection signal generation circuit 723 may generate the synthesis selection signal SSEL which is inactivated to have a logic "low" level when both of the first zero-point selection signal ZP_SEL1 and the second zero-point selection signal ZP_SEL2 are activated to have a logic "high" level.

The sign data selector 725 may receive the sign conversion data NDA_MAC from the sign converter 721. The sign data selector 725 may generate the MAC sign data SD_MAC from the MAC result data DA_MAC and the sign conversion data NDA_MAC based on the synthesis selection signal SSEL. The sign data selector 725 may output the sign conversion data NDA_MAC input to an input terminal '1' as the MAC sign data SD_MAC when the synthesis selection signal SSEL is activated to have a logic "high" level. The sign data selector 725 may output the MAC result data DA_MAC input to an input terminal '0' as the MAC sign data SD_MAC when the synthesis selection signal SSEL is inactivated to have a logic "low" level.

Figure 34:
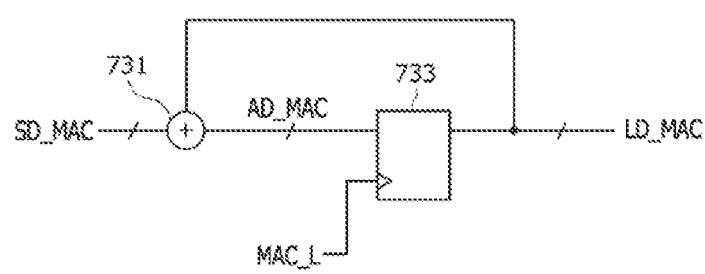
FIG. 34 illustrates a configuration of an accumulative adding circuit included in the PIM device illustrated in FIG. 31.

As illustrated in FIG. 34, the accumulative adding circuit 707 may include an adder 731 and a data latch 733. The adder 731 may add the MAC sign data SD_MAC to the MAC latch data LD_MAC to generate the MAC addition data AD_MAC. The data latch 733 may receive the MAC addition data AD_MAC from the adder 731. The data latch 733 may latch the MAC addition data AD_MAC to output the latched data of the MAC addition data AD_MAC as the MAC latch data LD_MAC when the MAC output latch signal MAC_L is activated.

The quantization scheme applied to the PIM device 700 will be described hereinafter with reference to FIGS. 35 and 36.

Figure 35:
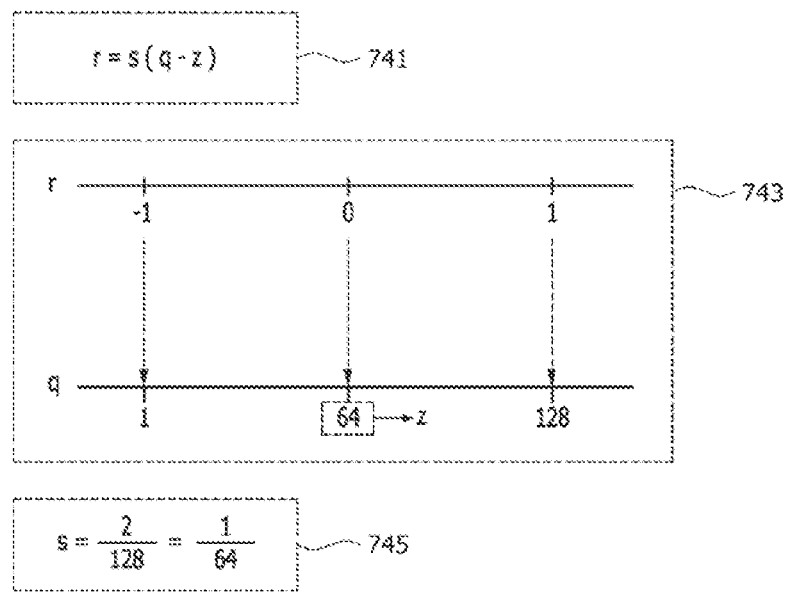

As illustrated by a reference numeral 741 in FIG. 35, a relationship between a quantized integer 'q' and a real number 'r' may be defined as an equation of "$r=s(q-z)$". That is, the real number 'r' may be calculated by subtracting a zero-point value 'z' from the quantized integer 'q' to generate a subtracted value of 'q−z' and by multiplying the subtracted value 'q-z' by a scale value 's'. In addition, as illustrated by a reference numeral 743 in FIG. 35, because the quantized integer 'q' corresponding to the real number 'r' of '0' is '64' in the quantization scheme converting the quantized integers 'q' having a range of 1 to 128 into the real numbers 'r' having a range of −1 to +1, the zero-point value 'z' may be set as '64'. In addition, as illustrated by a reference numeral 745 in FIG. 35, because the range of the quantized integers 'q' is 128 and the range of the real numbers 'r' is 2, the scale value 's' may be set as "(2/128)= (1/64)".

As illustrated in FIG. 36, the MAC real data RD_MAC generated by the PIM device 700 may correspond to a result value 'WD⊗VD' of the MAC arithmetic operation for weight data WD and vector data VD corresponding to real numbers. In the quantization scheme, the weight data WD may be converted into a formula 'S1(DA1−ZPD1)' based on the equation "$r=s(q-z)$" illustrated by the reference numeral 741 in FIG. 35. In the formula 'S(DA1−ZPD1)', "S1" is a scale value of the weight data WD, "DA1" is a quantized integer of the weight data WD, and "ZPD1" is a zero-point value of the weight data WD. In the quantization scheme, the vector data VD may be converted into a formula 'S2(DA2−ZPD2)' based on the equation "$r=s(q-z)$" illustrated by the reference numeral 741 in FIG. 35. In the formula 'S2(DA2−ZPD2)', "S2" is a scale value of the vector data VD, "DA2" is a quantized integer of the vector data VD, and "ZPD2" is a zero-point value of the vector data VD. In the quantization scheme, the MAC real data RD_MAC generated by the PIM device 700 may correspond to a result value of the MAC arithmetic operation for the formula 'S1(DA1−ZPD1)' and the formula 'S2(DA2−ZPD2)'. More specifically, the MAC read data RD_MAC may be obtained by performing a first MAC arithmetic operation to generate a first MAC result value of 'DA1⊗DA2', by performing a second MAC arithmetic operation to generate a second MAC result value of 'ZPD1⊗DA2', by converting a sign of the second MAC result value of 'ZPD1⊗DA2' to generate a converted second MAC result value of '−ZPD1⊗DA2', by adding the converted second MAC result value to the first MAC result value to generate a first accumulative added value of 'DA1⊗DA2−ZPD1⊗DA2', by performing a third MAC arithmetic operation to generate a third MAC result value of 'ZPD2⊗DA1', by converting a sign of the third MAC result value of 'ZPD2⊗DA1' to generate a converted third MAC result value of '−ZPD2⊗DA1', by adding the converted third MAC result value of '−ZPD2⊗DA1' to the first accumulative added value of 'DA1⊗DA2−ZPD1⊗DA2' to generate a second accumulative added value of 'DA1⊗DA2−ZPD1⊗DA2−ZPD2⊗DA1', by performing a fourth MAC arithmetic operation to generate a fourth MAC result value of 'ZPD1⊗ZPD2', by adding the fourth MAC result value of 'ZPD1⊗ZPD2' to the second accumulative added value of 'DA1⊗DA2−ZPD1⊗DA2−ZPD2⊗DA1' to generate a third accumulative added value of 'DA1⊗DA2−ZPD1⊗DA2−ZPD2⊗DA1+ZPD1⊗ZPD2', and by multiplying the third accumulative added value of 'DA1⊗DA2−ZPD1⊗DA2−ZPD2⊗DA1+ZPD1⊗ZPD2' by the first and second scale values 'S1' and 'S2' to generate a final result value of 'S1×S2×(DA1⊗DA2−ZPD1⊗DA2−ZPD2⊗DA1+ZPD1⊗ZPD2)'. The MAC circuit 703 illustrated in FIG. 31 may receive the first data DA1 and the second data DA2 and may perform the first MAC arithmetic operation for the first data DA1 and the second data DA2 to generate the MAC result data DA_MAC set as the result value of 'DA1⊗DA2'. In addition, the MAC circuit 703 illustrated in FIG. 31 may receive the first zero-point data ZPD1 and the second data DA2 and may perform the second MAC arithmetic operation for the first zero-point data ZPD1 and the second data DA2 to generate the MAC result data DA_MAC set as the result value of 'ZPD1⊗DA2'. Moreover, the MAC circuit 703 illustrated in FIG. 31 may receive the first data DA1 and the second zero-point data ZPD2 and may perform the third MAC arithmetic operation for the first data DA1 and the second zero-point data ZPD2 to generate the MAC result data DA_MAC set as the result value of 'ZPD2⊗DA1'. Furthermore, the MAC circuit 703 illustrated in FIG. 31 may receive the first zero-point data ZPD1 and the second zero-point data ZPD2 and may perform the fourth MAC arithmetic operation for the first zero-point data ZPD1 and the second zero-point data ZPD2 to generate the MAC result data DA_MAC set as the result value of 'ZPD1⊗ZPD2'. The sign selection circuit 705 illustrated in FIG. 31 may convert a sign of the result value 'ZPD1⊗DA2' of the second MAC arithmetic operation to generate the MAC sign data SD_MAC having a converted value '−ZPD1⊗DA2' when the second MAC arithmetic operation is performed and may convert a sign of the result value 'ZPD2⊗DA1' of the third MAC arithmetic operation to generate the MAC sign data SD_MAC having a converted value '−ZPD2⊗DA1' when the third MAC arithmetic operation is performed. The accumulative adding circuit 707 illustrated in FIG. 31 may accumulatively add the result value of the first MAC arithmetic operation, the converted result value of the second MAC arithmetic operation, the converted result value of the third MAC arithmetic operation, and the result value of the fourth MAC arithmetic operation to generate the MAC latch data LD_MAC having the accumulative added value 'DA1⊗DA2−ZPD1⊗DA2−ZPD2⊗DA1+ZPD1⊗ZPD2'. The multiplication circuit 709 illustrated in FIG. 31 may multiply the accumulative added value output from the accumulative adding circuit 707 by the scale value 'S' of the weigh data WD and the scale value 'S2' of the vector data VD, thereby generating the MAC real data RD_MAC having the final result value 'S1×S2×(DA1⊗DA2−ZPD1⊗DA2−ZPD2⊗DA1+ZPD1⊗ZPD2)'.

Operations for generating the MAC real data RD_MAC in the PIM device 700 will be described hereinafter with reference to FIGS. 37 to 48.

Figure 37:
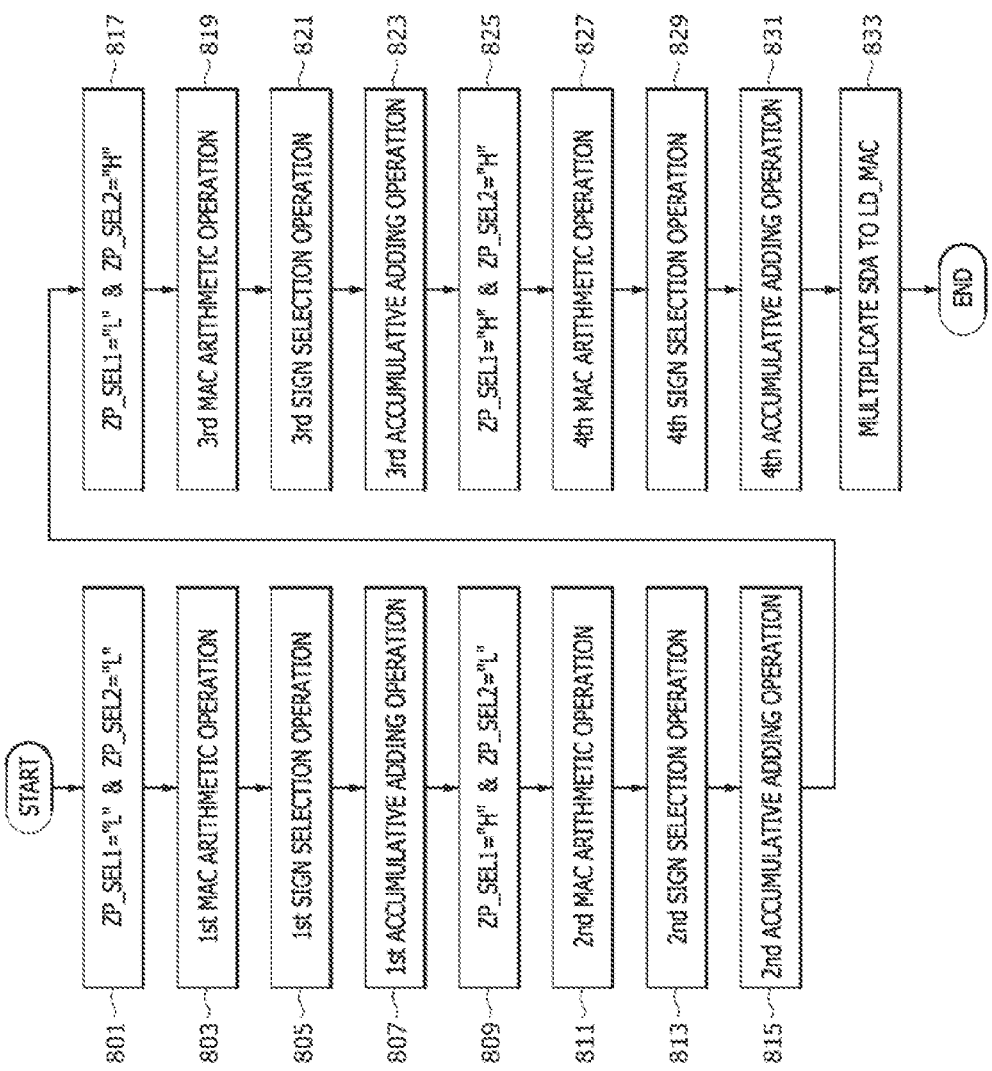
FIGS. 37 to 49 illustrate an operation of a PIM device according to an embodiment of the present disclosure.
Figure 38:
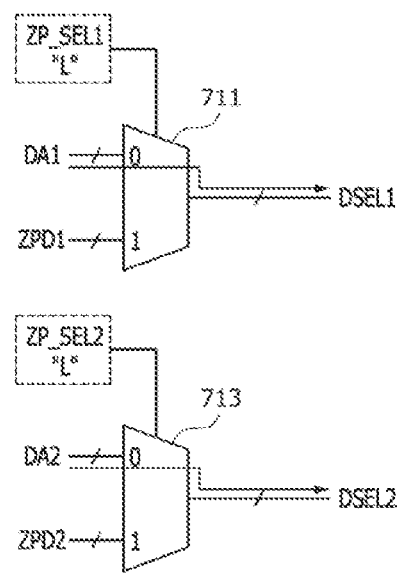

First, as illustrated in FIGS. 37 and 38, when both of the first zero-point selection signal ZP_SEL1 and the second zero-point selection signal ZP_SEL2 are inactivated to have a logic "low(L)" level (see a step 801), the first selector 711 may selectively output the first data DA1 as the first selection data DSEL1 and the second selector 713 may selectively output the second data DA2 as the second selection data DSEL2. In such a case, the first MAC arithmetic operation for the first data DA1 selected as the first selection data DSEL1 and the second data DA2 selected as the second selection data DSEL2 may be performed to generate the MAC result data DA_MAC having a first MAC result value of 'DA1⊗DA2' (see a step 803).

Figure 39:
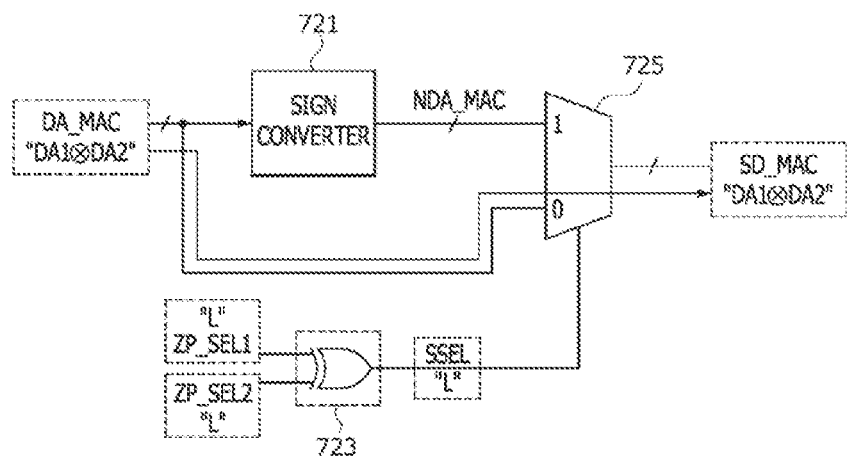

Next, as illustrated in FIGS. 37 and 39, because the synthesis selection signal SSEL is inactivated to have a logic "low(L)" level while both of the first zero-point selection signal ZP_SEL1 and the second zero-point selection signal ZP_SEL2 are inactivated to have a logic "low(L)" level, a first sign selection operation (also, referred to as a 'first sign conversion operation') may be performed such that the sign selection circuit 705 outputs the MAC result data DA_MAC as the MAC sign data SD_MAC (see a step 805). As a result of the first sign conversion operation, the first MAC result value of 'DA1⊗DA2' may be generated as the MAC sign data SD_MAC.

Figure 40:
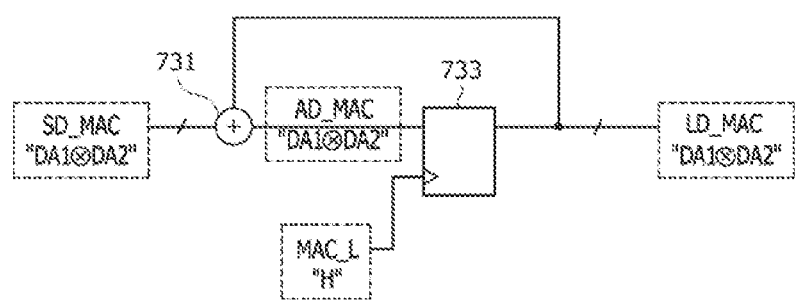

Next, as illustrated in FIGS. 37 and 40, when the MAC output latch signal MAC_L is activated to have a logic "high(H)" level, a first accumulative adding operation may be performed (see a step 807). The MAC sign data SD_MAC generated by the first sign conversion operation may be added to the MAC latch data LD_MAC by the first accumulative adding operation to generate the MAC latch data LD_MAC having an accumulative added value of 'DA1⊗DA2'.

Figure 41:
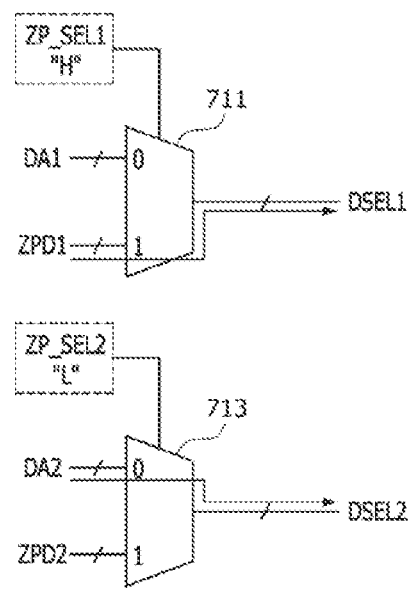

Next, as illustrated in FIGS. 37 and 41, when the first zero-point selection signal ZP_SEL1 is activated to have a logic "high(H)" level and the second zero-point selection signal ZP_SEL2 is inactivated to have a logic "low(L)" level (see a step 809), the first selector 711 may selectively output the first zero-point data ZPD1 as the first selection data DSEL1 and the second selector 713 may selectively output the second data DA2 as the second selection data DSEL2. In such a case, the second MAC arithmetic operation for the first zero-point data ZPD1 selected as the first selection data DSEL1 and the second data DA2 selected as the second selection data DSEL2 may be performed to generate the MAC result data DA_MAC having a second MAC result value of 'ZDP1⊗DA2' (see a step 811).

Figure 42:
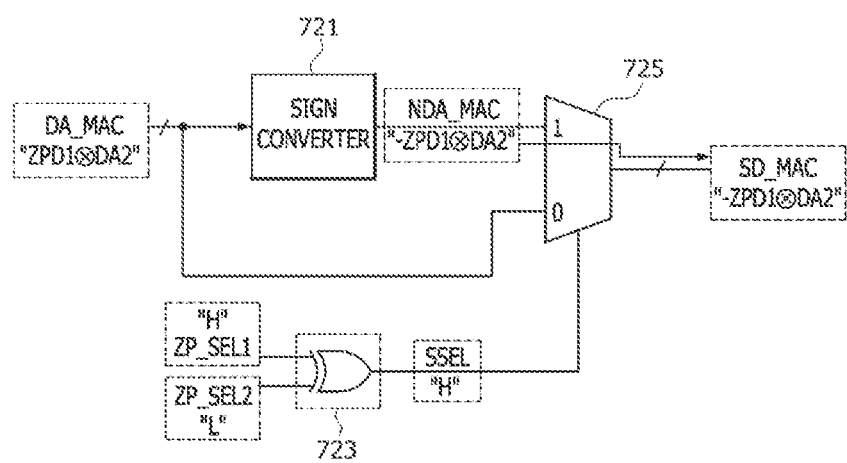

Next, as illustrated in FIGS. 37 and 42, because the synthesis selection signal SSEL is activated to have a logic "high(H)" level while the first zero-point selection signal ZP_SEL1 is activated to have a logic "high(H)" level and the second zero-point selection signal ZP_SEL2 is inactivated to have a logic "low(L)" level, a second sign selection operation (also, referred to as a 'second sign conversion operation') may be performed such that the sign selection circuit 705 converts a sign of the MAC result data DA_MAC to output the MAC result data DA_MAC having the converted sign as the MAC sign data SD_MAC (see a step 813). As a result of the second sign conversion operation, a value of '−ZDP1⊗DA2' may be generated as the MAC sign data SD_MAC.

Figure 43:
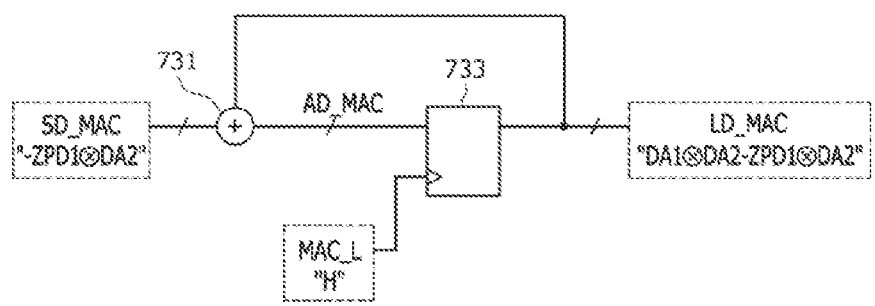

Next, as illustrated in FIGS. 37 and 43, when the MAC output latch signal MAC_L is activated to have a logic "high(H)" level, a second accumulative adding operation may be performed (see a step 815). The MAC sign data SD_MAC may be added to the MAC latch data LD_MAC by the second accumulative adding operation to generate the MAC latch data LD_MAC having an accumulative added value of 'DA1⊗DA2−ZDP1⊗DA2'.

Figure 44:
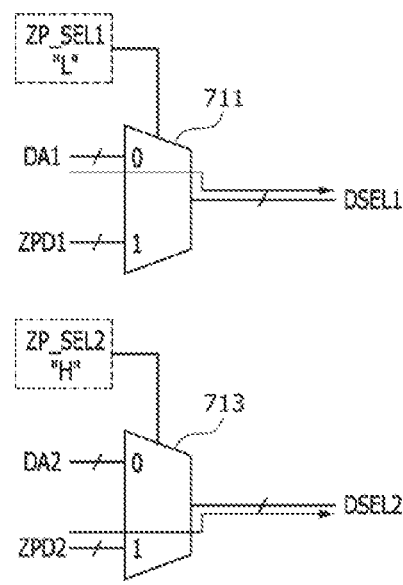

Next, as illustrated in FIGS. 37 and 44, when the first zero-point selection signal ZP_SEL1 is inactivated to have a logic "low(L)" level and the second zero-point selection signal ZP_SEL2 is activated to have a logic "high(H)" level (see a step 817), the first selector 711 may selectively output the first data DA1 as the first selection data DSEL1 and the second selector 713 may selectively output the second zero-point data ZPD2 as the second selection data DSEL2. In such a case, the third MAC arithmetic operation for the first data DA1 selected as the first selection data DSEL1 and the second zero-point data ZPD2 selected as the second selection data DSEL2 may be performed to generate the MAC result data DA_MAC having a third MAC result value of 'ZDP2⊗DA1' (see a step 819).

Figure 45:
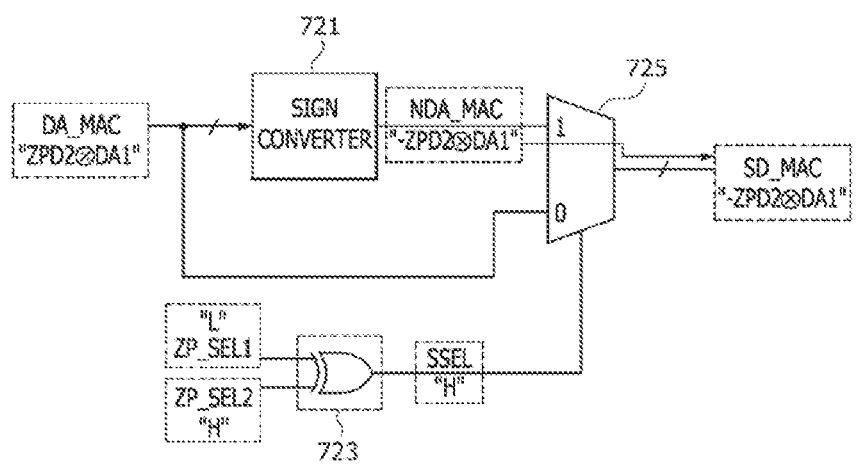

Next, as illustrated in FIGS. 37 and 45, because the synthesis selection signal SSEL is activated to have a logic "high(H)" level while the first zero-point selection signal ZP_SEL1 is inactivated to have a logic "low(L)" level and the second zero-point selection signal ZP_SEL2 is activated to have a logic "high(H)" level, a third sign selection operation (also, referred to as a 'third sign conversion operation') may be performed such that the sign selection circuit 705 converts a sign of the MAC result data DA_MAC to output the MAC result data DA_MAC having the converted sign as the MAC sign data SD_MAC (see a step 821). As a result of the third sign conversion operation, a value of '−ZDP2⊗DA1' may be generated as the MAC sign data SD_MAC.

Figure 46:
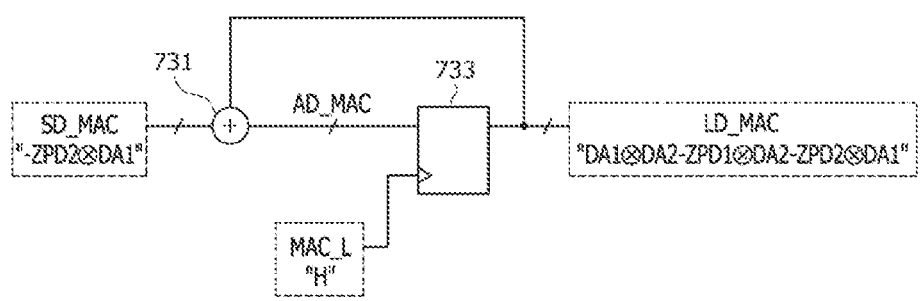

Next, as illustrated in FIGS. 37 and 46, when the MAC output latch signal MAC_L is activated to have a logic "high(H)" level, a third accumulative adding operation may be performed (see a step 823). The MAC sign data SD_MAC may be added to the MAC latch data LD_MAC by the third accumulative adding operation to generate the MAC latch data LD_MAC having an accumulative added value of 'DA1⊗DA2−ZDP1⊗DA2−ZDP2⊗DA1'.

Figure 47:
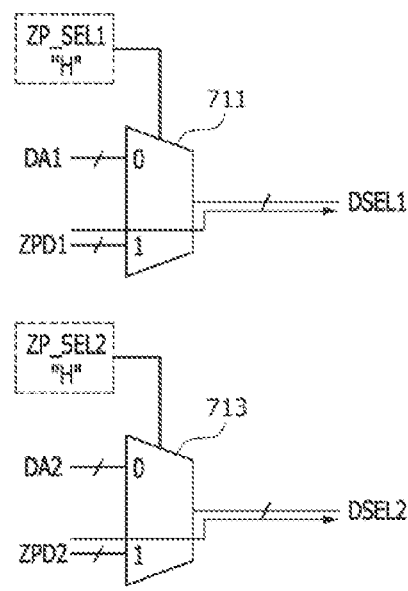

Next, as illustrated in FIGS. 37 and 47, when both of the first zero-point selection signal ZP_SEL1 and the second zero-point selection signal ZP_SEL2 are activated to have a logic "high(H)" level (see a step 825), the first selector 711 may selectively output the first zero-point data ZPD1 as the first selection data DSEL1 and the second selector 713 may selectively output the second zero-point data ZPD2 as the second selection data DSEL2. In such a case, the fourth MAC arithmetic operation for the first zero-point data ZPD1 selected as the first selection data DSEL1 and the second zero-point data ZPD2 selected as the second selection data DSEL2 may be performed to generate the MAC result data DA_MAC having a fourth MAC result value of 'ZDP1⊗ZDP2' (see a step 827).

Figure 48:
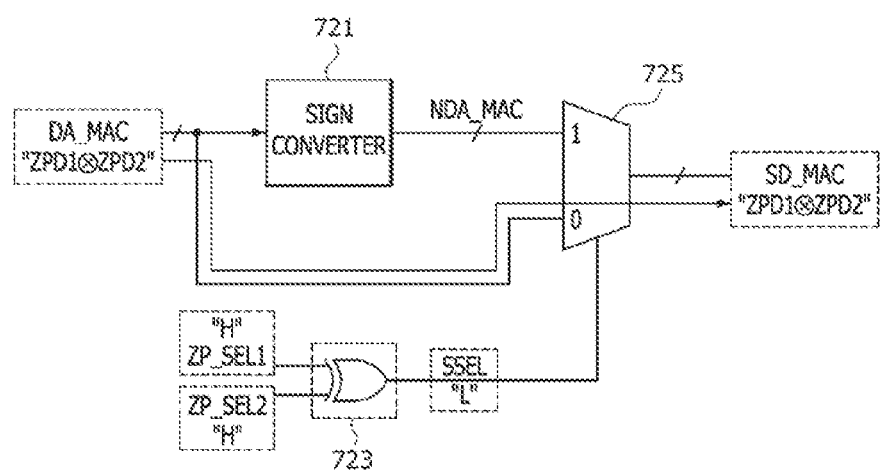

Next, as illustrated in FIGS. 37 and 48, because the synthesis selection signal SSEL is inactivated to have a logic "low(L)" level while both of the first zero-point selection signal ZP_SEL1 and the second zero-point selection signal ZP_SEL2 are activated to have a logic "high(H)" level, a fourth sign selection operation (also, referred to as a 'fourth sign conversion operation') may be performed such that the sign selection circuit 705 outputs the MAC result data DA_MAC as the MAC sign data SD_MAC (see a step 829). As a result of the fourth sign conversion operation, a value of 'ZDP1⊗ZDP2' may be generated as the MAC sign data SD_MAC.

Figure 49:
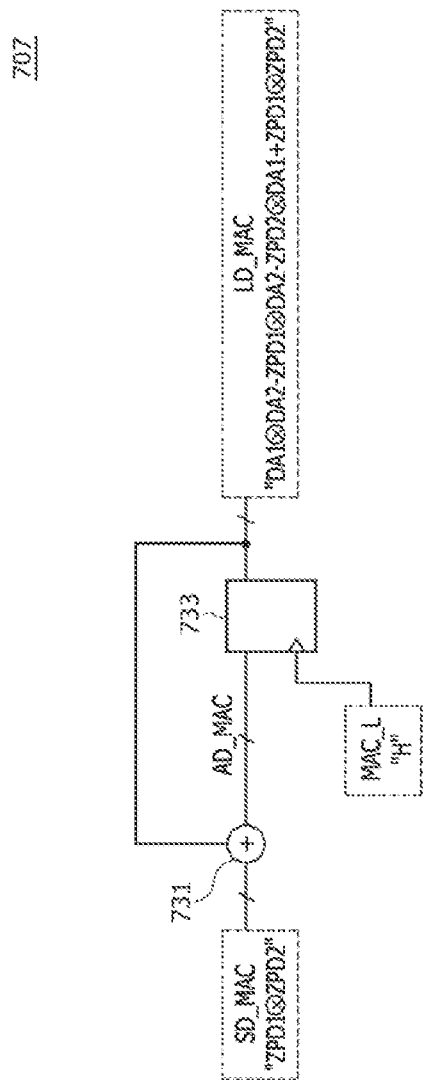

Next, as illustrated in FIGS. 37 and 49, when the MAC output latch signal MAC_L is activated to have a logic "high(H)" level, a fourth accumulative adding operation may be performed (see a step 831). The MAC sign data SD_MAC may be added to the MAC latch data LD_MAC by the fourth accumulative adding operation to generate the MAC latch data LD_MAC having an accumulative added value of 'DA1⊗DA2−ZDP1⊗DA2−ZDP2⊗DA1+ZDP1⊗ZDP2'.

Finally, as illustrated in FIG. 37, the MAC latch data LD_MAC having the accumulative added value of 'DA1⊗DA2−ZDP1⊗DA2−ZDP2⊗DA1+ZDP1⊗ZDP2' may be multiplied by the scale value 'S1' of the weight data WD and the scale value 'S2' of the vector data VD, thereby generating the MAC real data RD_MAC having the final result value 'S1×S2×(DA1⊗DA2−ZDP1⊗DA2−ZDP2⊗DA1+ZDP1⊗ZDP2)' (see a step 833).

As described above, the PIM device 700 may perform an arithmetic operation for a zero-point value using the MAC circuit 703 in the quantization scheme. Thus, it may be unnecessary to realize an extra circuit for performing the arithmetic operation for a zero-point value. As a result, it may be possible to reduce a layout area and power consumption of the PIM device 700.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
a data selection circuit configured to generate selection data from input data and zero-point data based on a zero-point selection signal;
a multiplying-and-accumulating (MAC) circuit configured to perform a MAC arithmetic operation for the selection data to generate MAC result data; and
an accumulative adding circuit configured to accumulatively add MAC sign data based on a MAC output latch signal to generate MAC latch data,
wherein a sign of the MAC sign data is determined by the zero-point selection signal.

2. The PIM device of claim 1, wherein the zero-point selection signal is activated to input the zero-point data, the zero-point data is subtracted from the input data, to the data selection circuit in a quantization scheme.

3. The PIM device of claim 1, wherein the zero-point data are set to have a zero-point value corresponding to a real number of '0' in a quantization scheme.

4. The PIM device of claim 1,
wherein the zero-point selection signal includes a first zero-point selection signal and a second zero-point selection signal;
wherein the input data includes first input data and second input data;
wherein selection data includes first selection data and second selection data; and
wherein the zero-point data includes first zero-point data and second zero-point data.

5. The PIM device of claim 4, wherein the first input data are set to have a first quantized integer corresponding to a quantized integer of weight data, and the second input data are set to have a second quantized integer corresponding to a quantized integer of vector data.

6. The PIM device of claim 4, wherein the data selection circuit outputs the first zero-point data as the first selection data when the first zero-point selection signal is activated and outputs the first input data as the first selection data when the first zero-point selection signal is inactivated.

7. The PIM device of claim 4, wherein the data selection circuit outputs the second zero-point data as the second selection data when the second zero-point selection signal is activated and outputs the second input data as the second selection data when the second zero-point selection signal is inactivated.

8. The PIM device of claim 4, wherein the MAC circuit is configured to perform the MAC arithmetic operation for the first selection data and the second selection data.

9. The PIM device of claim 4, further comprising a sign selection circuit configured to determine whether a sign of the MAC result data is converted based on the first zero-point selection signal and the second zero-point selection signal to generate the MAC sign data.

10. The PIM device of claim 9, wherein the sign selection circuit converts a sign of the MAC result data to output the MAC result data having the converted sign as the MAC sign data when one of the first zero-point selection signal and the second zero-point selection signal is activated.

11. The PIM device of claim 9, wherein the sign selection circuit outputs the MAC result data as the MAC sign data when both of the first zero-point selection signal and the second zero-point selection signal are activated or inactivated.

12. The PIM device of claim 1, wherein the accumulative adding circuit includes:
an adder configured to add the MAC sign data to the MAC latch data to generate MAC addition data; and
a data latch configured to latch the MAC addition data based on a MAC output latch signal to output the latched MAC addition data as the MAC latch data.

13. The PIM device of claim 1, further comprising a multiplication circuit configured to multiply the MAC latch data by a scale value, the scale value set by scale data, to generate MAC real data.

14. The PIM device of claim 13, wherein the scale value is set as a ratio of a range of real numbers to a range of quantized integers.

15. A method of implementing a quantization scheme, the method comprising:
receiving first input data and second input data as first selection data and second selection data based on a first zero-point selection signal and a second zero-point selection signal;
performing a first multiplying-and-accumulating (MAC) arithmetic operation for the first input data received as the first selection data and the second input data received as the second selection data to generate MAC result data;
performing a first sign selection operation for generating MAC sign data from the MAC result data based on the first zero-point selection signal and the second zero-point selection signal; and
performing a first accumulative adding operation for adding the MAC sign data to MAC latch data based on a MAC output latch signal.

16. The method of claim 15,
wherein the first input data are received as the first selection data when the first zero-point selection signal is inactivated; and
wherein the second input data are received as the second selection data when the second zero-point selection signal is inactivated.

17. The method of claim 15, wherein during the first sign selection operation, the MAC result data are output as the MAC sign data.

18. The method of claim 15, further comprising:
receiving first zero-point data and the second input data as the first selection data and the second selection data based on the first zero-point selection signal and the second zero-point selection signal;
performing a second MAC arithmetic operation for the first zero-point data received as the first selection data and the second input data received as the second selection data to generate the MAC result data;
performing a second sign selection operation for generating the MAC sign data from the MAC result data based on the first zero-point selection signal and the second zero-point selection signal; and
performing a second accumulative adding operation for adding the MAC sign data to the MAC latch data based on the MAC output latch signal.

19. The method of claim 18,
wherein the first zero-point data are received as the first selection data when the first zero-point selection signal is activated; and
wherein the second input data are received as the second selection data when the second zero-point selection signal is inactivated.

20. The method of claim 18, wherein during the second sign selection operation, a sign of the MAC result data is converted and the MAC result data having the converted sign are output as the MAC sign data.

21. The method of claim 18, further comprising:
receiving the first input data and second zero-point data as the first selection data and the second selection data based on the first zero-point selection signal and the second zero-point selection signal;
performing a third MAC arithmetic operation for the first input data received as the first selection data and the second zero-point data received as the second selection data to generate the MAC result data;
performing a third sign selection operation for generating the MAC sign data from the MAC result data based on the first zero-point selection signal and the second zero-point selection signal; and
performing a third accumulative adding operation for adding the MAC sign data to the MAC latch data based on the MAC output latch signal.

22. The method of claim 21,
wherein the first input data are received as the first selection data when the first zero-point selection signal is inactivated; and
wherein the second zero-point data are received as the second selection data when the second zero-point selection signal is activated.

23. The method of claim 21, wherein during the third sign selection operation, a sign of the MAC result data is converted and the MAC result data having the converted sign are output as the MAC sign data.

24. The method of claim 21, further comprising:
receiving the first zero-point data and the second zero-point data as the first selection data and the second selection data based on the first zero-point selection signal and the second zero-point selection signal;

performing a fourth MAC arithmetic operation for the first zero-point data received as the first selection data and the second zero-point data received as the second selection data to generate the MAC result data;

performing a fourth sign selection operation for generating the MAC sign data from the MAC result data based on the first zero-point selection signal and the second zero-point selection signal; and performing a fourth accumulative adding operation for adding the MAC sign data to the MAC latch data based on the MAC output latch signal.

25. The method of claim 24, wherein the first zero-point data are received as the first selection data when the first zero-point selection signal is activated; and wherein the second zero-point data are received as the second selection data when the second zero-point selection signal is activated.

26. The method of claim 24, wherein during the fourth sign selection operation, the MAC result data are output as the MAC sign data.

27. The method of claim 24, further comprising multiplying the MAC latch data by a scale value, the scale value set by scale data, to generate MAC real data.

28. The method of claim 27, wherein the scale value is set as a ratio of a range of real numbers to a range of quantized integers.

* * * * *